United States Patent
Ahn et al.

(10) Patent No.: US 12,300,710 B2
(45) Date of Patent: May 13, 2025

(54) IMAGE SENSOR INCLUDING COLOR SEPARATING LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Sungmo Ahn, Yongin-si (KR); Sookyoung Roh, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 675 days.

(21) Appl. No.: 17/565,903

(22) Filed: Dec. 30, 2021

(65) Prior Publication Data
US 2022/0344399 A1    Oct. 27, 2022

(30) Foreign Application Priority Data
Apr. 27, 2021    (KR) .................. 10-2021-0054630

(51) Int. Cl.
*H04N 25/704*    (2023.01)
*G02B 3/00*    (2006.01)
(Continued)

(52) U.S. Cl.
CPC ........ *H01L 27/14627* (2013.01); *G02B 5/201* (2013.01); *H01L 27/14645* (2013.01);
(Continued)

(58) Field of Classification Search
CPC ........ H04N 23/54; H04N 23/55; H04N 23/84; H04N 25/00; H04N 25/704;
(Continued)

(56) References Cited

U.S. PATENT DOCUMENTS

2015/0319420 A1    11/2015    Fettig et al.
2016/0286108 A1    9/2016    Fettig et al.
(Continued)

FOREIGN PATENT DOCUMENTS

CN    112701133 A    4/2021
EP    3993043 A1    5/2022
(Continued)

OTHER PUBLICATIONS

Communication issued Jul. 19, 2022 by the European Patent Office for European Patent Application No. 22151808.7.
(Continued)

*Primary Examiner* — Lin Ye
*Assistant Examiner* — Chriss S Yoder, III
(74) *Attorney, Agent, or Firm* — Sughrue Mion, PLLC

(57) ABSTRACT

Provided are an image sensor including a color separating lens array and an electronic apparatus. The image sensor includes: a sensor substrate including a plurality of first pixels and a plurality of second pixels, wherein each of the first pixels includes a plurality of photosensitive cells that are two-dimensionally arranged in a first direction and a second direction, and, a first pixel of a first group includes a first edge region and a second edge region that are arranged at opposite edges of the first pixel in the first direction and outputs first and second photosensitive signals with respect to the light incident on the first and second edge regions.

23 Claims, 51 Drawing Sheets

(51) Int. Cl.
  *G02B 5/20* (2006.01)
  *H01L 27/146* (2006.01)
  *H04N 25/00* (2023.01)

(52) U.S. Cl.
  CPC ........... *H04N 25/00* (2023.01); *H04N 25/704* (2023.01); *G02B 3/0006* (2013.01)

(58) Field of Classification Search
  CPC ......... H01L 27/14603; H01L 27/14605; H01L 27/1461; H01L 27/14621; H01L 27/14625; H01L 27/14627; H01L 27/14643; H01L 27/14645; G02B 3/0006; G02B 5/201
  See application file for complete search history.

(56) References Cited

U.S. PATENT DOCUMENTS

| | | | |
|---|---|---|---|
| 2020/0169704 A1 | 5/2020 | Fujii | |
| 2020/0358989 A1* | 11/2020 | Hoshino | H04N 25/58 |
| 2021/0126035 A1* | 4/2021 | Roh | G02B 5/1876 |
| 2022/0137268 A1* | 5/2022 | Yun | H01L 27/14625 |
| | | | 348/302 |
| 2023/0171513 A1 | 6/2023 | Hoshino | |
| 2023/0362501 A1 | 11/2023 | Hoshino | |

FOREIGN PATENT DOCUMENTS

| | | |
|---|---|---|
| KR | 10-2020-0037244 A | 4/2020 |
| KR | 10-2020-0090763 A | 7/2020 |
| WO | 2019/035374 A1 | 2/2019 |
| WO | 2019/102887 A1 | 5/2019 |

OTHER PUBLICATIONS

Office Action issued on Jul. 4, 2023 by the Japanese Patent Office in corresponding JP Patent Application No. 2022-063890.
Communication dated Feb. 25, 2024, issued by the Korean Intellectual Property Office in Korean Patent Application No. 10-2021-0054630.

* cited by examiner

FIG. 2B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

[Security]

IMAGE SENSOR INCLUDING COLOR SEPARATING LENS ARRAY AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2021-0054630, filed on Apr. 27, 2021, in the Korean Intellectual Property Office, the disclosure of which is incorporated by reference herein in its entirety.

BACKGROUND

1. Field

Provided are an image sensor including a color separating lens array capable of focusing incident light separately according to wavelengths of the incident light, and an electronic apparatus including the image sensor.

2. Description of the Related Art

Image sensors generally sense the color of incident light by using a color filter. However, a color filter may have low light utilization efficiency because the color filter absorbs light of colors other than the corresponding color of light. For example, when an RGB color filter is used, only ⅓ of the incident light is transmitted and the other, that is, ⅔ of the incident light, is absorbed. Thus, the light utilization efficiency is only about 33%. Thus, in a color display apparatus or a color image sensor, most light loss occurs in the color filter.

SUMMARY

Provided are an image sensor having improved light utilization efficiency by using a color separating lens array capable of focusing incident light separately according to wavelengths of the incident light, and an electronic apparatus including the image sensor.

Also, provided are an image sensor capable of improving an auto-focusing performance while including a color separating lens array, and an electronic apparatus including the image sensor.

Additional aspects will be set forth in part in the description which follows and, in part, will be apparent from the description, or may be learned by practice of the presented embodiments of the disclosure.

According to an aspect of the disclosure, there is provided an image sensor including: a sensor substrate including a plurality of first pixels configured to sense light of a first wavelength and a plurality of second pixels configured to sense light of a second wavelength that is different from the first wavelength; and a color separating lens array configured to condense the light of the first wavelength onto the plurality of first pixels and condense the light of the second wavelength onto the plurality of second pixels, wherein each of the first pixels includes a plurality of photosensitive cells that are two-dimensionally arranged in a first direction and a second direction perpendicular to the first direction, the plurality of photosensitive cells being configured to independently sense incident light, and from among the plurality of first pixels, a first pixel of a first group includes a first edge region and a second edge region that are arranged at opposite edges of the first pixel in the first direction, the first pixel of the first group being configured to output a first photosensitive signal and a second photosensitive signal with respect to the incident light on the first edge region and the second edge region.

A distance between the first edge region and the second edge region in the first direction may be equal to or greater than a width of the first edge region in the first direction.

The first pixel of the first group may be further configured to output a third photosensitive signal with respect to light incident on a region between the first edge region and the second edge region.

The first pixel of the first group may be further configured to not output a photosensitive signal with respect to light incident on a region between the first edge region and the second edge region.

The plurality of photosensitive cells in the first pixel of the first group may include a first photosensitive cell and a second photosensitive cell that are arranged in the first direction.

Each of the first photosensitive cell and the second photosensitive cell may include a first photodiode and a second photodiode that are arranged in the first direction, the first photodiode of the first photosensitive cell may be arranged in the first edge region and the second photodiode of the second photosensitive cell is arranged in the second edge region, and the first pixel of the first group may be configured to output the first photosensitive signal from the first photodiode of the first photosensitive cell and the second photosensitive signal from the second photodiode of the second photosensitive cell.

Each of the first photosensitive cell and the second photosensitive cell may include one photodiode, and the first pixel of the first group may include a mask pattern configured to block a first remaining region in the photodiode of the first photosensitive cell, the first remaining region being different from the first edge region in a light-receiving surface of the photodiode of the first photosensitive cell, and configured to block a second remaining region in the photodiode of the second photosensitive cell, the second remaining region being different from the second edge region in a light-receiving surface of the photodiode of the second photosensitive cell.

The plurality of photosensitive cells in the first pixel of the first group may include a first photosensitive cell, a second photosensitive cell, and a third photosensitive cell that are sequentially arranged in the first direction.

Each of the first photosensitive cell, the second photosensitive cell and the third photosensitive cell may include one photodiode, the first photosensitive cell may be arranged in the first edge region and the third photosensitive cell is arranged in the second edge region, and the first pixel of the first group may be configured to output the first photosensitive signal from the first photosensitive cell and the second photosensitive signal from the third photosensitive cell.

Each of the first photosensitive cell and third photosensitive cell may include a first photodiode and a second photodiode that are arranged in the first direction, the first photodiode of the first photosensitive cell may be arranged in the first edge region and the second photodiode of the third photosensitive cell is arranged in the second edge region, and the first pixel of the first group may be configured to output the first photosensitive signal from the first photodiode of the first photosensitive cell and the second photosensitive signal from the second photodiode of the third photosensitive cell.

The plurality of photosensitive cells in the first pixel of the first group may include a first photosensitive cell, a second photosensitive cell, a third photosensitive cell, and a fourth photosensitive cell that are sequentially arranged in the first direction.

Each of the first photosensitive cell, the second photosensitive cell, the third photosensitive cell and fourth photosensitive cell may include one photodiode, the first photosensitive cell may be arranged in the first edge region and the fourth photosensitive cell is arranged in the second edge region, and the first pixel of the first group may be configured to output the first photosensitive signal from the first photosensitive cell and the second photosensitive signal from the fourth photosensitive cell.

Each of the first photosensitive cell, the second photosensitive cell, the third photosensitive cell and fourth photosensitive cell may include a first photodiode and a second photodiode that are arranged in the first direction, the first photodiode of the first photosensitive cell may be arranged in the first edge region and the second photodiode of the fourth photosensitive cell is arranged in the second edge region, and the first pixel of the first group may be configured to output the first photosensitive signal from the first photodiode of the first photosensitive cell and the second photosensitive signal from the second photodiode of the fourth photosensitive cell.

From among the plurality of first pixels, a first pixel of a second group may include a third edge region and a fourth edge region that are arranged at opposite edges of the first pixel of the second group in the second direction and is configured to output a third photosensitive signal with respect to light incident on the third edge region and a fourth photosensitive signal with respect to light incident on the fourth edge region.

The plurality of photosensitive cells in the first pixel of the second group may include a first photosensitive cell, a second photosensitive cell, and a third photosensitive cell that are sequentially arranged in the second direction, each of the first photosensitive cell, the second photosensitive cell and the third photosensitive cell may include one photodiode, the first photosensitive cell is arranged in the third edge region and the third photosensitive cell may be arranged in the fourth edge region, and the first pixel of the second group may be configured to output the third photosensitive signal from the first photosensitive cell and the fourth photosensitive signal from the third photosensitive cell.

From among the plurality of first pixels, a first pixel of a third group may include a first apex region and a second apex region at opposite sides in a diagonal direction, the first pixel of the third group may be configured to output a fifth photosensitive signal with respect to light incident on the first apex region and sixth photosensitive signal with respect to light incident on the second apex region.

The plurality of photosensitive cells in the first pixel of the third group may include a first photosensitive cell at a first apex of the first pixel, a second photosensitive cell adjacent to the first photosensitive cell in the first direction, a third photosensitive cell adjacent to the first photosensitive cell in the second direction, a fourth photosensitive cell arranged at a second apex of the first pixel, a fifth photosensitive cell adjacent to the fourth photosensitive cell in the first direction, and a sixth photosensitive cell adjacent to the fourth photosensitive cell in the second direction, each of the first photosensitive cell, the second photosensitive cell, the third, photosensitive cell, the fourth photosensitive cell, the fifth photosensitive cell and the sixth photosensitive cell include one photodiode, the first photosensitive cell, the second photosensitive cell, and the third photosensitive cell are arranged in the first apex region and the fourth photosensitive cell, the fifth photosensitive cell, and the sixth photosensitive cell are arranged in the second apex region, and the first pixel of the third group is configured to output the fifth photosensitive signal from the first photosensitive cell, the second photosensitive cell, the third, photosensitive cell and the sixth photosensitive signal from the fourth photosensitive cell, the fifth photosensitive cell, and the sixth photosensitive cell.

In an entire area of the image sensor, the first pixel of the first group may be arranged in a first region in the first direction, the first pixel of the second group is arranged in a second region in the second direction, and the first pixel of the third group is arranged in a third region in the diagonal direction.

A distance between the sensor substrate and the color separating lens array may be about 30% to about 70% of a focal distance of the color separating lens array with respect to the light of the first wavelength.

The image sensor may further include a spacer layer arranged between the sensor substrate and the color separating lens array to form a distance between the sensor substrate and the color separating lens array.

The color separating lens array may include a first wavelength light condensing region configured to condense the light of the first wavelength onto the first pixels and a second wavelength light condensing region configured to condense the light of the second wavelength onto the second pixels, and an area of the first wavelength light condensing region is greater than an area of the first pixel among the plurality of first pixels and an area of the second wavelength light condensing region is greater than an area of a second pixel among the plurality of second pixels, and the first wavelength light condensing region partially overlaps the second wavelength light condensing region.

The color separating lens array may include: a first pixel region arranged at a position corresponding to each of the first pixels; and a second pixel region arranged at a position corresponding to each of the second pixels, wherein a difference between phases of the light of the first wavelength that has passed through a center of the first pixel region and the light of the first wavelength that has passed through the second pixel region is about $0.9\pi$ to about $1.1\pi$.

According to another aspect of the disclosure, there is provided an electronic apparatus including: an image sensor configured to convert an optical image into an electrical signal; a processor configured to control operations of the image sensor and to store and output a signal generated by the image sensor; and a lens assembly for providing light from an object to the image sensor, wherein the image sensor includes: a sensor substrate including a plurality of first pixels configured to sense light of a first wavelength and a plurality of second pixels configured to sense light of a second wavelength that is different from the first wavelength; and a color separating lens array configured to condense the light of the first wavelength onto the plurality of first pixels and condense the light of the second wavelength onto the plurality of second pixels, wherein each of the first pixels includes a plurality of photosensitive cells that are two-dimensionally arranged in a first direction and a second direction perpendicular to the first direction, the plurality of photosensitive cells being configured to independently sense incident light, and from among the plurality of first pixels, a first pixel of a first group includes a first edge region and a second edge region that are arranged at opposite edges of the first pixel in the first direction, the first pixel of the first group being configured to output a first photosensitive signal and a second photosensitive signal with respect to the incident light on the first edge region and the second edge region, and the processor is further configured to generate an auto-focusing signal based on a difference between the first and second photosensitive signals.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A to 2C are diagrams showing examples of various pixel arrangements in a pixel array of an image sensor;

DETAILED DESCRIPTION

Figure 1:
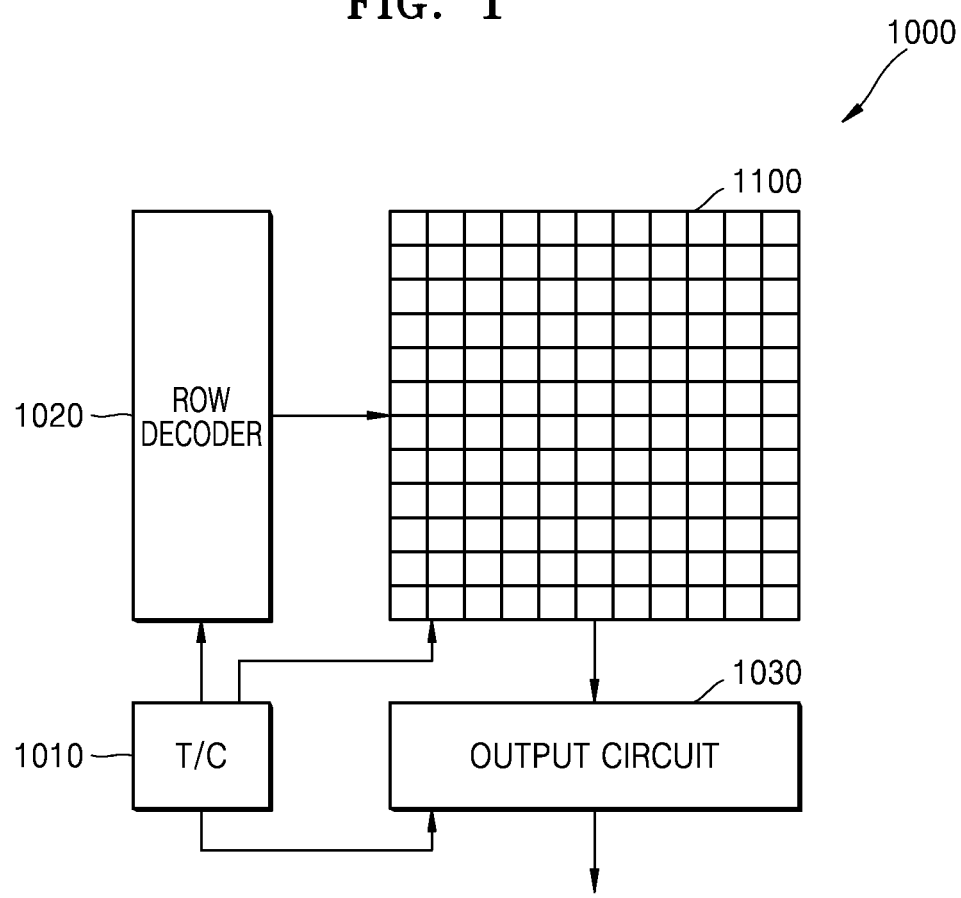
FIG. 1 is a block diagram of an image sensor according to an embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array and an electronic apparatus including the image sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing at least one function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a block diagram of an image sensor 1000 according to an example embodiment. Referring to FIG. 1, the image sensor 1000 may include a pixel array 1100, a timing controller (T/C) 1010, a row decoder 1020, and an output circuit 1030. An image sensor 1000 may include a charge coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs arranged respectively for the columns in the pixel array 1100 or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixel arrangement may be implemented in various ways. For example, FIGS. 2A to 2C show various pixel arrangements in the pixel array 1100 of the image sensor 1000.

Figure 2A:
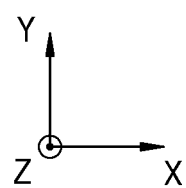

FIG. 2A shows a Bayer pattern that is generally adopted in the image sensor 1000. Referring to FIG. 2A, one unit pattern includes four quadrant regions, and first through fourth quadrants may be the blue pixel B, the green pixel G, the red pixel R, and the green pixel G, respectively. The unit patterns may be repeatedly and two-dimensionally arranged in a first direction (X direction) and a second direction (Y direction). In other words, two green pixels G are arranged in one diagonal direction and one blue pixel B and one red pixel R are arranged in another diagonal direction in a unit pattern of a 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction.

The pixel array 1100 may be arranged in various arrangement patterns, rather than the Bayer pattern. For example, referring to FIG. 2B, a CYGM arrangement, in which a magenta pixel M, a cyan pixel C, a yellow pixel Y, and a green pixel G configure one unit pattern, may be used. Also, referring to FIG. 2C, an RGBW arrangement, in which a green pixel G, a red pixel R, a blue pixel, and a white pixel W configure one unit pattern, may be used. According to another example embodiment, the unit pattern may have a 3×2 array form. In addition to the above examples, the pixels in the pixel array 1100 may be arranged in various ways according to color characteristics of the image sensor 1000. Hereinafter, it will be described that the pixel array 1100 of the image sensor 1000 has a Bayer pattern, but the operating principles may be applied to other patterns of pixel arrangement than the Bayer pattern.

Figure 3A:
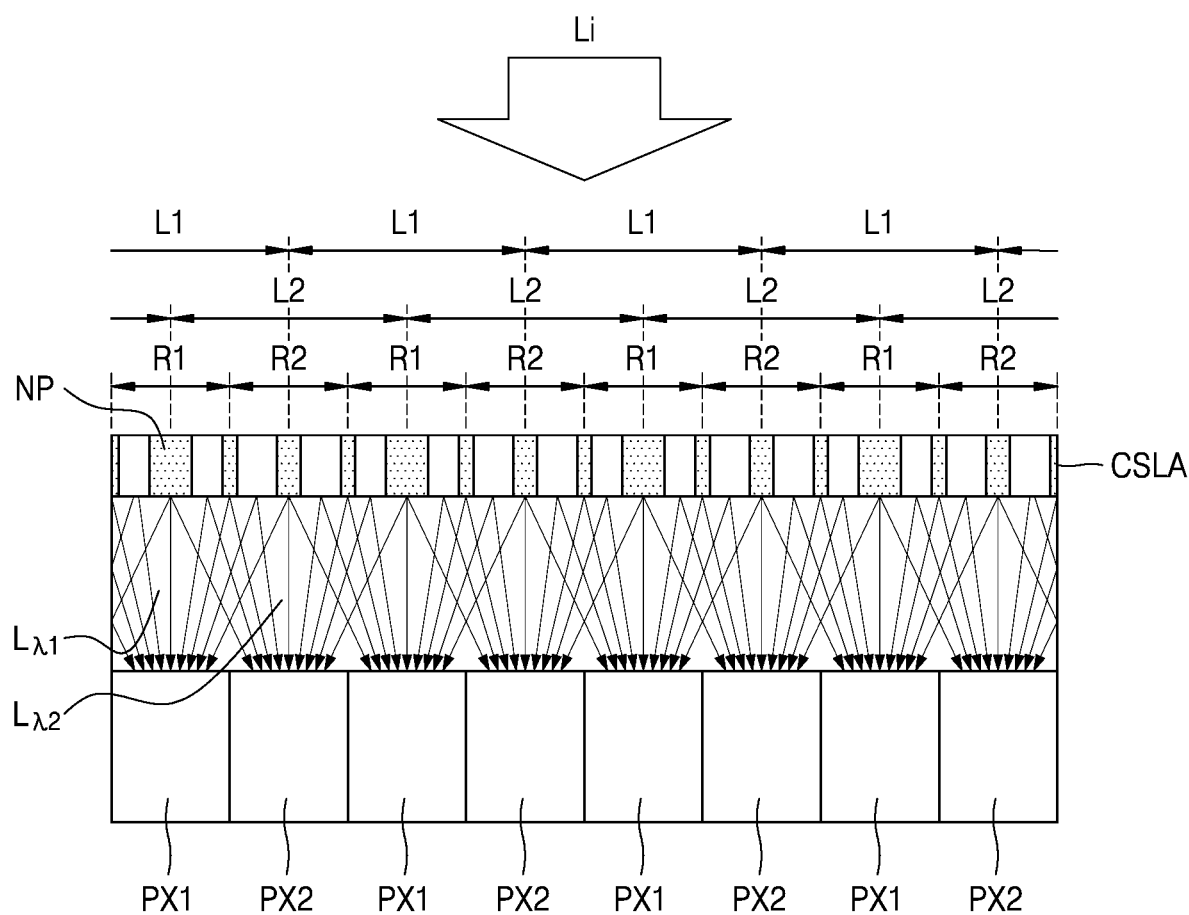
FIGS. 3A and 3B are conceptual diagrams showing a structure and operations of a color separating lens array according to an embodiment.
Figure 3B:
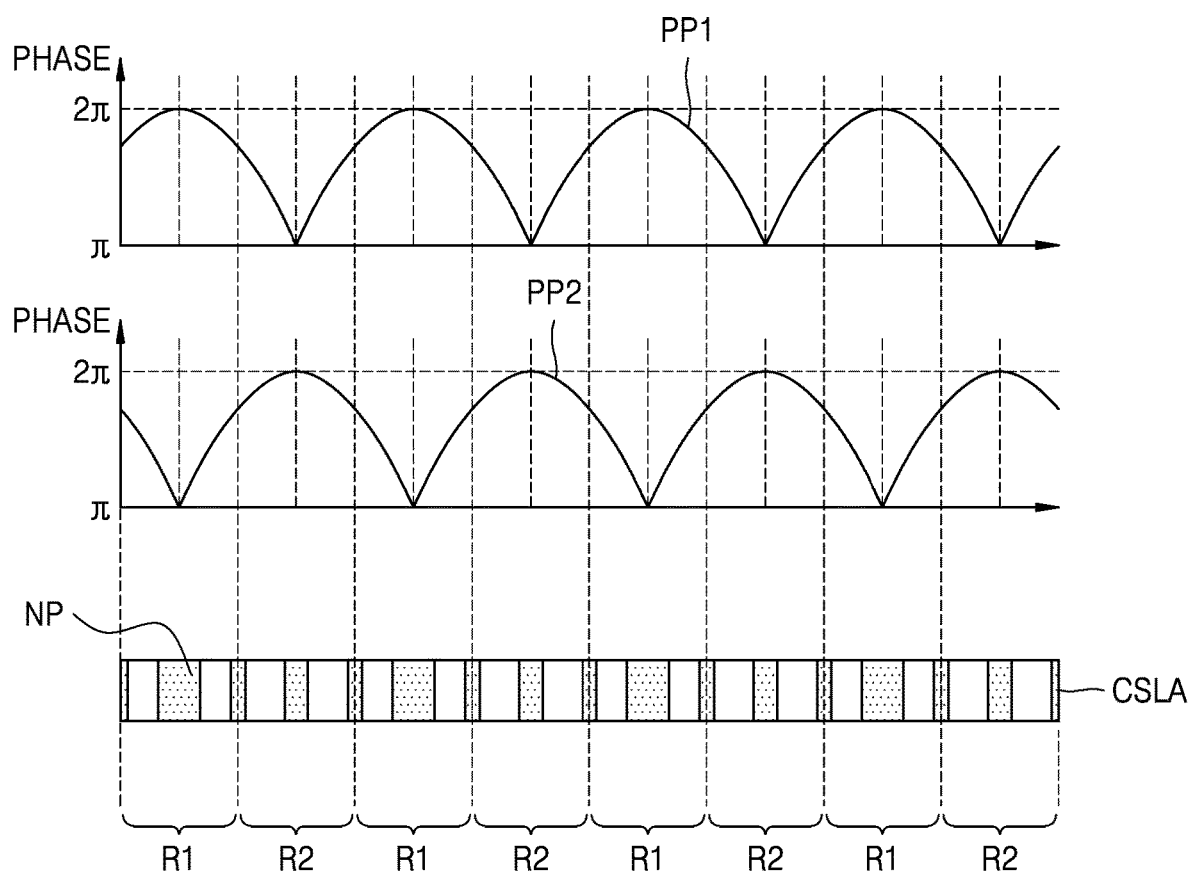

The pixel array 1100 of the image sensor 1000 may include a color separating lens array for condensing light of a color corresponding to each pixel. FIGS. 3A and 3B are diagrams showing a structure and operations of the color separating lens array.

Referring to FIG. 3A, a color separating lens array CSLA may include a plurality of nanoposts NP that change a phase of incident light Li differently from incident locations thereof. The color separating lens array CSLA may be partitioned in various ways. For example, the color separating lens array CSLA may be partitioned as a first pixel corresponding region R1 corresponding to a first pixel PX1 on which first wavelength light $L_{\lambda 1}$ included in the incident light Li is condensed, and a second pixel corresponding region R2 corresponding to a second pixel PX2 on which second wavelength light $L_{\lambda 2}$ included in the incident light Li is condensed. Each of the first and second pixel corresponding regions R1 and R2 may include one or more nanoposts NP, and the first and second pixel corresponding regions R1 and R2 may respectively face the first and second pixels PX1 and PX2. In another example, the color separating lens array CSLA may be partitioned as a first wavelength light condensing region L1 for condensing the first wavelength light $L_{\lambda 1}$ onto the first pixel PX1 and a second wavelength light condensing region L2 for condensing the second wavelength light $L_{\lambda 2}$ onto the second pixel PX2. The first and second wavelength light condensing regions L1 and L2 may partially overlap each other.

The color separating lens array CSLA may generate different phase profiles of the first wavelength light $L_{\lambda 1}$ and the second wavelength light $L_{\lambda 2}$ included in the incident light Li so that the first wavelength light $L_{\lambda 1}$ may be condensed onto the first pixel PX1 and the second wavelength light $L_{\lambda 2}$ may be condensed onto the second pixel PX2.

According to an example embodiment, referring to FIG. 3B, the color separating lens array CSLA may allow the first wavelength light $L_{\lambda 1}$ to have a first phase profile PP1 and the second wavelength light $L_{\lambda 2}$ to have a second phase profile PP2 at a position immediately after passing through the color separating lens array CSLA, e.g., on a lower surface of the color separating lens array CSLA, such that the first wavelength light $L_{\lambda 1}$ and the second wavelength light $L_{\lambda 2}$ may be respectively condensed on the corresponding first pixel PX1 and the second pixel PX2. In detail, the first wavelength light $L_{\lambda 1}$ that has passed through the color separating lens array CSLA may have the first phase profile PP1 that is largest at the center of the first pixel corresponding region R1 and reduces away from the center of the first pixel corresponding region R1, that is, toward the second pixel corresponding regions R2. Such a phase profile is similar to a phase profile of light converging to one point after passing through a convex lens, e.g., a micro-lens having a convex center in the first wavelength light condensing region L1, and the first wavelength light $L_{\lambda 1}$ may be condensed onto the first pixel PX1. Also, the second wavelength light $L_{\lambda 2}$ that has passed through the color separating lens array CSLA has the second phase profile PP2 that is largest at the center of the second pixel corresponding region R2 and reduces away from the center of the second pixel corresponding region R2, e.g., toward the first pixel corresponding regions R1, and thus, the second wavelength light $L_{\lambda 2}$ may be condensed onto the second pixel PX2.

Because a refractive index of a material varies depending on a wavelength of light, and as shown in FIG. 3B, the color separating lens array CSLA may provide different phase profiles with respect to the first and second wavelength light $L_{\lambda 1}$ and $L_{\lambda 2}$. In other words, because the same material has a different refractive index according to the wavelength of light reacting to the material and a phase delay of the light that passes through the material is different according to the wavelength, the phase profile may vary depending on the wavelength. For example, a refractive index of the first pixel corresponding region R1 with respect to the first wavelength light $L_{\lambda 1}$ and a refractive index of the first pixel corresponding region R1 with respect to the second wavelength light $L_{\lambda 2}$ may be different from each other, and the phase delay of the first wavelength light $L_{\lambda 1}$ that passed through the first pixel corresponding region R1 and the phase delay of the second wavelength light $L_{\lambda 2}$ that passed through the first pixel corresponding region R1 may be different from each other. Therefore, when the color separating lens array CSLA is designed based on the characteristics of light, different phase profiles may be provided with respect to the first wavelength light $L_{\lambda 1}$ and the second wavelength light $L_{\lambda 2}$.

The color separating lens array CSLA may include nanoposts NP that are arranged according to a certain rule such that the first and second wavelength light $L_{\lambda 1}$ and $L_{\lambda 2}$ may respectively have the first and second phase profiles PP1 and PP2. Here, the rule may be applied to parameters, such as the shape of the nanoposts NP, sizes (width and height), a distance between the nanoposts NP, and the arrangement form thereof, and these parameters may be determined according to a phase profile to be implemented by the color separating lens array CSLA.

A rule in which the nanoposts NP are arranged in the first pixel corresponding region R1, and a rule in which the nanoposts NP are arranged in the second pixel corresponding region R2 may be different from each other. In other words, sizes, shapes, intervals, and/or arrangement of the nanoposts NP in the first pixel corresponding region R1 may be different from those of the nanoposts NP in the second pixel corresponding region R2.

A cross-sectional diameter of the nanoposts NP may have sub-wavelength dimension. Here, the sub-wavelength refers to a wavelength that is less than a wavelength band of light to be branched. The nanoposts NP may have a dimension that is less than a shorter wavelength of the first wavelength and the second wavelength. When the incident light Li is a visible ray, the cross-sectional diameter of the nanoposts NP may be less than, for example, 400 nm, 300 nm, or 200 nm. In addition, a height of the nanoposts NP may be about 500 nm to about 1500 nm, which is greater than the cross-sectional diameter. According to an example embodiment, the nanoposts NP may be obtained by combining two or more posts stacked in a height direction (Z direction).

The nanoposts NP may include a material having a higher refractive index than that of a peripheral material. For example, the nanoposts NP may include c-Si, p-Si, a-Si and a Group III-V compound semiconductor (GaP, GaN, GaAs etc.), SiC, $TiO_2$, SiN, and/or a combination thereof. The nanoposts NP having a different refractive index from the refractive index of the peripheral material may change the phase of light that passes through the nanoposts NP. This is caused by phase delay that occurs due to the shape dimension of the sub wavelength of the nanoposts NP, and a degree at which the phase is delayed, may be determined by a detailed shape dimension and arrangement shape of the nanoposts NP. A peripheral material of the nanoposts NP may include a dielectric material having a lower refractive index than that of the nanoposts NP. For example, the peripheral material may include $SiO_2$ or air.

A first wavelength $\lambda 1$ and a second wavelength $\lambda 2$ may be in a wavelength band of infrared rays and visible rays. However, the disclosure is not limited thereto, and as such, according to another example embodiment, a variety of wavelength bands may be implemented according to the rule of arrays of the plurality of nanoposts NP. Also, two wavelengths are branched and condensed as an example. However, the disclose is not limited thereto, and as such, according to another example embodiment, the incident light may be branched into three directions or more according to wavelengths and condensed.

Also, the color separating lens array CSLA includes one single layer, but the color separating lens array CSLA may have a structure in which a plurality of layers are stacked. For example, a first layer may condense the visible ray to a certain pixel and a second layer may condense the infrared ray to another pixel.

Hereinafter, an example in which the color separating lens array CSLA described above is applied to the pixel array 1100 of the image sensor 1000.

Figure 4A:
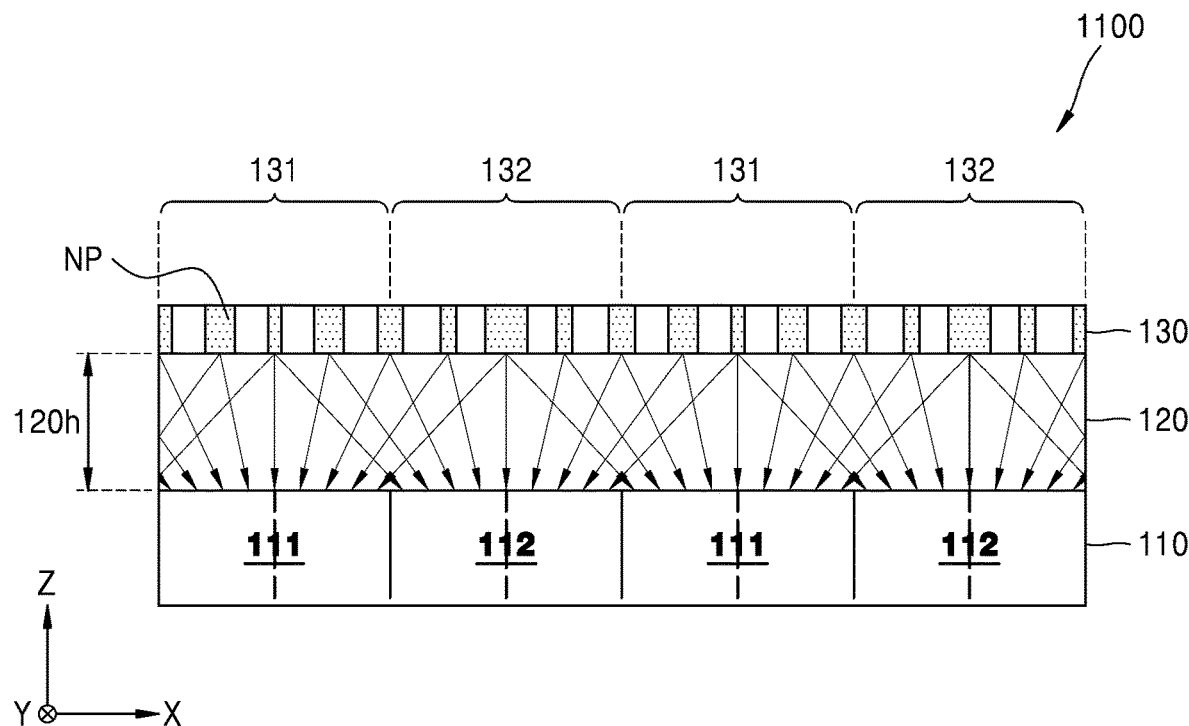
FIGS. 4A and 4B are cross-sectional views of a pixel array in an image sensor according to an embodiment, seen from different cross-sections.
Figure 4B:
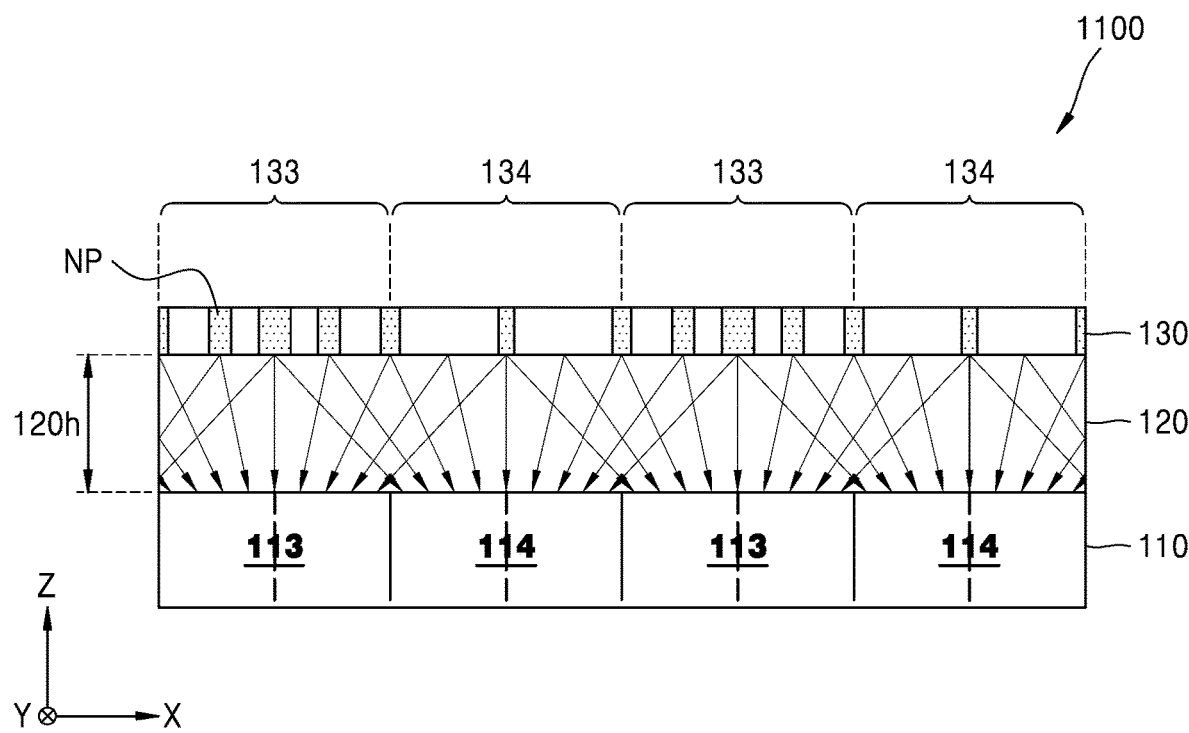
Figure 5A:
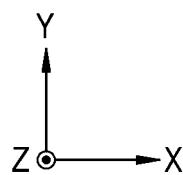
FIG. 5A is a plan view showing a pixel arrangement in a pixel array.
Figure 5B:
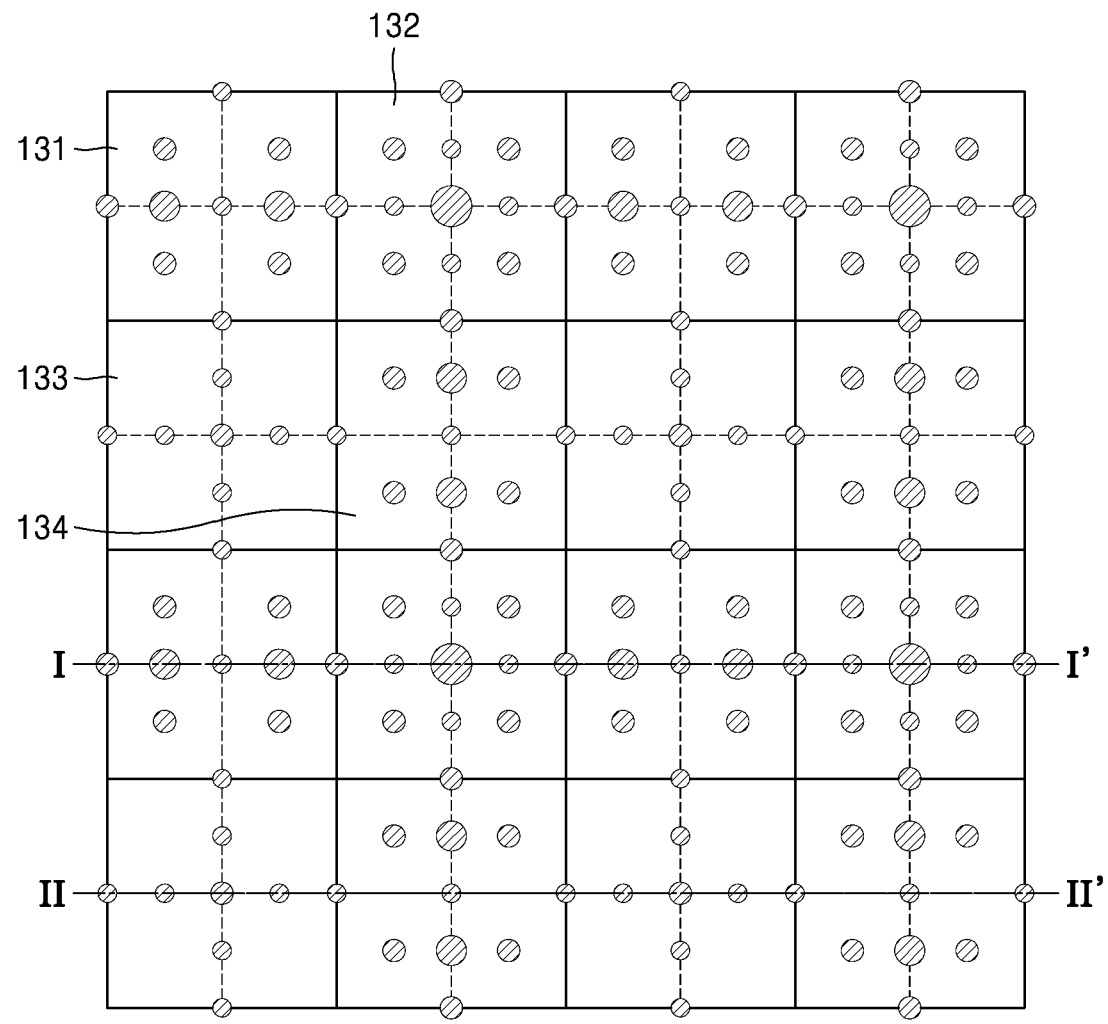
FIG. 5B is a plan view showing an example of an of arrangement a plurality of nanoposts in a plurality of regions of a color separating lens array.
Figure 5C:
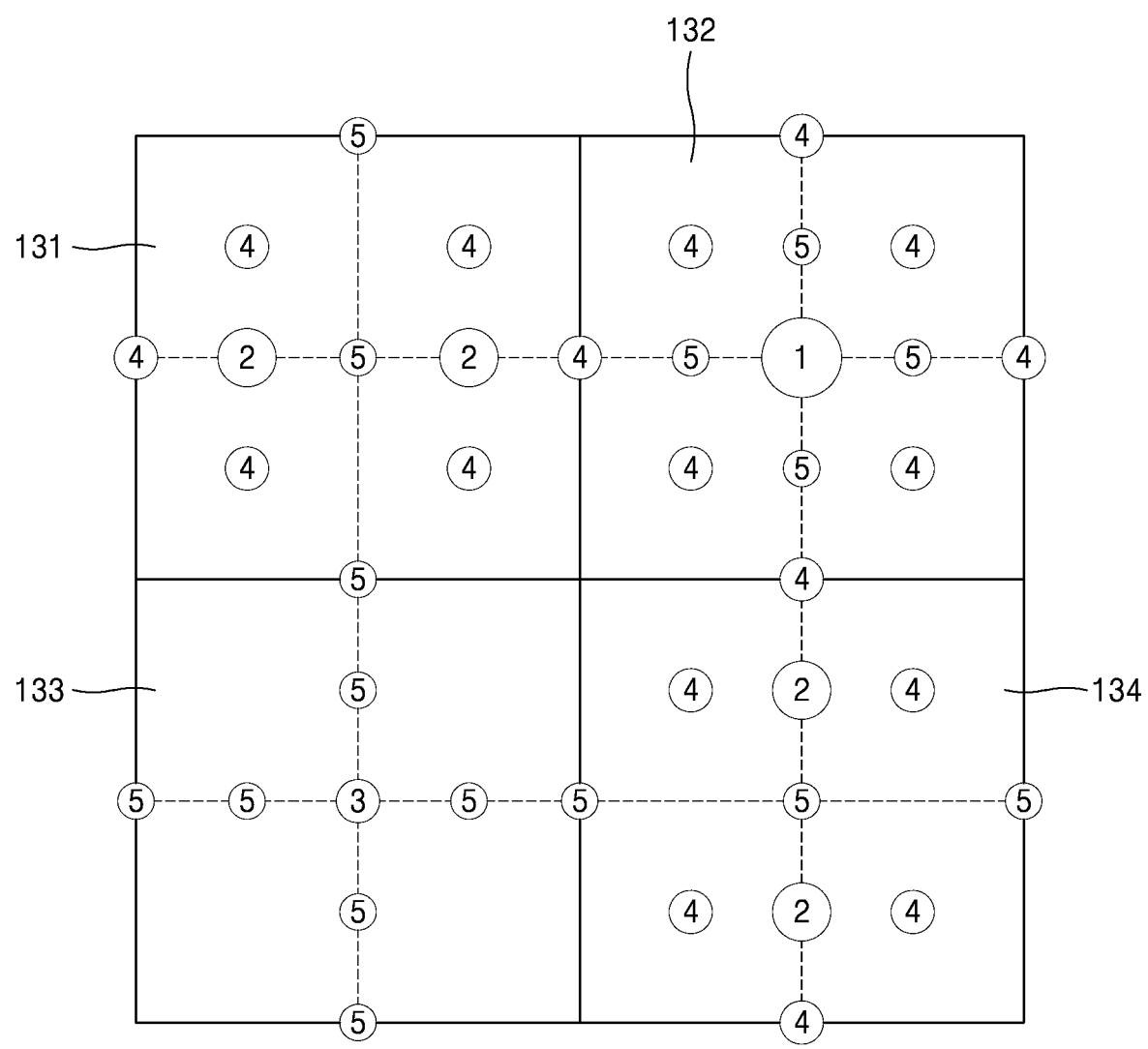
FIG. 5C is a plan view showing an enlarged view of a part of FIG. 5B.

FIGS. 4A and 4B are cross-sectional views of the pixel array 1100 in the image sensor 1000 seen from different sections, FIG. 5A is a plan view showing an arrangement of pixels in the pixel array 1100 of the image sensor 1000, FIG. 5B is a plan view showing an example in which a plurality of nanoposts are arranged in a plurality of regions of the color separating lens array in the pixel array 1100 of the image sensor 1000, and FIG. 5C is a plan view showing an enlarged view of a part in FIG. 5B.

FIGS. 4A and 4B are cross-sectional views of the pixel array 1100 in the image sensor 1000 seen from different sections. According to an example embodiment, the different sections may be sections illustrated in FIG. 5A. Referring to FIGS. 4A and 4B, the pixel array 1100 of the image sensor 1000 includes a sensor substrate 110 including a plurality of pixels 111, 112, 113, and 114 for sensing light, a transparent spacer layer 120 disposed on the sensor substrate 110, and a color separating lens array 130 on the spacer layer 120.

The sensor substrate 110 may include a first green pixel 111, a blue pixel 112, a red pixel 113, and a second green pixel 114 that convert light into electrical signals. In addition, the first green pixel 111 and the blue pixel 112 are alternately arranged in a first direction (X direction), and in a different cross-section taken along the Y direction, the red pixel 113 and the second green pixel 114 may be alternately arranged as shown in FIG. 4B. FIG. 5A shows the arrangement of pixels when the pixel array 1100 of the image sensor 1000 has the Bayer pattern arrangement as shown in FIG. 2A. Such above arrangement is provided for separately sensing the incident light with unit patterns such as the Bayer pattern, for example, the first and second green pixels 111 and 114 may sense green light, the blue pixel 112 may sense blue light, and the red pixel 113 may sense red light. Although not shown in the drawings, a separator for separating cells may be further formed on a boundary between cells.

Referring to FIG. 5A, some or all of the pixels 111, 112, 113, and 114 may each include four or more photosensitive cells, and four or more photosensitive cells included in one pixel may share the light condensing regions of the color separating lens array. When a plurality of photosensitive cells that may independently sense light are included in one pixel, a resolution of the image sensor may be improved. In addition, an auto-focusing function of the image sensor 1000 and/or a camera device including the image sensor 1000 may be implemented by using differences among signals obtained from the photosensitive cells. According to an example embodiment illustrated in FIG. 5A, when all of the green, blue, and red pixels 111, 112, 113, and 114 each include four photosensitive cells, the first green pixel 111 includes 1-1st to 1-4th (i.e., a first group of first to fourth) green light sensing cells 111a, 111b, 111c, and 111d, the blue pixel 112 includes first to fourth blue light sensing cells 112a, 112b, 112c, and 112d, the red pixel 113 includes first to fourth red light sensing cells 113a, 113b, 113c, and 113d, and the second green pixel 114 includes 2-1st to 2-4th (i.e., a second group of first to fourth) green light sensing cells 114a, 114b, 114c, and 114d.

The spacer layer 120 is arranged between the sensor substrate 110 and the color separating lens array 130 in order to maintain a distance between the sensor substrate 110 and the color separating lens array 130 constant. The spacer layer 120 may include a material transparent with respect to the visible ray, for example, a dielectric material having a lower refractive index than that of the nanoposts NP and low absorption coefficient in the visible ray band, e.g., $SiO_2$, siloxane-based spin on glass (SOG), etc. A thickness 120h of the spacer layer 120 may be determined based on a focal distance of the light condensed by the color separating lens array 130, for example, may be about ½ of a focal distance of the light of a reference wavelength $\lambda_0$ as described later. A focal distance f of the reference wavelength light $\lambda_0$ condensed by the color separating lens array 130 may be expressed by equation 1 below, when a refractive index of the spacer layer 120 with respect to the reference wavelength $\lambda_0$ is n and a pitch between pixels is p.

$$f = \frac{np^2}{\lambda_0} - \frac{\lambda_0}{4n}$$

Assuming that the reference wavelength $\lambda_0$ is 540 nm, e.g., green light, the pitch among the pixels 111, 112, 113, and 114 is 0.8 μm, and a refractive index n of the spacer layer 120 at the wavelength of 540 nm is 1.46, the focal distance f of the green light, that is, a distance between a lower surface of the color separating lens array 130 and a point where the green light is converged, is about 1.64 μm and a thickness 120h of the spacer layer 120 may be about 0.82 μm. In another example, assuming that the reference wavelength $\lambda_0$ is 540 nm, e.g., green light, the pitch among the pixels 111, 112, 113, and 114 is 1.2 μm, and a refractive index n of the spacer layer 120 at the wavelength of 540 nm is 1.46, the focal distance f of the green light is about 3.80 μm and the thickness 120h of the spacer layer 120 may be about 1.90 μm.

In other words, the thickness 120h of the spacer layer 120 described above may be about 70% to about 120% of the pixel pitch when the pixel pitch is about 0.5 μm to about 0.9 μm, and may be about 110% to about 180% of the pixel pitch when the pixel pitch is about 0.9 μm to about 1.3 μm.

The color separating lens array 130 may include the nanoposts NP supported by the spacer layer 120 and changing a phase of the incident light, and a dielectric material between the nanoposts NP and having a refractive index less than that of the nanoposts NP, e.g., air or $SiO_2$.

Referring to FIG. 5B, the color separating lens array 130 may be partitioned into four pixel corresponding regions 131, 132, 133, and 134 corresponding to the pixels 111, 112, 113, and 114 of FIG. 5A. A first green pixel corresponding region 131 corresponds to the first green pixel 111 and may be on the first green pixel 111 in a vertical direction, a blue pixel corresponding region 132 corresponds to the blue pixel 112 and may be on the blue pixel 112 in the vertical direction, a red pixel corresponding region 133 corresponds to the red pixel 113 and may be on the red pixel 113 in the vertical direction, and a second green pixel corresponding region 134 corresponds to the second green pixel 114 and may be on the second green pixel 114 in the vertical direction. That is, the pixel corresponding regions 131, 132, 133, and 134 of the color separating lens array 130 may be arranged respectively facing the pixels 111, 112, 113, and 114 of the sensor substrate 110 in the vertical direction. The pixel corresponding regions 131, 132, 133, and 134 may be two-dimensionally arranged in the first direction (X direction) and the second direction (Y direction) such that a first row in which the first green pixel corresponding region 131 and the blue pixel corresponding region 132 are alternately arranged and a second row in which the red pixel corresponding region 133 and the second green pixel corresponding region 134 are alternately arranged are alternately repeated. The color separating lens array 130 includes a plurality of unit patterns that are two-dimensionally arranged like the pixel array of the sensor substrate 110, and each of the unit patterns includes the pixel corresponding regions 131, 132, 133, and 134 arranged in a 2×2 array.

In addition, similar to the above description with reference to FIG. 3B, the color separating lens array 130 may be partitioned as a green light condensing region for condensing the green light, a blue light condensing region for condensing the blue light, and a red light condensing region for condensing the red light.

The color separating lens array 130 may include the nanoposts NP, of which sizes, shapes, intervals, and/or arrangements are defined, such that the green light is separated and condensed to the first and second green pixels 111 and 114, the blue light is separately condensed to the blue pixel 112, and the red light is separately condensed to the red pixel 113. In addition, a thickness of the color separating lens array 130 in a third direction (Z direction) may be similar to heights of the nanoposts NP, and may be about 500 nm to about 1500 nm.

Referring to FIG. 5B, the pixel corresponding regions 131, 132, 133, and 134 may include the nanoposts NP having cylindrical shapes each having a circular cross-section. In a center portion of each region, the nanoposts NP having different cross-sectional areas are arranged, and the nanoposts NP may be also arranged at the center on a boundary between pixels and a crossing point between the pixel boundaries.

FIG. 5C shows the arrangement of the nanoposts NP included in partial regions of FIG. 5B, that is, the pixel corresponding regions 131, 132, 133, and 134 in the unit pattern. In FIG. 5C, the nanoposts NP are indicated by 1 to 5 according to sizes of the cross-section of the unit pattern. Referring to FIG. 5C, from among the nanoposts NP, a nanopost 1 having the largest cross-sectional area is at the center of the blue pixel corresponding region 132, and nanoposts 5 having the smallest cross-sectional area may be arranged around the nanopost 1 and nanoposts 3 and at centers of the first and second green pixel corresponding regions 131 and 134. However, the disclosure is not limited to the above example, and as, according to another example embodiment, the nanoposts NP having various shapes, sizes, and arrangement may be applied.

The nanoposts NP included in the first and second green pixel corresponding regions 131 and 134 may have different distribution rules in the first direction (X direction) and the second direction (Y direction). For example, the nanoposts NP arranged in the first and second green pixel corresponding regions 131 and 134 may have different size arrangements in the first direction (X direction) and the second direction (Y direction). As shown in FIG. 5C, from among the nanoposts NP, a cross-sectional area of a nanopost 4 located at a boundary between the first green pixel corresponding region 131 and the blue pixel corresponding region 132 that is adjacent to the first green pixel corresponding region 131 in the first direction (X direction) is different from that of the nanoposts 5 located at a boundary between the first green pixel corresponding region 131 and the red pixel corresponding region 133 that is adjacent to the first green pixel corresponding region 131 in the second direction (Y direction). Likewise, a cross-sectional area of the nanopost 5 located at a boundary between the second green pixel corresponding region 134 and the red pixel corresponding region 133 that is adjacent to the second green pixel corresponding region 134 in the first direction (X direction) is different from that of the nanopost 4 located at a boundary between the second green pixel corresponding region 134 and the blue pixel corresponding region 132 that is adjacent to the second green pixel corresponding region 134 in the second direction (Y direction).

On the other hand, the nanoposts NP arranged in the blue pixel corresponding region 132 and the red pixel corresponding region 133 may have symmetrical arrangement rules in the first direction (X direction) and the second direction (Y direction). As shown in FIG. 5C, from among the nanoposts NP, the cross-sectional area of the nanoposts 4 at a boundary between the blue pixel corresponding region 132 and adjacent pixels in the first direction (X direction) and the cross-sectional areas of the nanoposts 4 at a boundary between the blue pixel corresponding region 132 and the adjacent pixels in the second direction (Y direction) are the same as each other, and in the red pixel corresponding region 133, the cross-sectional areas of the nanoposts 5 at a boundary between adjacent pixels in the first direction (X direction) and the cross-sectional areas of the nanoposts 5 at a boundary between the adjacent pixels in the second direction (Y direction) are the same as each other.

The above distribution due to the pixel arrangement in the Bayer pattern. Adjacent pixels to the blue pixel 112 and the red pixel 113 in the first direction (X direction) and the second direction (Y direction) are the green pixels G, whereas the adjacent pixel to the first green pixel 111 in the first direction (X direction) is the blue pixel 112 and adjacent pixel to the first green pixel 111 in the second direction (Y direction) is the red pixel R. In addition, the adjacent pixel to the second green pixel 114 in the first direction (X direction) is the red pixel 113 and the adjacent pixel to the second green pixel 114 in the second direction (Y direction) is the blue pixel 112. In addition, adjacent pixels to the first and second green pixels 111 and 114 in four diagonal directions are green pixels, adjacent pixels to the blue pixel 112 in the four diagonal directions are the red pixels 113, and adjacent pixels to the red pixel 113 in the four diagonal directions are the blue pixels 112. Therefore, in the blue and red pixel corresponding regions 132 and 133 respectively corresponding to the blue pixel 112 and the red pixel 113, the nanoposts NP may be arranged in the form of 4-fold symmetry, and in the first and second green pixel corresponding regions 131 and 134, the nanoposts NP may be arranged in the form of 2-fold symmetry. In particular, the first and second green pixel corresponding regions 131 and 134 are rotated by 90° angle with respect to each other.

The plurality of nanoposts NP have symmetrical circular cross-sectional shapes in FIGS. 5B and 5C. However, some nanoposts having asymmetrical cross-sectional shapes may be included. For example, the first and second green pixel corresponding regions 131 and 134 may adopt nanoposts having asymmetrical cross-sections, each of which has different widths in the first direction (X direction) and the second direction (Y direction), and the blue and red pixel corresponding regions 132 and 133 may adopt nanoposts having symmetrical cross-sections, each of which has the same widths in the first direction (X direction) and the second direction (Y direction). The arrangement rule of the nanoposts NP is an example, and is not limited thereto.

Figure 6A:
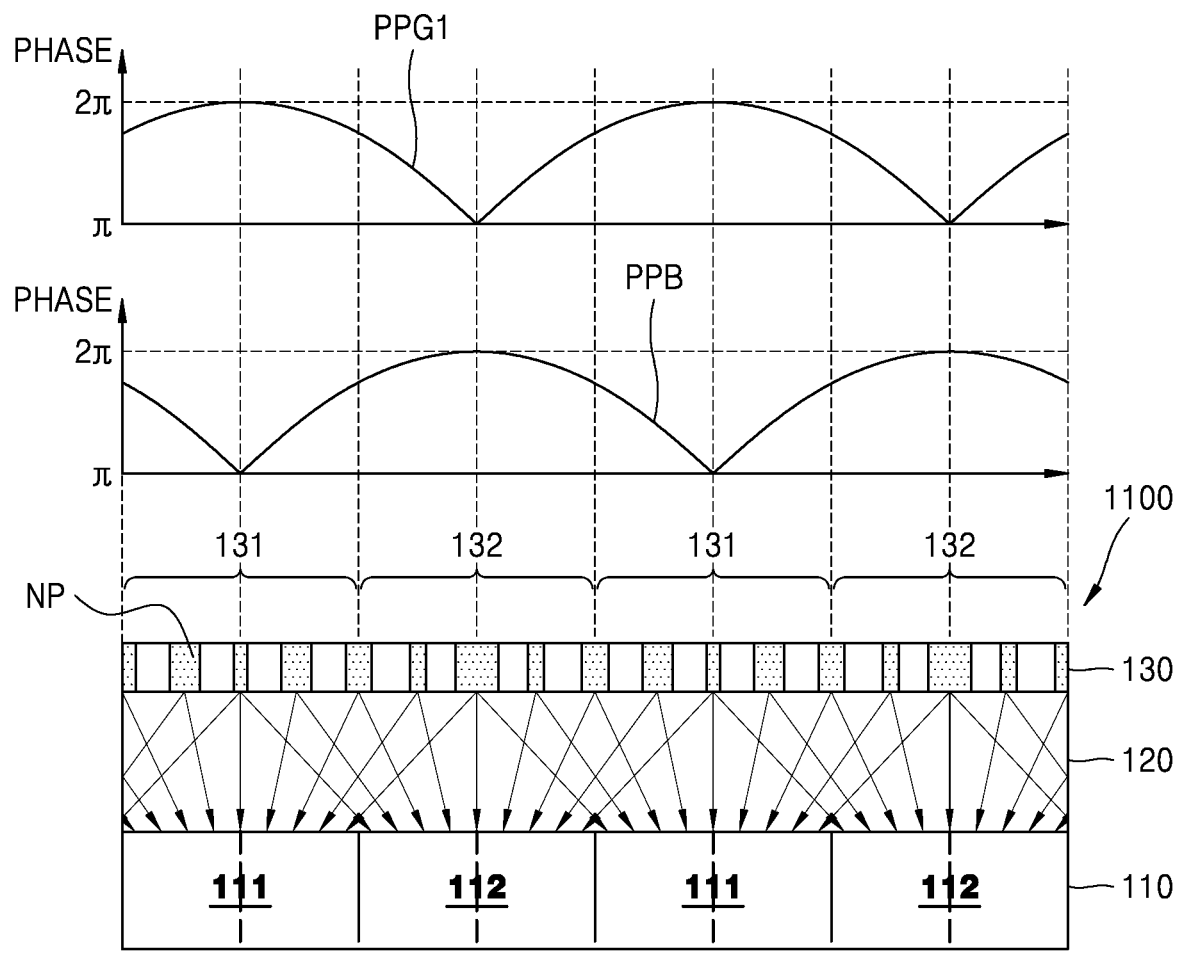
FIG. 6A is a diagram showing phase profiles of green light and blue light that have passed through a color separating lens array along line I-I' of FIG. 5B.
Figure 6B:
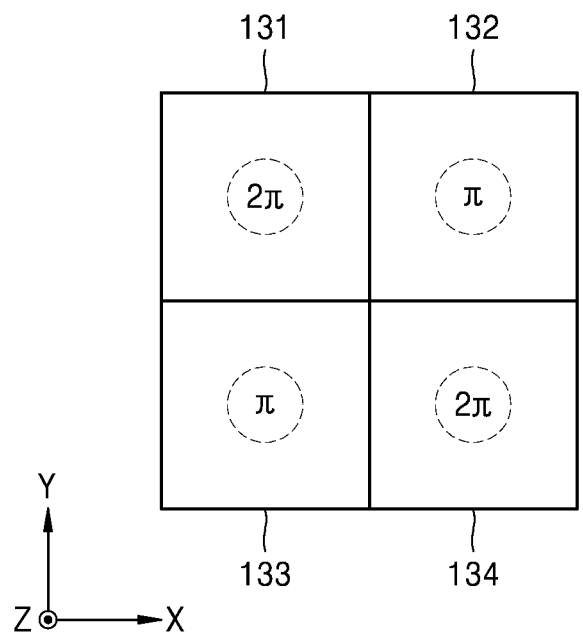
FIG. 6B is a diagram showing a phase of the green light that has passed through the color separating lens array at a center of pixel corresponding regions.
Figure 6C:
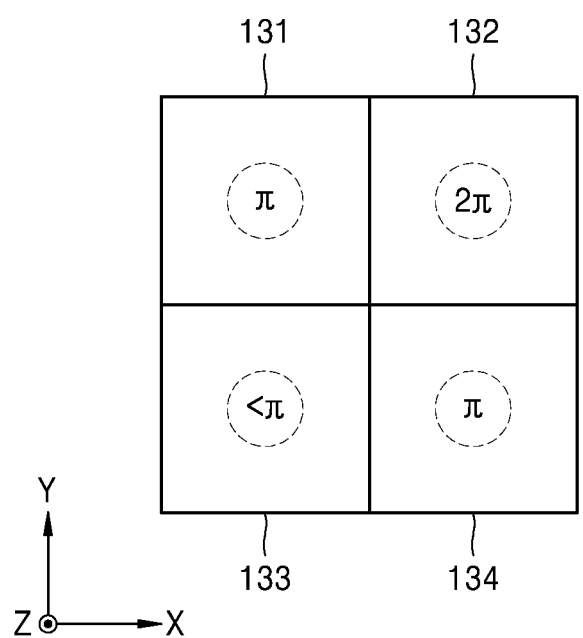
FIG. 6C is a diagram showing a phase of blue light that has passed through the color separating lens array at the center of pixel corresponding regions.

FIG. 6A shows phase profiles of the green light and the blue light that have passed through the color separating lens array 130 in line I-I' of FIG. 5B, FIG. 6B shows the phase of the green light that has passed through the color separating lens array 130 at centers of the pixel corresponding regions 131, 132, 133, and 134, and FIG. 6C shows the phase of the blue light that has passed through the color separating lens array 130 at the centers of the pixel corresponding regions 131, 132, 133, and 134. The phase profiles of the green light and the blue light shown in FIG. 6A are similar to those of the first and second wavelength light exemplary shown in FIG. 3B.

Referring to FIGS. 6A and 6B, the green light that has passed through the color separating lens array 130 may have a first green light phase profile PPG1 that is the largest at the center of the first green pixel corresponding region 131 and is reduced away from the center of the first green pixel corresponding region 131. In detail, immediately after passing through the color separating lens array 130, that is, at a lower surface of the color separating lens array 130 or an upper surface of the spacer layer 120, the phase of the green light is the largest at the center of the first green pixel corresponding region 131 and is reduced as a concentric circle away from the center of the first green pixel corresponding region 131. Thus, the phase is the smallest at the centers of the blue and red pixel corresponding regions 132 and 133 in the X and Y directions, and at contact points between the first green pixel corresponding region 131 and the second green pixel corresponding region 134 in the diagonal direction. When a phase of the green light is set as $2\pi$ based on the phase of light emitted from the center of the first green pixel corresponding region 131, the light having a phase of about $0.9\pi$ to about $1.1\pi$ may be emitted from the centers of the blue and red pixel corresponding regions 132 and 133, and the light having a phase of about $1.1\pi$ to about $1.5\pi$ may be emitted from a contact point between the first green pixel corresponding region 131 and the second green pixel corresponding region 134. Therefore, a difference between the phase of the green light that has passed through the center of the first green pixel corresponding region 131 and the phase of the green light that has passed through the centers of the blue and red pixel corresponding regions 132 and 133 may be about $0.9\pi$ to about $1.1\pi$.

In addition, according to an example embodiment, the first green light phase profile PPG1 does not denote that the phase delay amount of the light that has passed through the center of the first green pixel corresponding region 131 is the largest. Instead, when the phase of light that has passed through the first green pixel corresponding region 131 is $2\pi$ and a phase delay amount of the light that has passed through another point is greater and has a phase value of $2\pi$ or greater, the first green light phase profile PPG1 may denote a value remaining after subtracting $2n\pi$, that is, a wrapped phase profile. For example, when the phase of light that has passed through the first green pixel corresponding region 131 is $2\pi$ and the phase of light that has passed through the center of the blue pixel corresponding region 132 is $3\pi$, the phase in the blue pixel corresponding region 132 may be remaining $\pi$ after subtracting $2\pi(n=1)$ from $3\pi$.

Referring to FIGS. 6A and 6C, the blue light that has passed through the color separating lens array 130 may have a blue light phase profile PPB that is the largest at the center of the blue pixel corresponding region 132 and is reduced away from the center of the blue pixel corresponding region 132. In detail, immediately after passing through the color separating lens array 130, the phase of the blue light is the largest at the center of the blue pixel corresponding region 132 and is reduced as the concentric circle away from the center of the blue pixel corresponding region 132, the phase is the smallest at the centers of the first and second green pixel corresponding regions 131 and 134 in the X direction and the Y direction and is the smallest at the center of the red pixel corresponding region 133 in the diagonal direction. When the phase of the blue light at the center of the blue pixel corresponding region 132 is $2\pi$, the phase at the centers of the first and second green pixel corresponding regions 131 and 134 may be about, for example, $0.9\pi$ to about $1.1\pi$, and the phase at the center of the red pixel corresponding region 133 may be less than that at the centers of the first and second green pixel corresponding regions 131 and 134, for example, about $0.5\pi$ to about $0.9\pi$.

Figure 6D:
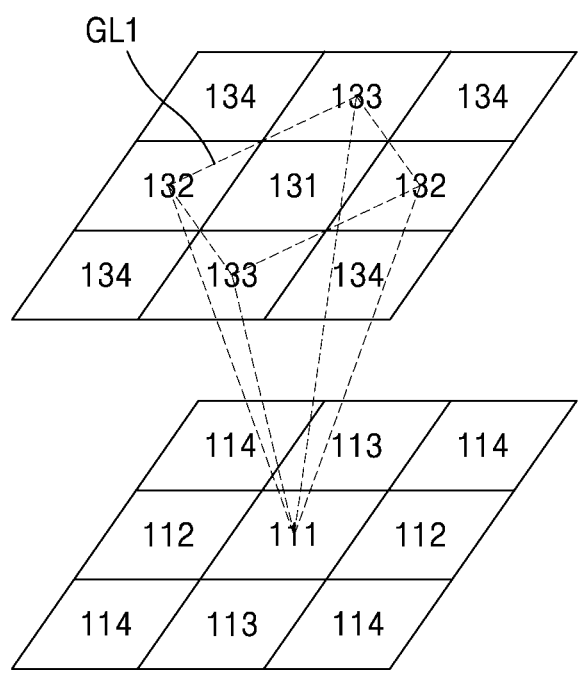
FIG. 6D is a diagram showing an example of a traveling direction of green light incident on a first green light condensing region.
Figure 6E:
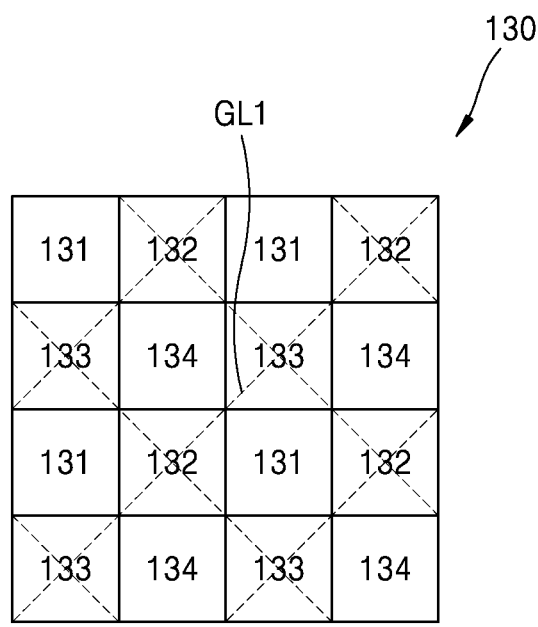
FIG. 6E is a diagram showing an example of an array of the first green light condensing region.

FIG. 6D shows an example of a traveling direction of green light incident on a first green light condensing region, and FIG. 6E shows an example of an array of the first green light condensing region.

As shown in FIG. 6D, the green light incident on the vicinity of the first green pixel corresponding region 131 is condensed to the first green pixel 111 by the color separating lens array 130, and the green light from the blue and red pixel corresponding regions 132 and 133, in addition to the first green pixel corresponding region 131, is also incident on the first green pixel 111. That is, according to the phase profile of the green light described above with reference to FIGS. 6A and 6B, the green light that has passed through a first green light condensing region GL1 that is obtained by connecting centers of two blue pixel corresponding regions 132 and two red pixel corresponding regions 133 that are adjacent to the first green pixel corresponding region 131 is condensed onto the first green pixel 111. Therefore, as shown in FIG. 6E, the color separating lens array 130 may operate as a first green light condensing region array for condensing the green light onto the first green pixel 111. The first green light condensing region GL1 may have a greater area than that of the corresponding first green pixel 111, e.g., may be 1.2 times to twice greater.

Figure 6F:
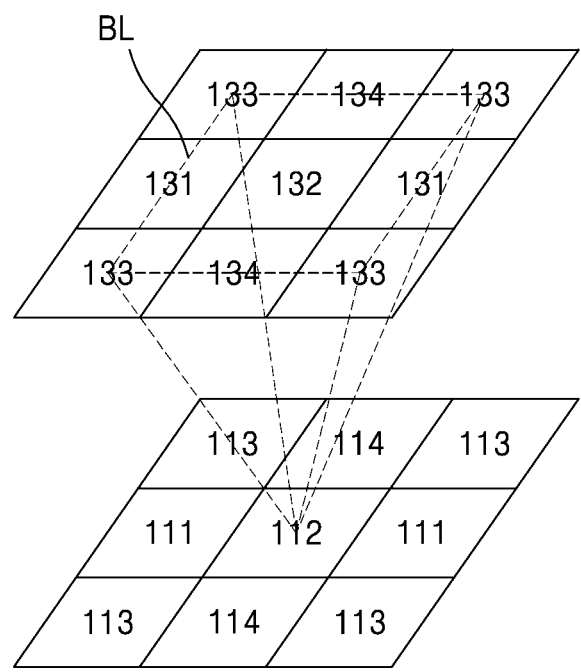
FIG. 6F is a diagram showing an example of a traveling direction of blue light incident on a blue light condensing region.
Figure 6G:
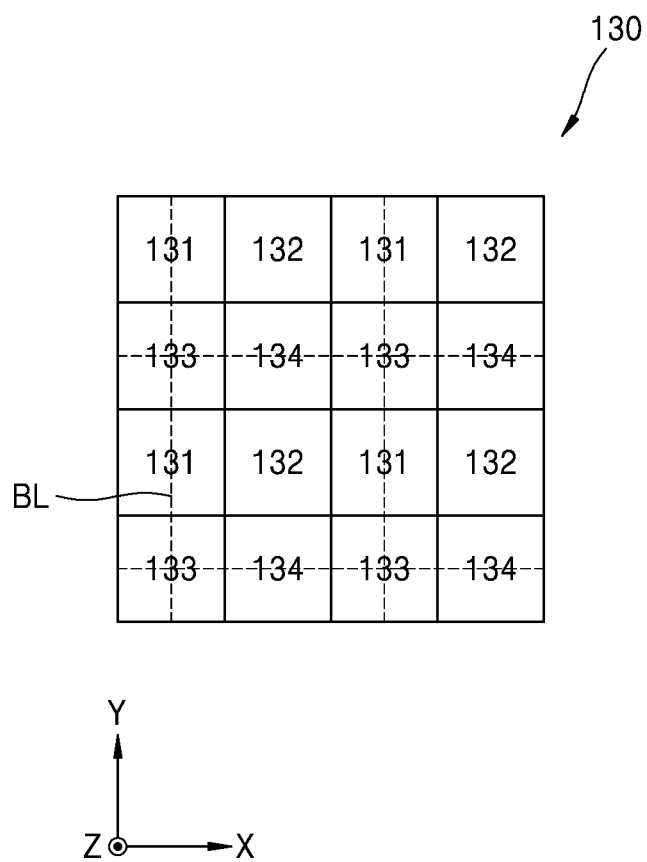
FIG. 6G is a diagram showing an example of an array of the blue light condensing region.

FIG. 6F shows an example of a traveling direction of blue light incident on a blue light condensing region, and FIG. 6G shows an example of an array of the blue light condensing region.

The blue light is condensed onto the blue pixel 112 by the color separating lens array 130 as shown in FIG. 6F, and the blue light from the pixel corresponding regions 131, 132, 133, and 134 is incident on the blue pixel 112. In the phase profile of the blue light described above with reference to FIGS. 6A and 6C, the blue light that has passed through a blue light condensing region BL that is obtained by connecting centers of four red pixel corresponding regions 133 adjacent to the blue pixel corresponding region 132 at apexes is condensed onto the blue pixel 112. Therefore, as shown in FIG. 6G, the color separating lens array 130 may operate as a blue light condensing region array for condensing the blue light to the blue pixel. The blue light condensing region BL has an area greater than that of the blue pixel 112, e.g., may be 1.5 to 4 times greater. The blue light condensing region BL may partially overlap the first green light condensing region GL1 described above, and a second green light condensing region GL2 and a red light condensing region RL.

Figure 7A:
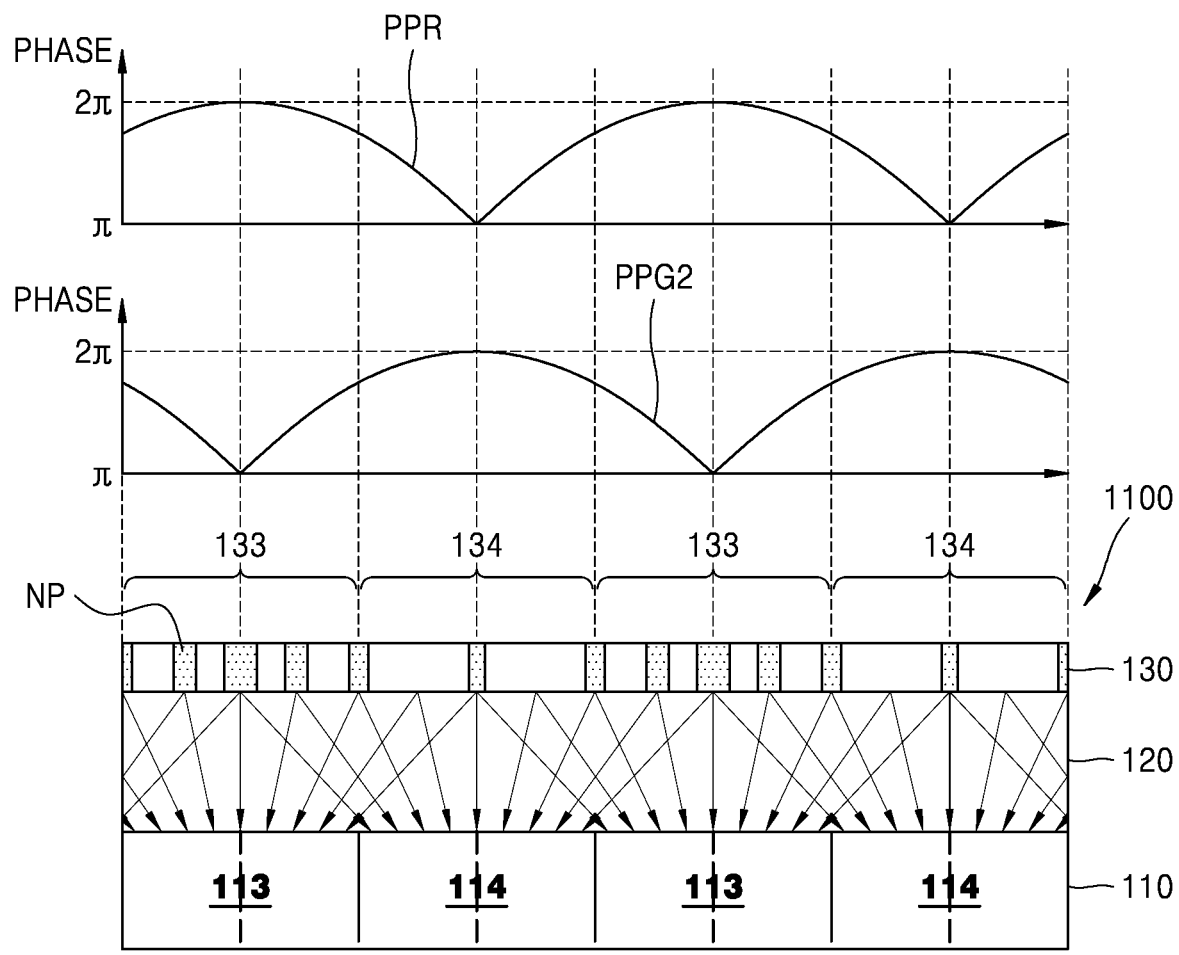
FIG. 7A is a diagram showing phase profiles of red light and green light that have passed through a color separating lens array along line II-II' of FIG. 5B.
Figure 7B:
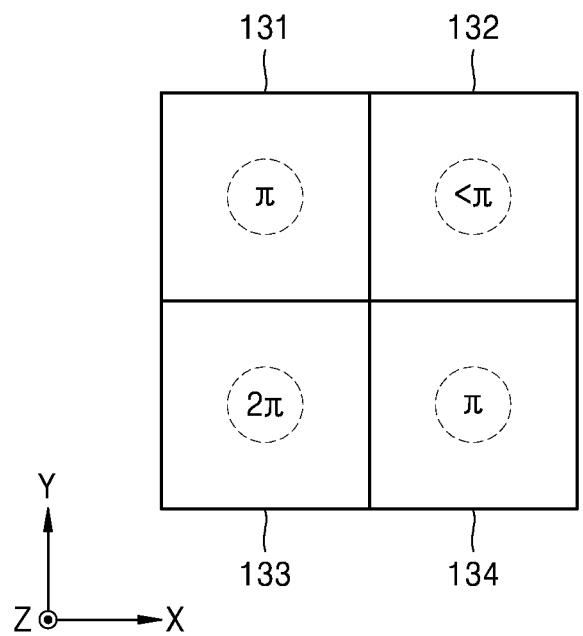
FIG. 7B is a diagram showing a phase of the red light that has passed through the color separating lens array at a center of pixel corresponding regions.
Figure 7C:
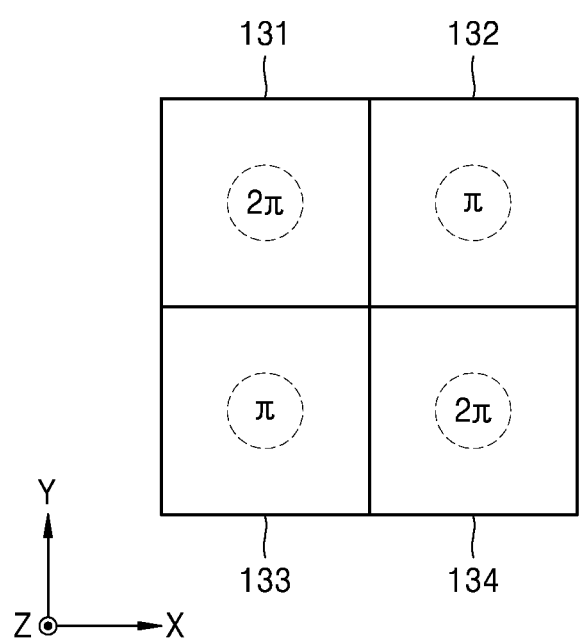
FIG. 7C is a diagram showing a phase of green light that has passed through the color separating lens array at the center of pixel corresponding regions.

FIG. 7A shows phase profiles of the green light and the blue light that have passed through the color separating lens array 130 in line II-II' of FIG. 5B, FIG. 7B shows the phase of the red light that has passed through the color separating lens array 130 at centers of the pixel corresponding regions 131, 132, 133, and 134, and FIG. 7C shows the phase of the green light that has passed through the color separating lens array 130 at the centers of the pixel corresponding regions 131, 132, 133, and 134.

Referring to FIGS. 7A and 7C, the red light that has passed through the color separating lens array 130 may have a red light phase profile PPR that is the largest at the center of the red pixel corresponding region 133 and is reduced away from the center of the red pixel corresponding region 133. In detail, immediately after passing through the color separating lens array 130, the phase of the red light is the largest at the center of the red pixel corresponding region 133 and is reduced as the concentric circle away from the center of the red pixel corresponding region 133, the phase is the smallest at the centers of the first and second green pixel corresponding regions 131 and 134 in the X direction and the Y direction and is the smallest at the center of the blue pixel corresponding region 132 in the diagonal direction. When the phase of the red light at the center of the red pixel corresponding region 133 is $2\pi$, the phase at the centers of the first and second green pixel corresponding regions 131 and 134 may be about, for example, $0.9\pi$ to about $1.1\pi$, and the phase at the center of the blue pixel corresponding region 132 may be less than that at the centers of the first and second green pixel corresponding regions 131 and 134, for example, about $0.6\pi$ to about $0.9\pi$.

Referring to FIGS. 7A and 7B, the green light that has passed through the color separating lens array 130 may have a second green light phase profile PPG2 that is the largest at the center of the second green pixel corresponding region 134 and is reduced away from the center of the second green pixel corresponding region 134. When comparing the first green light phase profile PPG1 of FIG. 6A with the second green light phase profile PPG2 of FIG. 7A, the second green light phase profile PPG2 is obtained by moving in parallel with the first green light phase profile PPG1 by one-pixel pitch in the X direction and the Y direction. That is, the first green light phase profile PPG1 has the largest phase at the center of the first green pixel corresponding region 131, but the second green light phase profile PPG2 has the largest phase at the center of the second green pixel corresponding region 134 that is apart by one-pixel pitch from the center of the first green pixel corresponding region 131 in the X direction and the Y direction. The phase profiles in FIGS. 6B and 7C showing the phases at the centers of the pixel corresponding regions 131, 132, 133, and 134 may be the same as each other. Regarding the phase profile of the green light based on the second green pixel corresponding region 134, when the phase of the green light emitted from the center of the second green pixel corresponding region 134 is set as 2π, the light having the phase of about 0.9π to about 1.1π may be emitted from the centers of the blue and red pixel corresponding regions 132 and 133 and the light having the phase of about 1.1π to about 1.5π may be emitted from the contact point between the first green pixel corresponding region 131 and the second green pixel corresponding region 134.

Figure 7D:
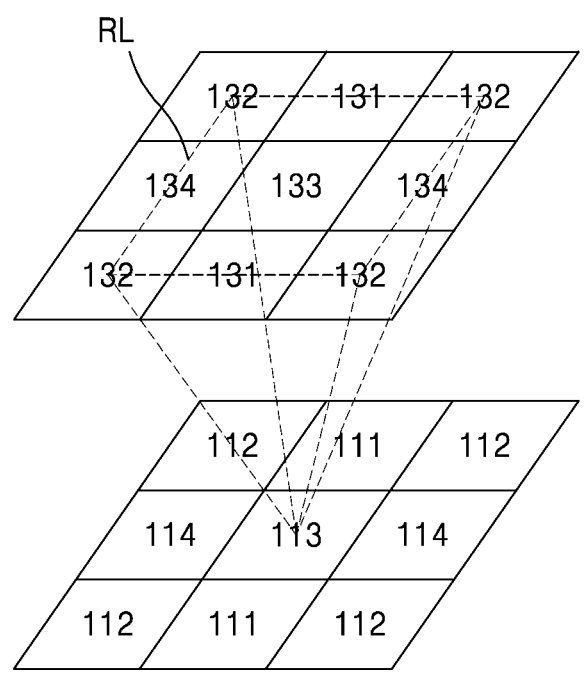
FIG. 7D is a diagram showing an example of a traveling direction of red light incident on a red light condensing region.
Figure 7E:
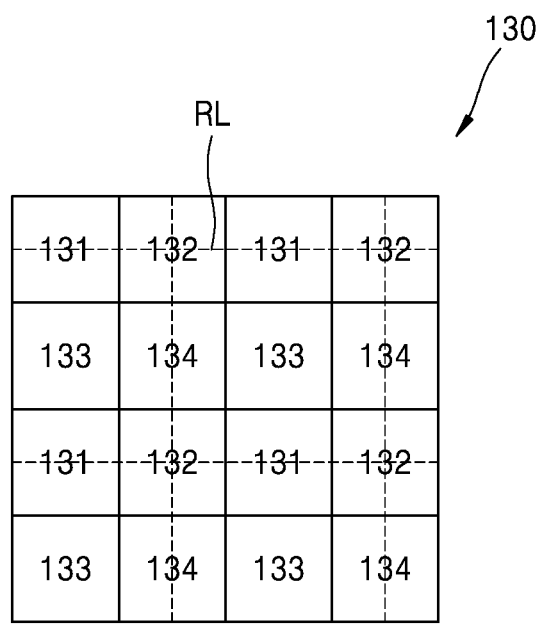
FIG. 7E is a diagram showing an example of an array of the red light condensing region.

FIG. 7D shows an example of a traveling direction of red light incident on a red light condensing region, and FIG. 7E shows an example of an array of the red light condensing region.

The red light is condensed onto the red pixel 113 by the color separating lens array 130 as shown in FIG. 7D, and the red light from the pixel corresponding regions 131, 132, 133, and 134 is incident on the red pixel 113. In the phase profile of the red light described above with reference to FIGS. 7A and 7B, the red light that has passed through a red light condensing region RL that is obtained by connecting centers of four blue pixel corresponding regions 132 adjacent to the red pixel corresponding region 133 at apexes is condensed onto the red pixel 113. Therefore, as shown in FIG. 7E, the color separating lens array 130 may operate as a red light condensing region array for condensing the red light to the red pixel. The red light condensing region RL has an area greater than that of the red pixel 113, e.g., may be 1.5 to 4 times greater. The red light condensing region RL may partially overlap the first and second green light condensing regions GL1 and GL2 and the blue light condensing region BL.

Figure 7F:
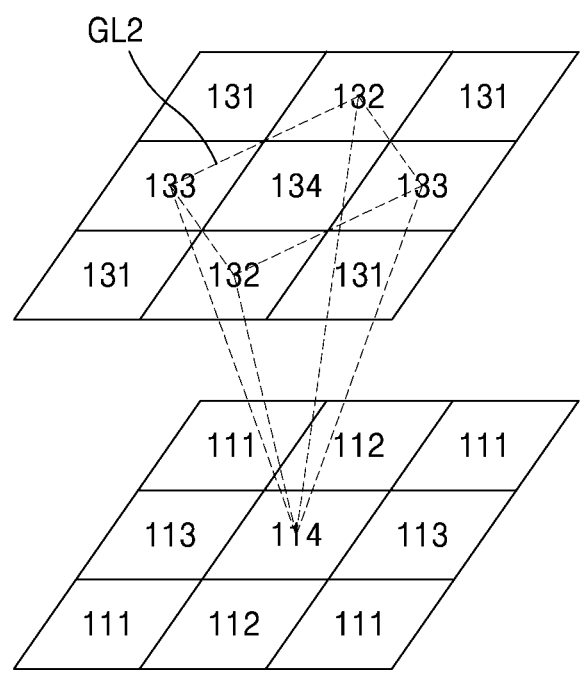
FIG. 7F is a diagram showing an example of a traveling direction of green light incident on a second green light condensing region.
Figure 7G:
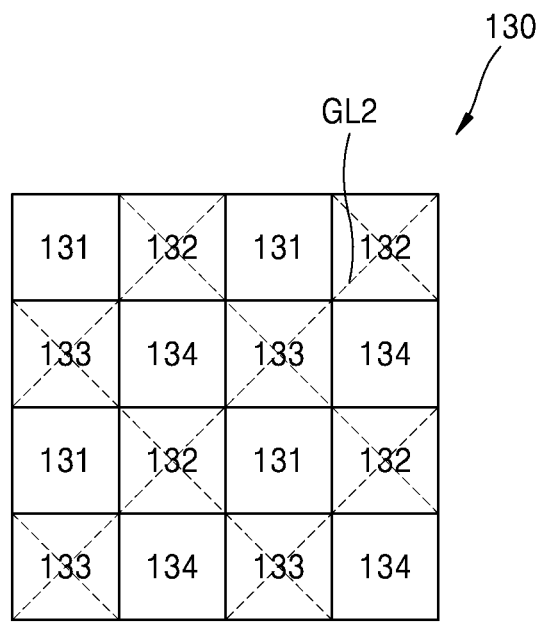
FIG. 7G is a diagram showing an example of an array of the second green light condensing region.

Referring to FIGS. 7F and 7G, the green light incident on the vicinity of the second green pixel corresponding region 134 travels similarly to the green light incident on the vicinity of the first green pixel corresponding region 131, and as shown in FIG. 7F, the green light is condensed onto the second green pixel 114. Therefore, as shown in FIG. 7G, the color separating lens array 130 may operate as a second green light condensing region array for condensing the green light onto the second green pixel 114. The second green light condensing region GL2 may have a greater area than that of the corresponding second green pixel 114, e.g., may be 1.2 times to twice greater.

The color separating lens array 130 satisfying the above phase profile and performance described above may be automatically designed through various types of computer simulations. For example, the structures of the pixel corresponding regions 131, 132, 133, and 134 may be optimized through a nature-inspired algorithm such as a genetic algorithm, a particle swarm optimization algorithm, an ant colony optimization algorithm, etc., or a reverse design based on an adjoint optimization algorithm.

The structures of the green, blue, and red pixel corresponding regions may be optimized while evaluating performances of a plurality of candidate color separating lens arrays based on evaluation factors such as color separation spectrum, optical efficiency, signal-to-noise ratio, etc. when designing the color separating lens array. For example, the structures of the green, blue, and red pixel corresponding regions may be optimized in a manner that a target numerical value of each evaluation factor is determined in advance and the sum of the differences from the target numerical values of a plurality of evaluation factors is reduced. Alternatively, the performance may be indexed for each evaluation factor, and the structures of the green, blue, and red pixel corresponding regions may be optimized so that a value representing the performance may be maximized.

The color separating lens array 130 shown in FIGS. 5B and 5C is an example, and the color separating lens arrays of various shapes may be obtained through the above-described optimized design according to the size and thickness of the color separating lens array, a color characteristic, the pixel pitch of the image sensor to which the color separating lens array is to be applied, a distance between the color separating lens array and the image sensor, an incident angle of the incident light, etc. Also, the color separating lens array may be implemented by other various patterns, instead of the nanoposts. For example, FIG. 8A is a plan view exemplarily showing a shape of a unit pattern in a color separating lens array according to another example embodiment, which may be applied to an image sensor of Bayer pattern type, and FIG. 8B is a plan view exemplarily showing a shape of a unit pattern in a color separating lens array according to another example embodiment.

Figure 8A:
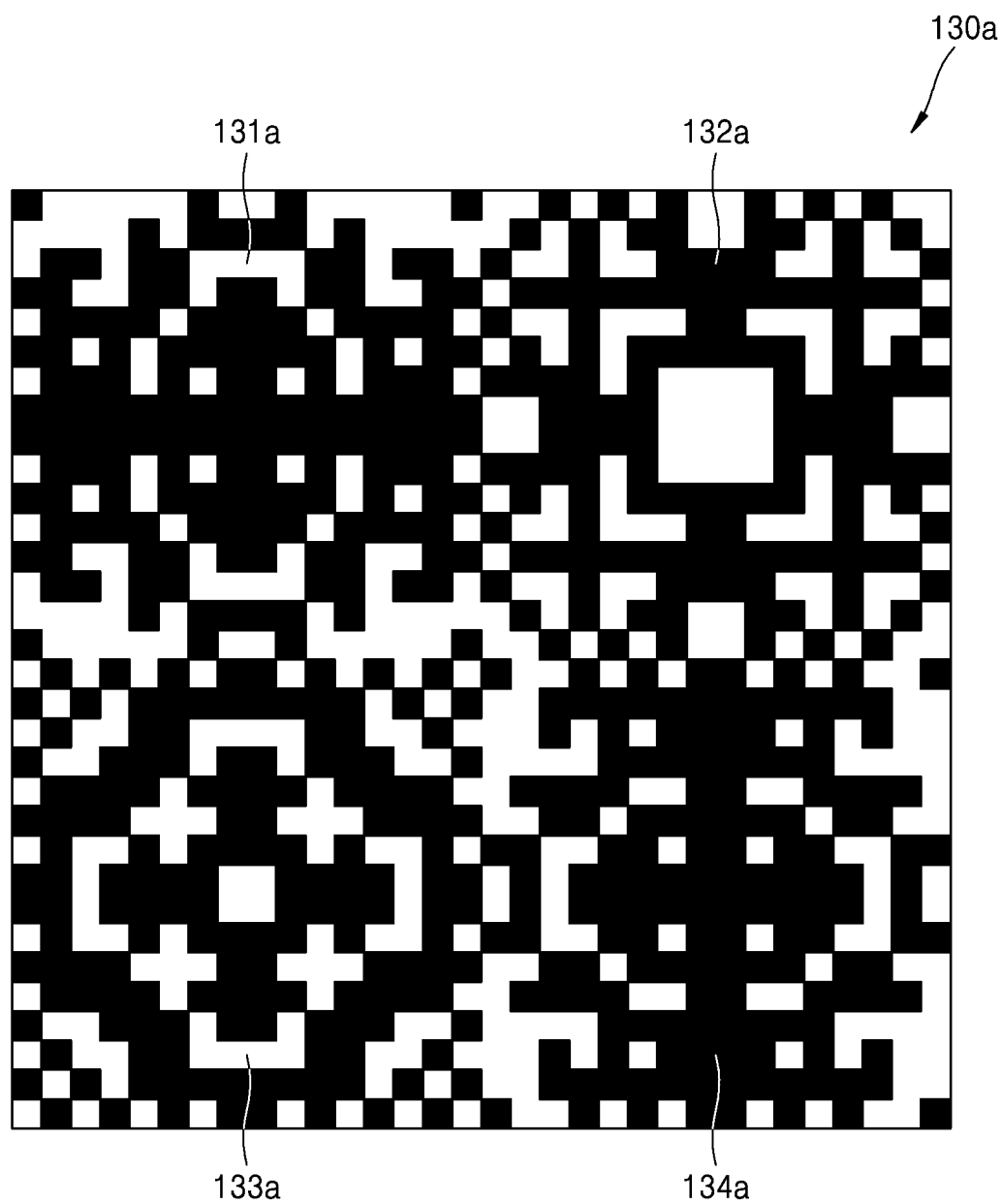
FIGS. 8A and 8B are diagrams showing another example of the color separating lens array.
Figure 8B:
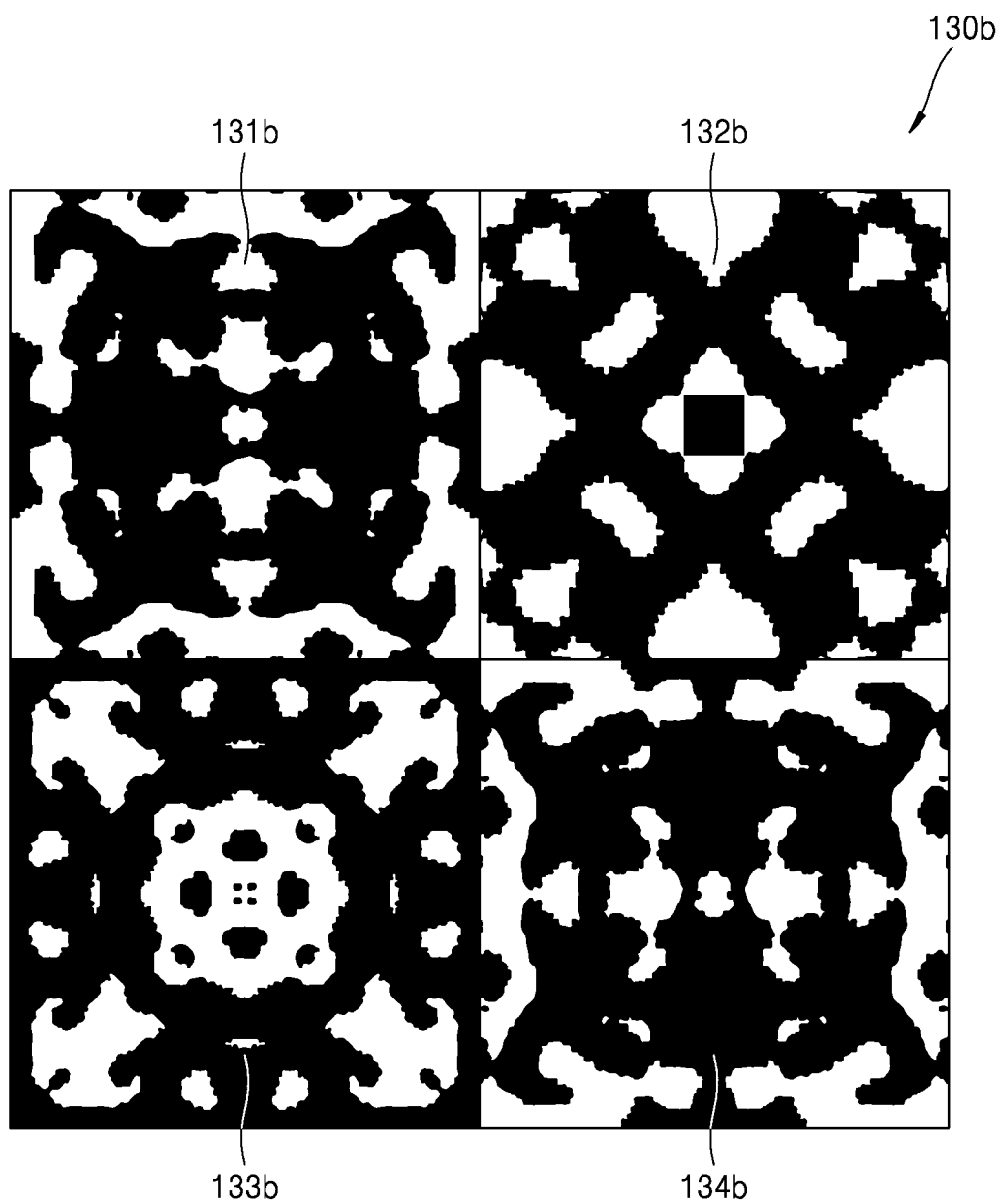

Each of pixel corresponding regions 131a, 132a, 133a, and 134a in a color separating lens array 130a shown in FIG. 8A is optimized in a digitalized binary form of 16×16 rectangular arrays, and the unit pattern of FIG. 8A has a shape of 32×32 rectangular arrays. Unlike the above example, each of pixel corresponding regions 131b, 132b, 133b, and 134b in a color separating lens array 130b shown in FIG. 8B may be optimized in a non-digitalized continuous curve shape.

Figure 9A:
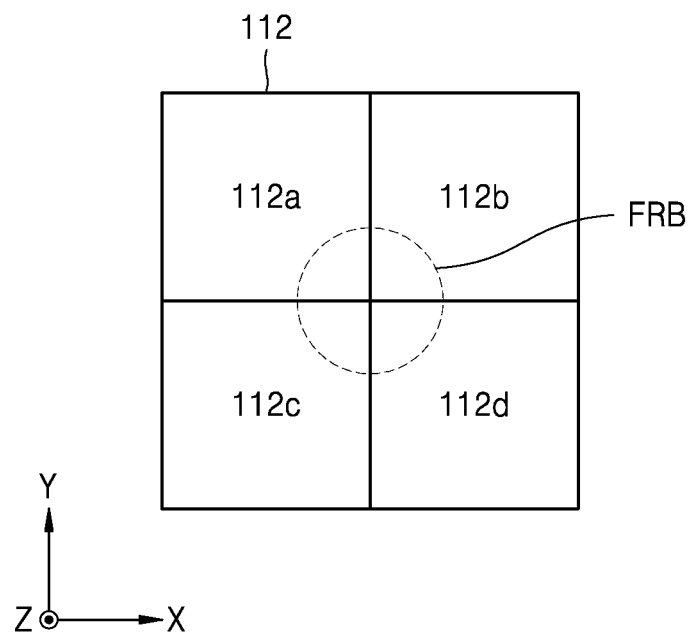
FIGS. 9A and 9B are diagrams for describing the relationship between a thickness of a spacer layer and a region where the light is condensed.
Figure 9B:
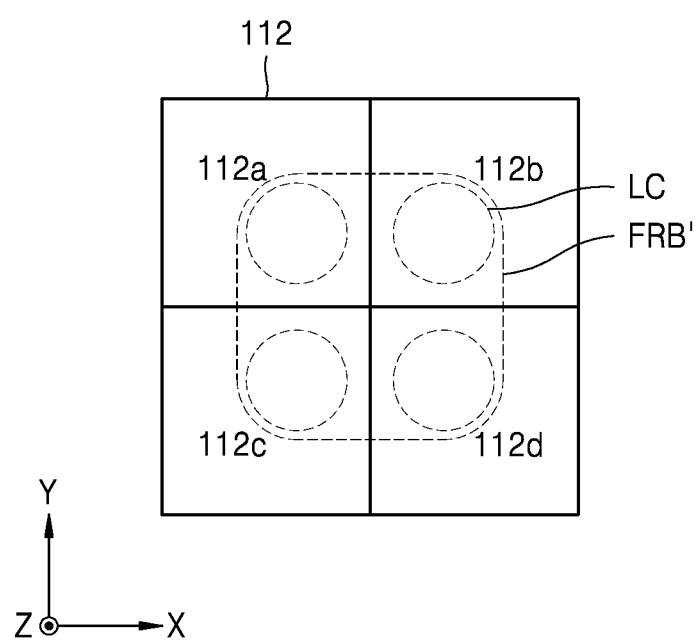

FIGS. 9A and 9B are diagrams for describing the relationship between a thickness of a spacer layer and a region where the light is condensed.

FIG. 9A is a diagram for describing a region where the blue light is condensed, when a thickness of the spacer layer is similar to a focal distance of the blue light condensing region. Referring to FIG. 9A, the blue light may be condensed onto a blue light focused region FRB that is indicated as a circle at the center of the blue pixel 112. In this case, many of photons condensed onto the blue light focused region FRB are incident on barrier walls between photosensitive cells 112a, 112b, 112c, and 112d, and photons incident on the barrier walls are reflected or scattered so as not to be sensed by the photosensitive cells. Thus, this may be a cause of degradation in an optical efficiency of a sensor substrate 110.

FIG. 9B is a diagram for describing a region where the blue light is condensed, when a thickness of the spacer layer is about ½ of a focal distance of the blue light condensing region. Referring to FIG. 9B, the blue light may be condensed on a corrected blue light focused region FRB' having an enlarged area as compared with the blue light focused region FRB of FIG. 9A. In particular, the blue light may be concentrated on light concentration portions LC that are indicated as circles at the centers of the photosensitive cells 112a, 112b, 112c, and 112d. In the corrected blue light focused region FRB', more light is incident on the center portions of the photosensitive cells 112a, 112b, 112c, and 112d as compared with the blue light focused region FRB of FIG. 9A, and less light is incident on the center of the blue pixel 112 where the barrier walls intersect each other. Thus, the light utilization efficiency may be improved.

In FIGS. 9A and 9B, an example in which the blue light is focused on the blue pixel 112 due to the blue light condensing region of the color separating lens array is described, but the same principle may apply to the green light and the red light. Therefore, when the pixels of the image sensor include a plurality of photosensitive cells that are two-dimensionally arranged, the thickness of the spacer layer 120, that is, the distance between the color separating lens array 130 and the sensor substrate 110, may be about 30% to about 70%, or about 40% to about 60% of the focal distance of the color separating lens array 130 with respect to the reference wavelength light, in order not to degrade the light utilization efficiency of the sensor substrate 110. In detail, the thickness of the spacer layer 120, that is, the distance between the color separating lens array 130 and the sensor substrate 110, may be about 110% to about 180% of the pixel pitch when the pixel pitch of the sensor substrate 110 is about 0.9 μm to about 1.3 μm, or may be about 70% to about 120% of the pixel pitch of the sensor substrate 110 when the pixel pitch of the sensor substrate 110 is about 0.5 μm to about 0.9 μm.

Figure 10A:
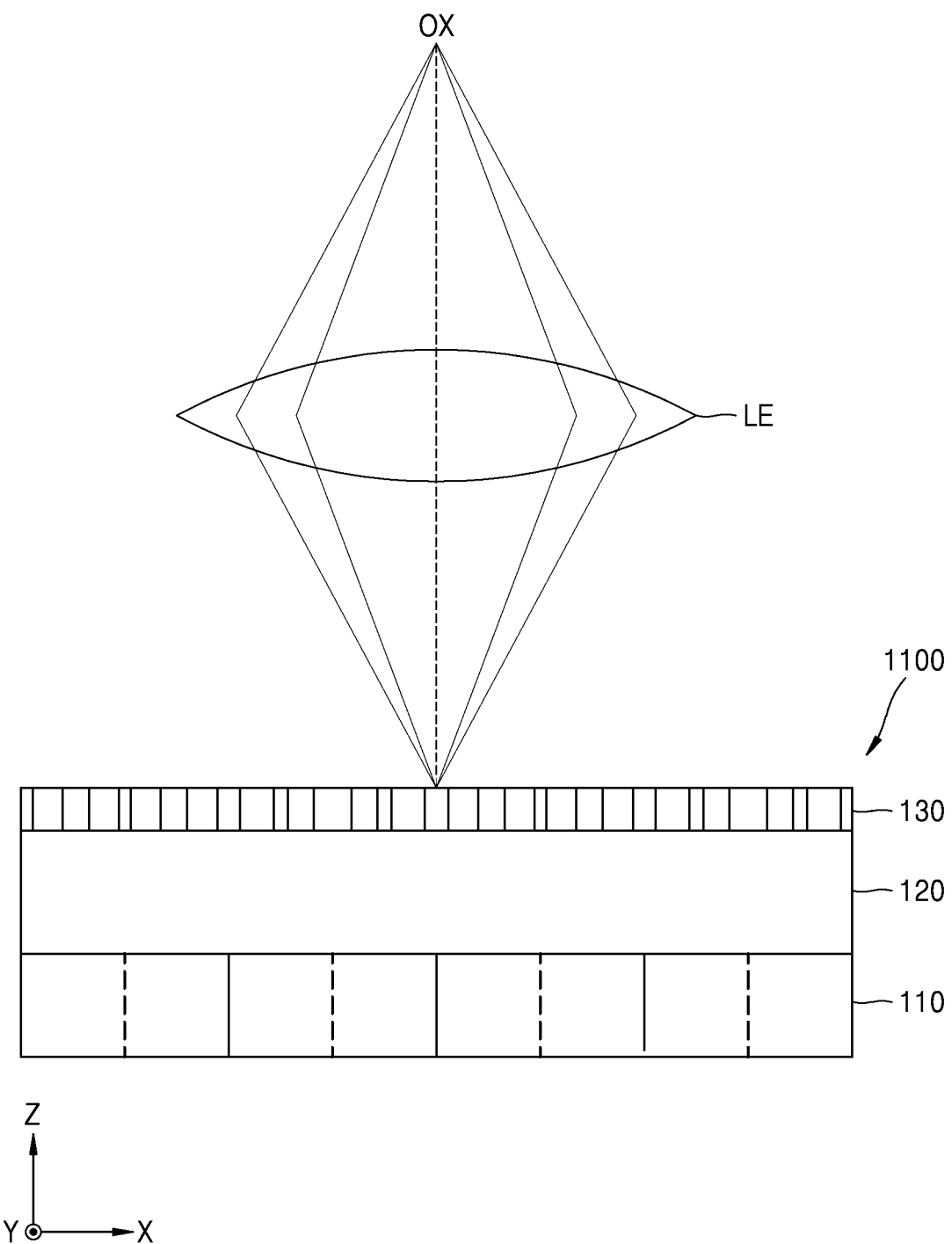
FIGS. 10A to 10O are diagrams showing examples of a distribution change of light incident on a pixel array of an image sensor, according to a change in a distance between the pixel array of the image sensor and a lens, for describing principles of an auto-focusing function.
Figure 10B:
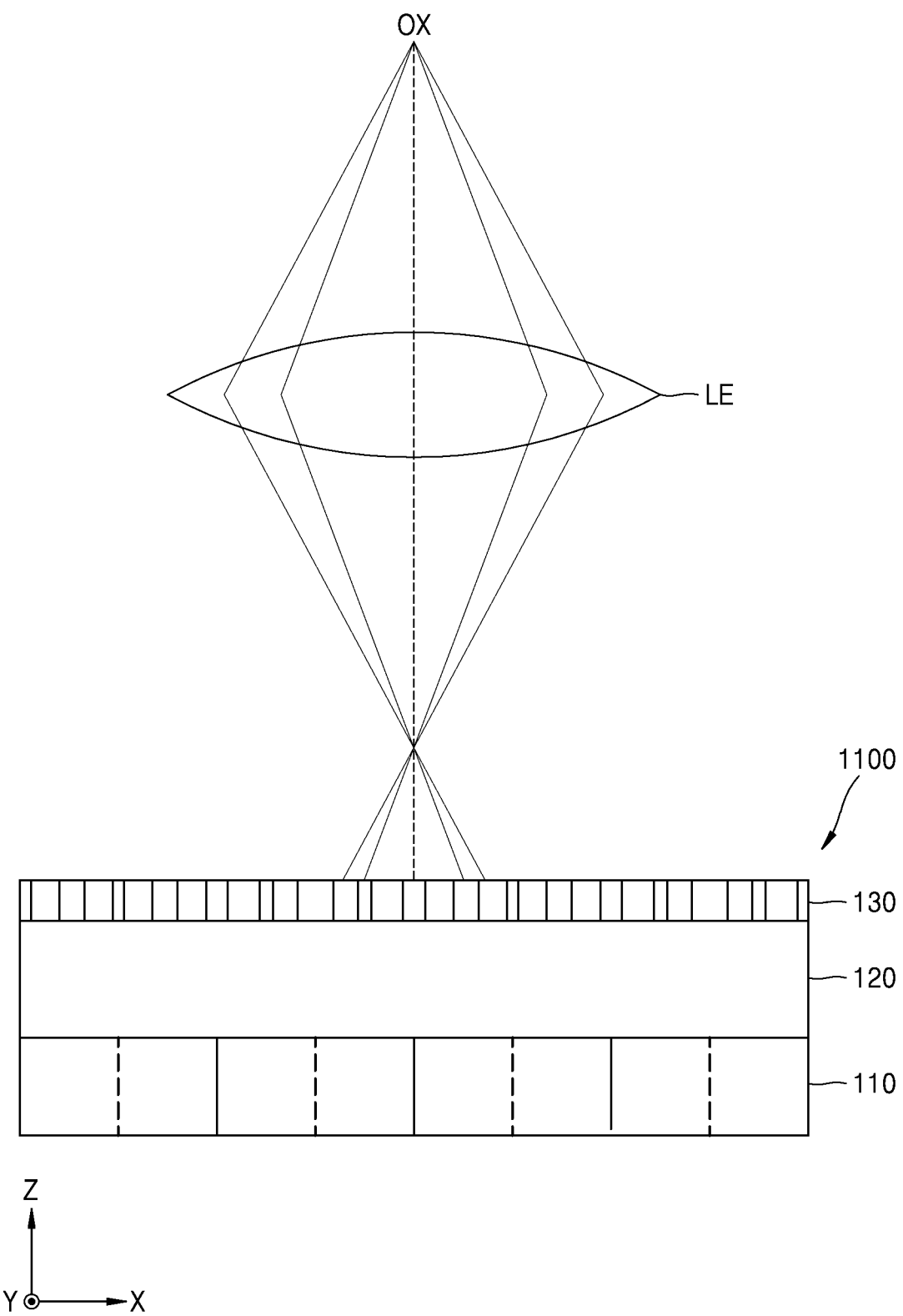
Figure 10C:
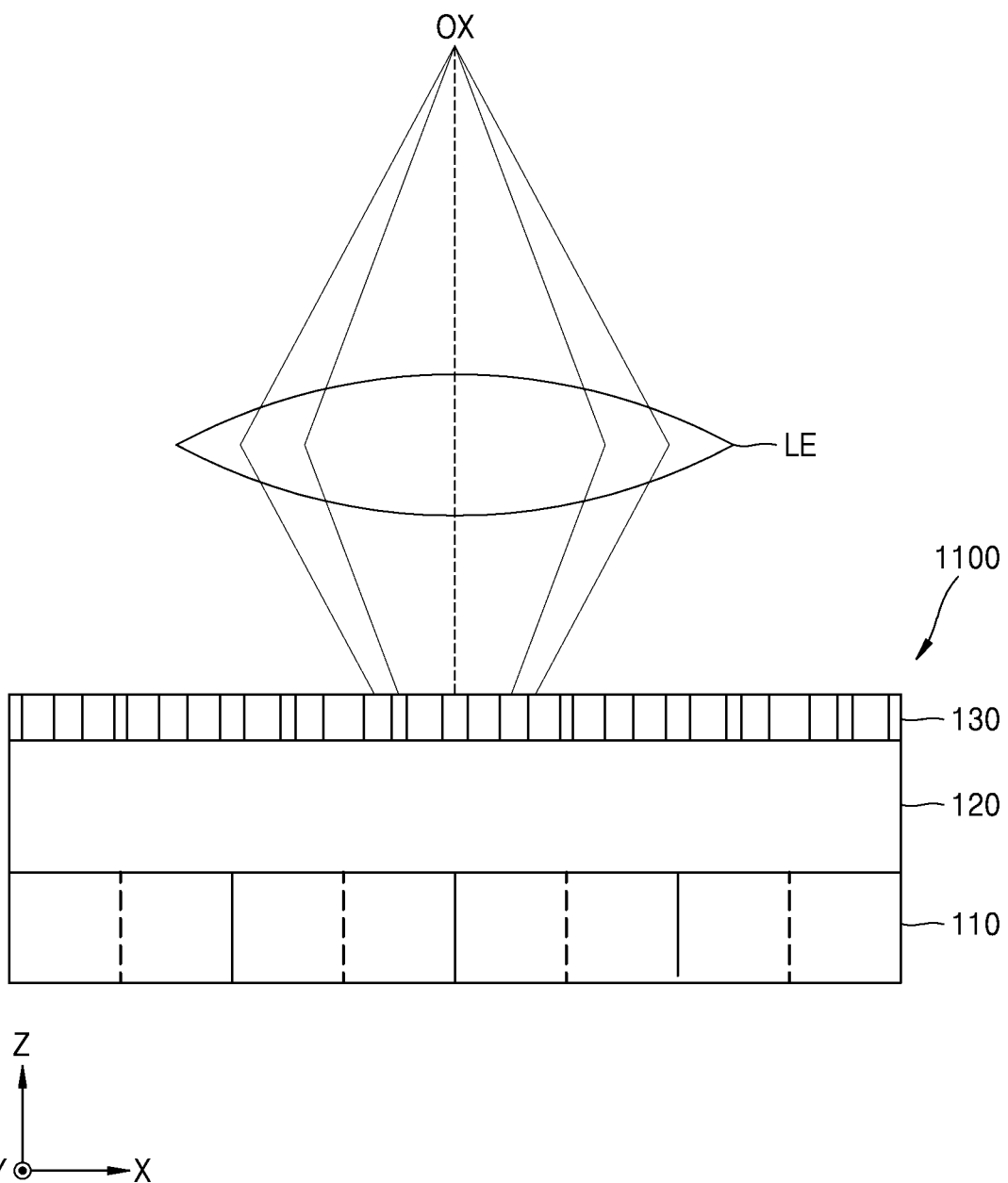

As described above, when one pixel includes the plurality of photosensitive cells, an auto-focusing function may be implemented by using the difference among the signals obtained from the respective photosensitive cells. FIGS. 10A to 10C are diagrams showing examples of a distribution change of light incident on a pixel array of an image sensor, according to a change in a distance between the pixel array of the image sensor and a lens, for describing principles of an auto-focusing function.

FIG. 10A shows a case in which a focal point of a lens LE is formed on the surface of the pixel array 1100. In this case, light beams that start from one point on an optical axis OX at an object side of the lens LE and then respectively pass through opposite edges of the lens LE are collected on one point on the surface of the pixel array 1100. Therefore, when the focal point is correctly formed, the light starting from one point and respectively passing through the opposite edges of the lens LE may be incident on each pixel in the pixel array 1100 with the same intensity.

FIG. 10B shows a case in which a focal point of a lens LE is formed on a front portion of the surface of the pixel array 1100. In this case, light beams that start from one point on the optical axis OX at the object side of the lens LE and then respectively pass through opposite edges of the lens LE are incident on different points on the surface of the pixel array 1100 after passing through a focal point while intersecting each other. For example, the light that has passed through a left edge of the lens LE is obliquely incident on one point on the surface of the pixel array 1100, which is at a right side of the optical axis OX, after passing the focal point, and the light that has passed through a right edge of the lens LE is obliquely incident on one point on the surface of the pixel array 1100, which is at a left side of the optical axis OX, after passing the focal point.

FIG. 10C shows a case in which a focal point of a lens LE is formed behind the surface of the pixel array 1100. In this case, light beams that start from one point on the optical axis OX at the object side of the lens LE and then respectively pass through opposite edges of the lens LE are incident on different points on the surface of the pixel array 1100 before reaching the focal point. For example, the light that has passed through a left edge of the lens LE is obliquely incident on one point on the surface of the pixel array 1100, which is at a left side of the optical axis OX, before reaching the focal point, and the light that has passed through a right edge of the lens LE is obliquely incident on one point on the surface of the pixel array 1100, which is at a right side of the optical axis OX, before reaching the focal point.

Therefore, when the focal point is not correctly formed, the light starting from one point and passing through opposite edges of the lens LE is incident on different pixels of the pixel array 1100, as shown in FIGS. 10B and 10C. Then, in the light starting from one point, only the light that has passed through one edge of the lens LE is obliquely incident on each pixel.

Figure 11:
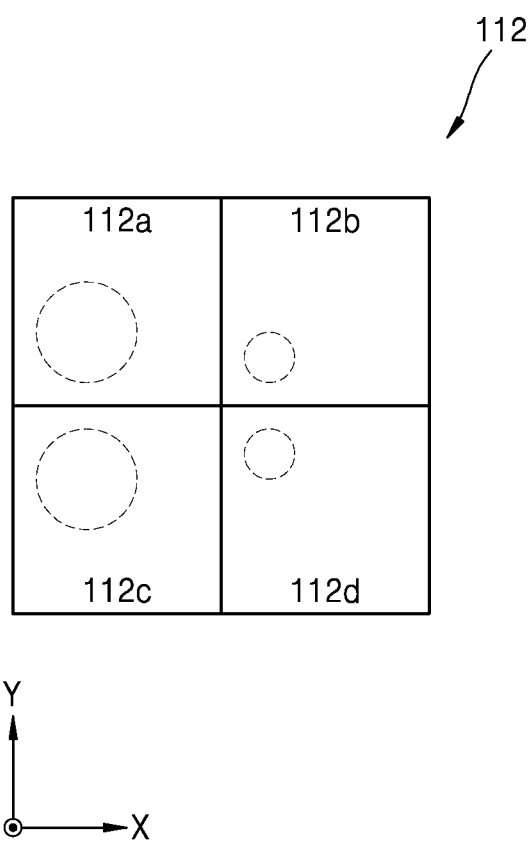
FIG. 11 is a diagram showing an example of light distribution formed on a sensor substrate when light is obliquely incident on the pixel array of the image sensor.

FIG. 11 is a diagram showing an example of light distribution formed on a sensor substrate when light is obliquely incident on the pixel array of the image sensor. Referring to FIG. 11, when the blue light that is obliquely incident on the blue light condensing region of the color separating lens array 130 is focused on the blue pixel 112, four light concentration portions are unevenly formed in photosensitive cells 112a, 112b, 112c, and 112d of the blue pixel 112. As compared with FIG. 9B, the four light concentration portions are shifted toward the left side, and areas or intensities of the light concentration portions formed in left photosensitive cells 112a and 112c are greater than those of the light concentration portions formed in right photosensitive cells 112b and 112d. The shifting direction of the light concentration portion and the size of the light concentration portion may vary depending on a distance between the pixel array 1100 and the focusing point, and a relative position of the pixel on the pixel array 1100. FIG. 11 only shows the blue light as an example, but the green light and the red light may have the same light distribution as that of FIG. 11.

Figure 12:
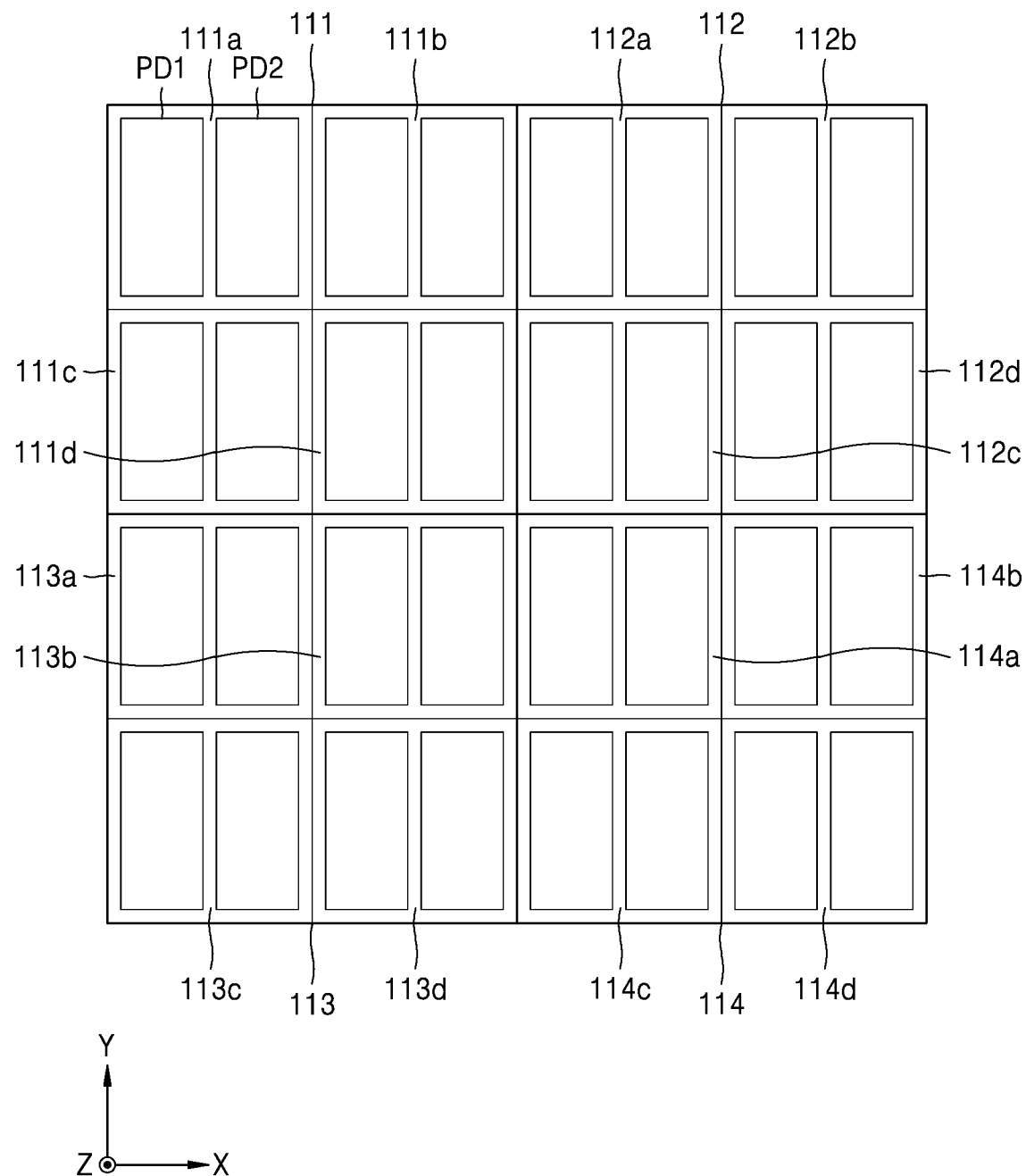
FIG. 12 is a plan view showing an exemplary structure of a pixel array of an image sensor according to an embodiment, for providing an auto-focusing signal in a phase-detection auto-focusing method.

As described above, because one pixel includes a plurality of photosensitive cells independently sensing the light, an auto-focusing signal may be provided in a phase-detection auto-focusing type by using the difference among the signals output from the plurality of photosensitive cells. FIG. 12 is a plan view showing an exemplary structure of a pixel array of an image sensor according to an embodiment, for providing an auto-focusing signal in a phase-detection auto-focusing method.

Referring to FIG. 12, each of the photosensitive cells in the pixels may include a first photodiode PD1 and a second photodiode PD2 arranged in the X direction. The first photodiode PD1 and the second photodiode PD2 in one photosensitive cell may output photosensitive signals independently from each other. In other words, each of the pixels includes the plurality of independent photosensitive cells, and each of the photosensitive cells may include two independent photodiodes PD1 and PD2. A general image signal of each photosensitive cell may be obtained by summing the photosensitive signals of the first photodiode PD1 and the second photodiode PD2.

In the above pixel structure, one pixel may be partitioned as opposite edge regions that are spaced apart from each other in the X direction, and an intermediate region between the opposite edge regions. In order to obtain a high contrast ratio, the auto-focusing signal may be obtained from a difference between the photosensitive signals output from two photodiodes that are provided in the opposite edge regions that are farthest from each other in the X direction in one pixel. For example, in the blue pixel 112, the first photodiode PD1 in the first blue photosensitive cell 112a that is provided at the left edge region and the second photodiode PD2 of the second blue photosensitive cell 112b that is provided at the right edge region are farthest from each other in the X direction in the blue pixel 112. Also, in the blue pixel 112, the first photodiode PD1 of the third blue photosensitive cell 112c and the second photodiode PD2 of the fourth blue photosensitive cell 112d are farthest from each other in the X direction.

Therefore, the auto-focusing signal may be obtained from a difference between the photosensitive signal output from the first photodiode PD1 of the first blue photosensitive cell 112a and the photosensitive signal output from the second photodiode PD2 of the second blue photosensitive cell 112b, in the blue pixel 112. Alternatively, the auto-focusing signal may be obtained from a difference between the photosensitive signal output from the first photodiode PD1 of the third blue photosensitive cell 112c and the photosensitive signal output from the second photodiode PD2 of the fourth blue photosensitive cell 112d. Alternatively, the auto-focusing signal may be obtained from a difference between a sum of the photosensitive signals output from the first photodiode PD1 of the first blue photosensitive cell 112a and the first photodiode PD1 of the third blue photosensitive cell 112c and a sum of the photosensitive signals output from the second photodiode PD2 of the second blue photosensitive cell 112b and the second photodiode PD2 of the fourth blue photosensitive cell 112d.

The auto-focusing signal may be obtained in the first green pixel 111, the red pixel 113, and the second green pixel 114 in the same manner, as well as the blue pixel 112. The auto-focusing signal may be obtained throughout all the pixels in the image sensor, or may be obtained through some selected pixels in the image sensor.

In one pixel, two photodiodes may be provided in the intermediate region between the left edge region and the right edge region. For example, in the blue pixel 112, the second photodiode PD2 of the first blue photosensitive cell 112a, the first photodiode PD1 of the second blue photosensitive cell 112b, the second photodiode PD2 of the third blue photosensitive cell 112c, and the first photodiode PD1 of the fourth blue photosensitive cell 112d may be arranged in the intermediate region of the blue pixel 112. Therefore, the left edge region and the right edge region used to obtain the auto-focusing signal may be sufficiently apart from each other. For example, the distance between the left edge region and the right edge region in the X direction, that is, a width of the intermediate region in the X direction, may be two times or more greater than a width of each of the left and right edge regions in the X direction.

Each of the photodiodes provided in the intermediate region of the pixel may output the photosensitive signal with respect to the light incident on the intermediate region of the pixel. The photosensitive signals with respect to the light incident on the intermediate region of the pixel may be used to generated a general image signal. For example, in the blue pixel 112, the image signal with respect to the light incident on the first blue photosensitive cell 112a may be obtained from the sum of the photosensitive signals respectively output from the two photodiodes PD1 and PD2 in the first blue photosensitive cell 112a. Therefore, the photodiodes arranged in the opposite edge regions of the pixel may be used to obtain the auto-focusing signal and the general image signal, and the photodiodes arranged in the intermediate region of the pixel may not be used to obtain the auto-focusing signal and may be only used to obtain the general image signal.

Figure 13:
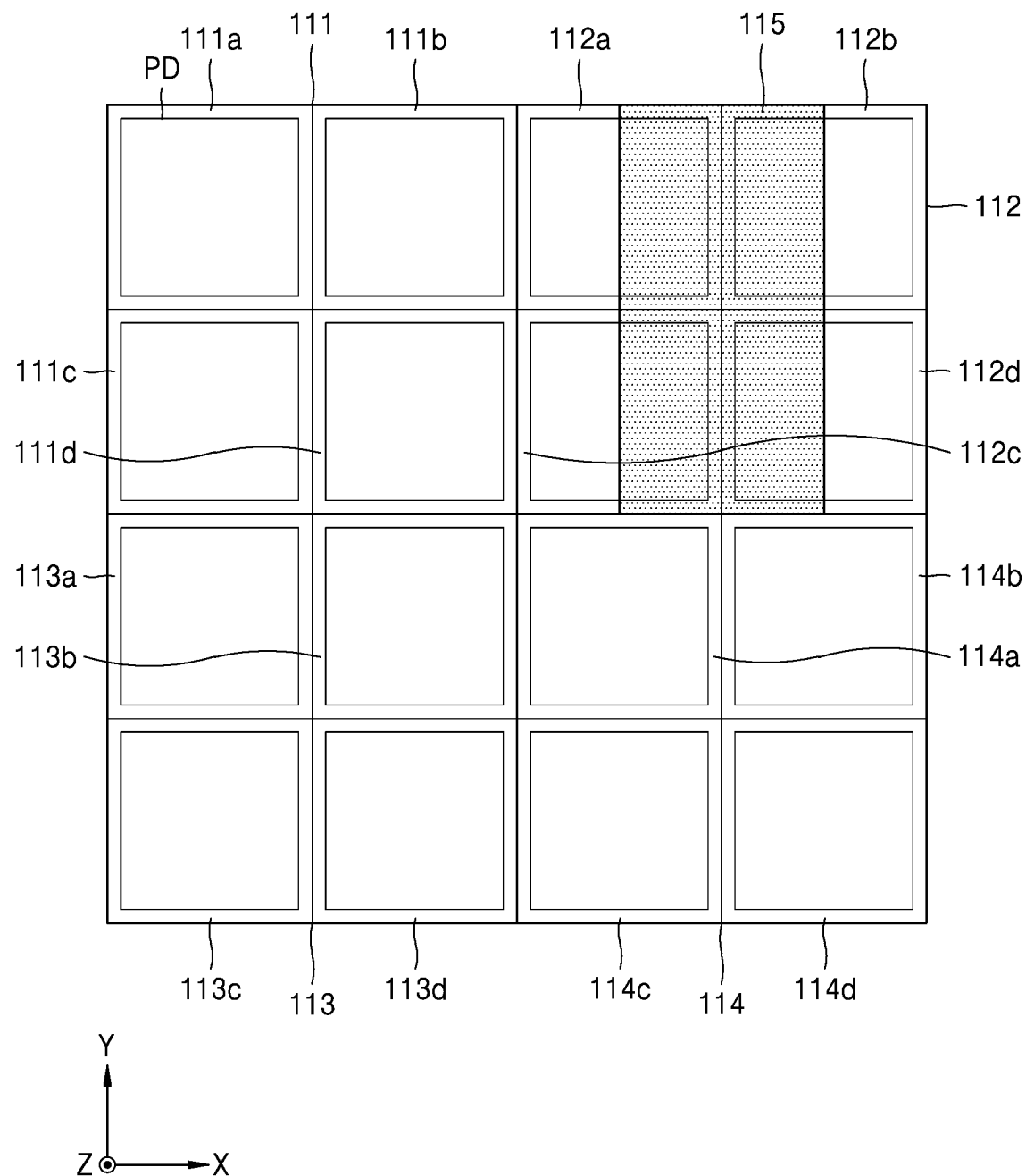
FIG. 13 is a plan view showing an exemplary structure of a pixel array of an image sensor according to another embodiment, for providing an auto-focusing signal in a phase-detection auto-focusing method.

FIG. 13 is a plan view showing an exemplary structure of a pixel array of an image sensor according to another example embodiment, for providing an auto-focusing signal in a phase-detection auto-focusing method. Referring to FIG. 13, each of the photosensitive cells in the pixels may include only one photodiode PD. When only one photodiode PD is provided in each photosensitive cell, in order to improve the contrast ratio of the auto-focusing signal by sensing the shift of the light concentration portion in the photosensitive cell, a mask pattern 115 that shields the light may cover a part of each photosensitive cell. In particular, when one pixel is partitioned as the opposite edge regions spaced apart from each other in the X direction and the intermediate region between the opposite edge regions, as shown in FIG. 13, the mask pattern 115 may be arranged in the intermediate region between the left and right edge regions in the pixel.

For example, in the blue pixel 112, the mask pattern 115 may be arranged so as to cover a region other than a region corresponding to the left edge region in light-receiving surfaces of the photodiodes PD of the first and third blue photosensitive cells 112a and 112c, and to cover a region other than a region corresponding to the right edge region in light-receiving surfaces of the photodiodes PD in the second and fourth photosensitive cells 112b and 112d. Then, the photosensitive signals output from the first and third blue photosensitive cells 112a and 112c are generated by the light incident on the left edge region of the blue pixel 112, and the photosensitive signals output from the second and fourth blue photosensitive cells 112b and 112d are generated by the light incident on the right edge region of the blue pixel 112. Therefore, the auto-focusing signal having high contrast ratio may be obtained from the difference between the photosensitive signals of the first and third blue photosensitive cells 112a and 112c and the photosensitive signals of the second and fourth blue photosensitive cells 112b and 112d.

In the embodiment shown in FIG. 13, the light is blocked by the mask pattern 115, and thus, the blue pixel 112 does not output the photosensitive signal with respect to the light incident on the intermediate region between the left and right edge regions. As such, the light utilization efficiency may degrade when the general image signal is generated. Therefore, the mask pattern 115 may be provided only in some of the pixels in the image sensor. For example, the mask pattern 115 may be arranged in the pixels of about 1% to about 10%, or about 2% to about 5%, of the total pixels in the image sensor. The pixels including the mask patterns 115 may be evenly distributed in the entire area of the image sensor. The pixels that do not include the mask patterns 115 are used to obtain the general image signal, and the pixels including the mask patterns 115 may be used to obtain both the general image signal and the auto-focusing signal.

Figure 14A:
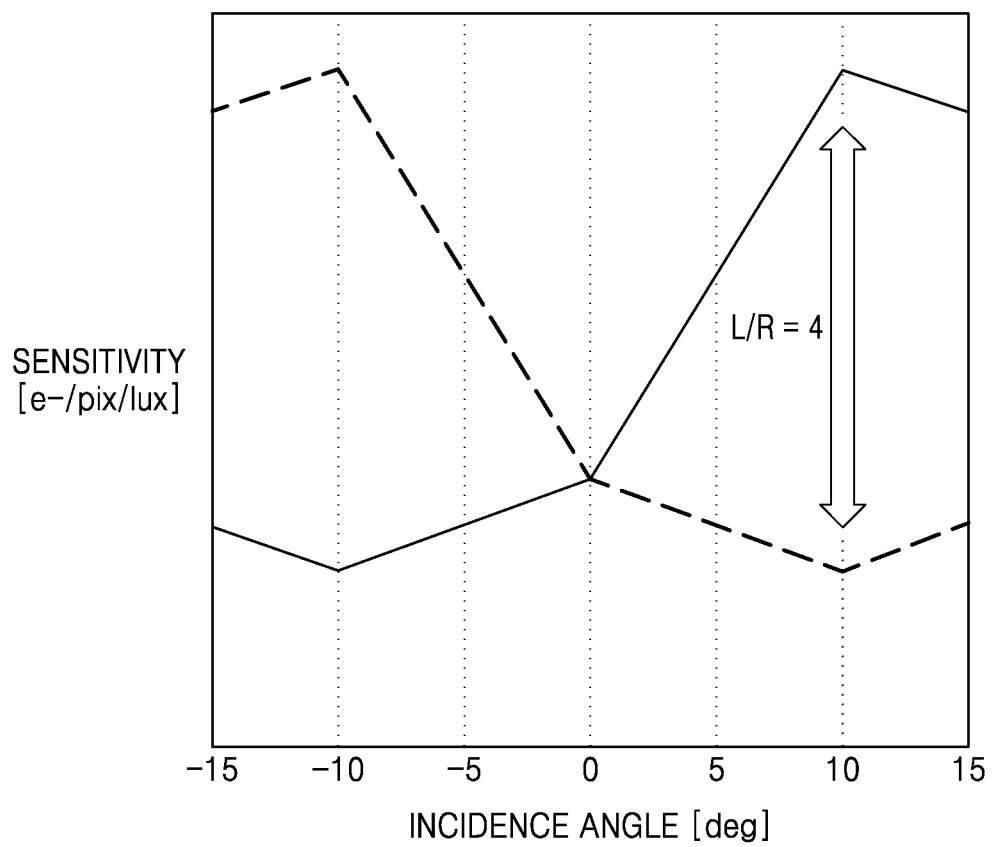
FIGS. 14A to 14C are graphs showing a contrast ratio of an output signal according to a change in an incident angle in an embodiment and a comparative example.
Figure 14B:
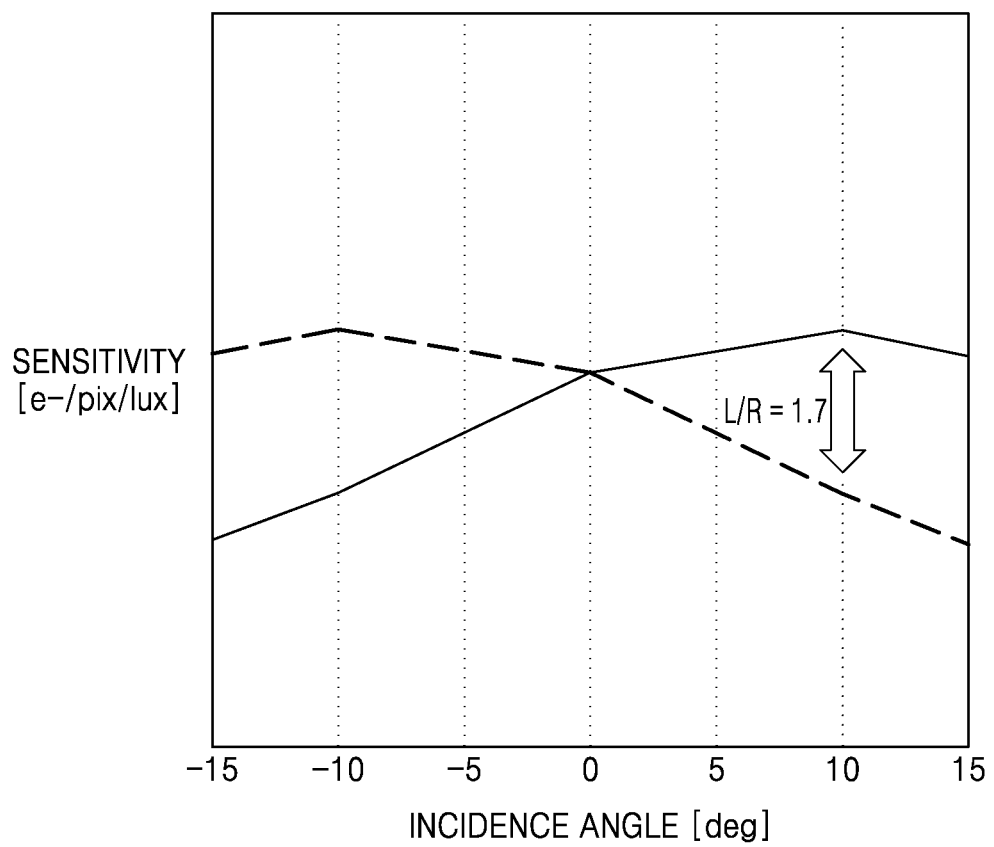
Figure 14C:
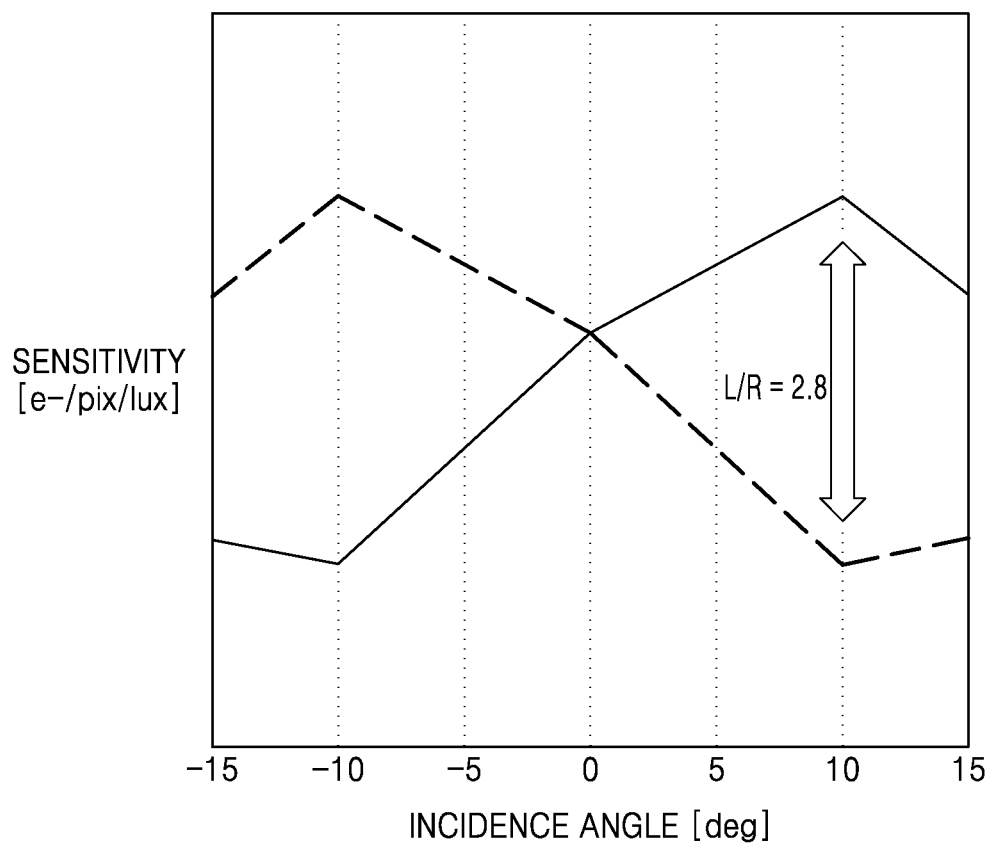

FIGS. 14A to 14C are graphs showing a contrast ratio of an output signal according to a change in an incident angle in an embodiment and a comparative example. FIG. 14A shows the contrast ratio of the output signals from the left and right edge regions in one pixel according to the example embodiments shown in FIGS. 12 and 13, FIG. 14B shows a contrast ratio of the output signals from the two photodiodes arranged adjacent to each other in the X direction in one photosensitive cell, and FIG. 14C shows a contrast ratio of the output signals from the left and right photosensitive cells each having one photodiode. Referring to FIGS. 14A to 14C, it may be appreciated that the difference between two output signals is the largest in the example embodiment, in which the photosensitive signals are output from the left and right edge regions in one pixel. Therefore, according to the example embodiment, the auto-focusing signal having the high contrast ratio may be provided and the auto-focusing performance of the image sensor may be improved.

In FIGS. 12 and 13, one pixel includes four photosensitive cells arranged in a 2×2 array, but the disclosure is not limited thereto. For example, according to another example embodiment, one pixel may include 9 photosensitive cells arranged 3×3, 16 photosensitive cells arranged 4×4, or more photosensitive cells.

Figure 15:
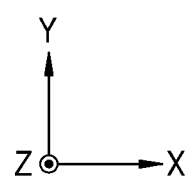
FIGS. 15 to 21 are plan views showing an exemplary structure of a pixel array of an image sensor according to another embodiments, for providing an auto-focusing signal in a phase-detection auto-focusing method.

FIG. 15 is a plan view showing an exemplary structure of a pixel array of an image sensor according to another example embodiment, for providing an auto-focusing signal in a phase-detection auto-focusing method. Referring to FIG. 15, one pixel may include 9 photosensitive cells in 3×3 array. In other words, three photosensitive cells are sequentially provided in the X direction and three photosensitive cells are sequentially provided in the Y direction. Each of the plurality of photosensitive cells may include only one photodiode.

In the example embodiment shown in FIG. 15, the image sensor may obtain the auto-focusing signal from a difference between photosensitive signals from a plurality of photosensitive cells L1, L2, and L3 arranged at the left edge region in X direction and photosensitive signals from a plurality of photosensitive cells R1, R2, and R3 arranged at the right edge region. A plurality of photosensitive cells arranged in the intermediate region between and left and right edge regions may be used to generate the general image signal. In the example embodiment shown in FIG. 15, the distance between the left edge region and the right edge region in the X direction, that is, a width of the intermediate region in the X direction, may be equal to or greater than a width of each of the left and right edge regions in the X direction.

Figure 16:
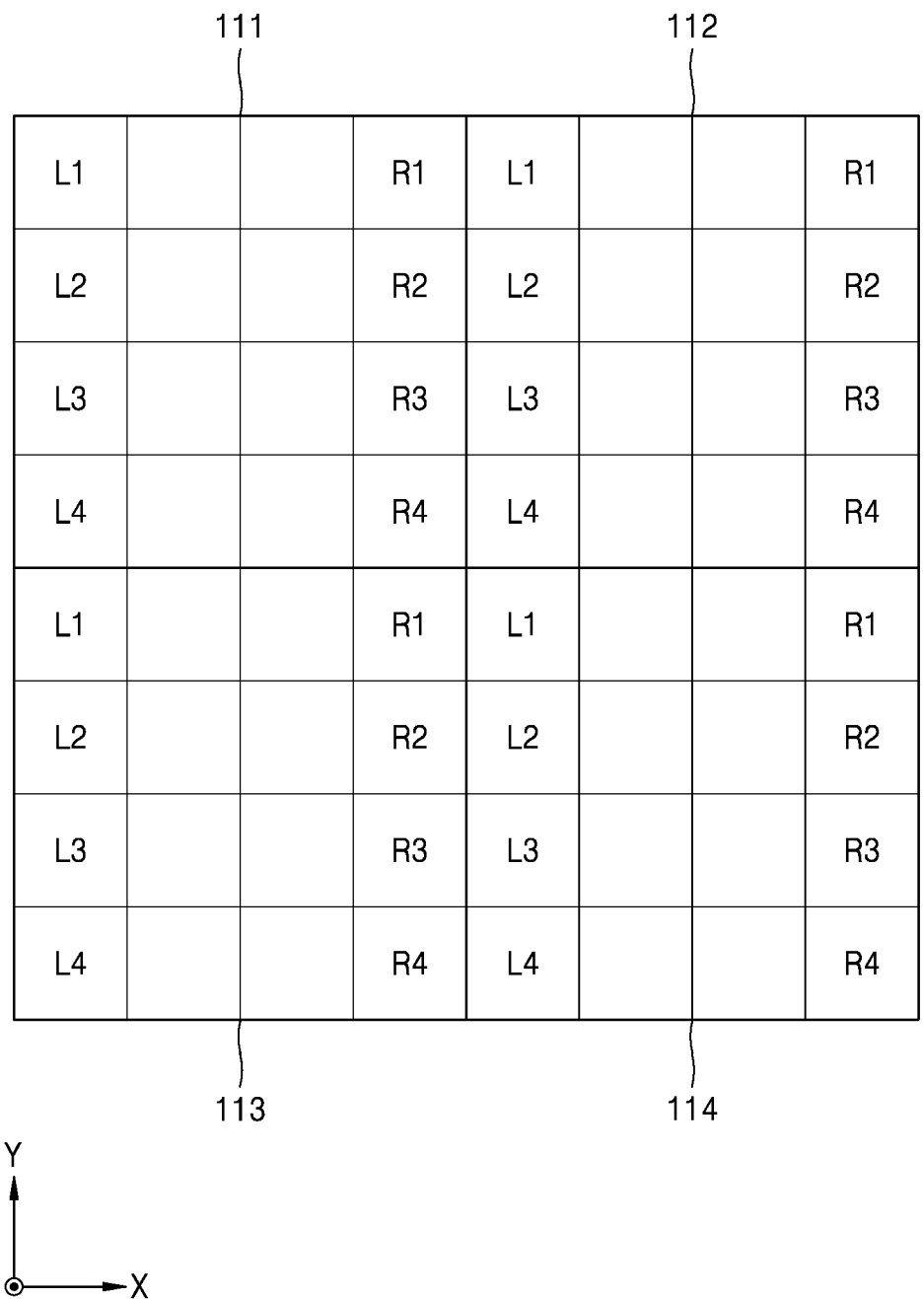

FIG. 16 is a plan view showing an exemplary structure of a pixel array of an image sensor according to example another embodiment, for providing an auto-focusing signal in a phase-detection auto-focusing method. Referring to FIG. 16, one pixel may include 16 photosensitive cells in 4×4 array. Each of the plurality of photosensitive cells may include only one photodiode. In this case, the image sensor may obtain the auto-focusing signal from a difference between photosensitive signals from a plurality of photosensitive cells L1, L2, L3, and L4 at the left edge region in X direction and photosensitive signals from a plurality of photosensitive cells R1, R2, R3, and R4 arranged at the right edge region. In the embodiment shown in FIG. 15, the distance between the left edge region and the right edge region in the X direction, that is, a width of the intermediate region in the X direction, may be two times or more greater than a width of each of the left and right edge regions in the X direction.

Figure 17:
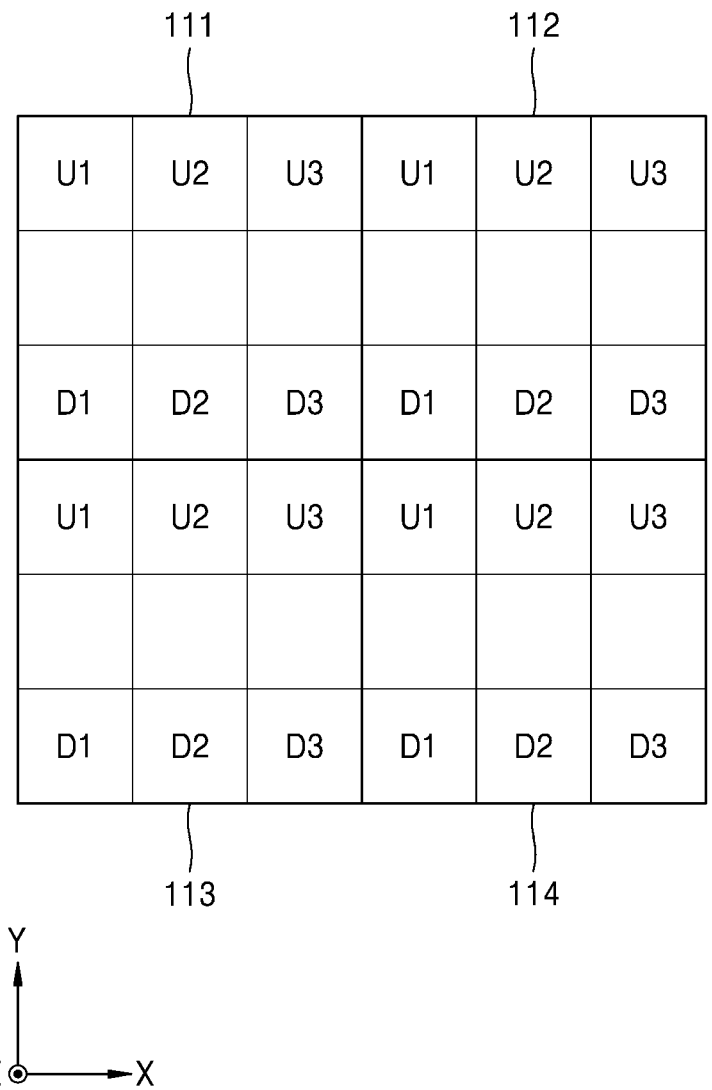
Figure 18:
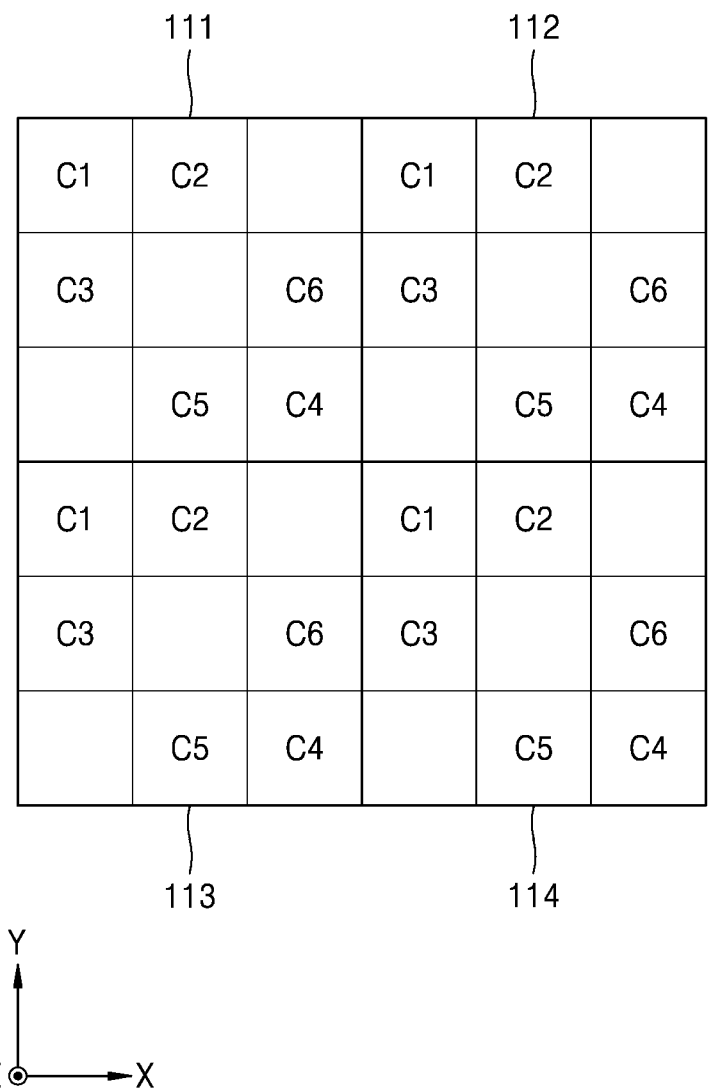

FIGS. 17 and 18 are plan views showing an exemplary structure of a pixel array of an image sensor according to another example embodiments, for providing an auto-focusing signal in a phase-detection auto-focusing method. It has been described that the auto-focusing signal is obtained from the pair of photosensitive cells or the pair of photodiodes arranged at the opposite edges in the X direction, but there may be the pair of photosensitive cells or the pair of photodiodes from which the auto-focusing signal is easy to be obtained according to relative position or a shape of an object in the image sensor.

For example, as shown in FIG. 17, the image sensor may obtain the auto-focusing signal from a difference between photosensitive signals from a plurality of photosensitive cells D1, D2, and D3 arranged on a lower edge region in the Y direction that is perpendicular to the X direction and photosensitive signals from a plurality of photosensitive cells U1, U2, and U3 arranged at an upper edge region in one pixel.

Also, as shown in FIG. 18, the auto-focusing signal may be obtained by using photosensitive signals from the light incident on opposite apex regions in the diagonal direction of one pixel. Each of the pixels may include a plurality of photosensitive cells C1, C2, C3, C4, C5, and C6 arranged at opposite apex regions in a first diagonal direction in the +Y direction and −X direction and a plurality of photosensitive cells arranged in a second diagonal direction in the +Y direction and +X direction. In a first apex region, a first photosensitive cell C1 at a first apex of the pixel, a second photosensitive cell C2 adjacent to the first photosensitive cell C1 in the X direction, and a third photosensitive cell C3 adjacent to the first photosensitive cell C1 in the Y direction may be arranged. In a second apex region, a fourth photosensitive cell C4 at a second apex that is opposite to the first apex of the pixel, a fifth photosensitive cell C5 adjacent to the fourth photosensitive cell C4 in the X direction, and a sixth photosensitive cell C6 adjacent to the fourth photosensitive cell C4 in the Y direction may be arranged. The image sensor may obtain the auto-focusing signal from a difference between the photosensitive signals output from the first to third photosensitive cells C1, C2, and C3 and the photosensitive signals output from the fourth to sixth photosensitive cells C4, C5, and C6 in each pixel. FIG. 18 shows that the auto-focusing signal is obtained from the opposite apex regions in the first diagonal direction in the +Y direction and −X direction, but the auto-focusing signal may be obtained from opposite apex regions in the second diagonal direction that is in the +Y direction and +X direction.

Figure 19:
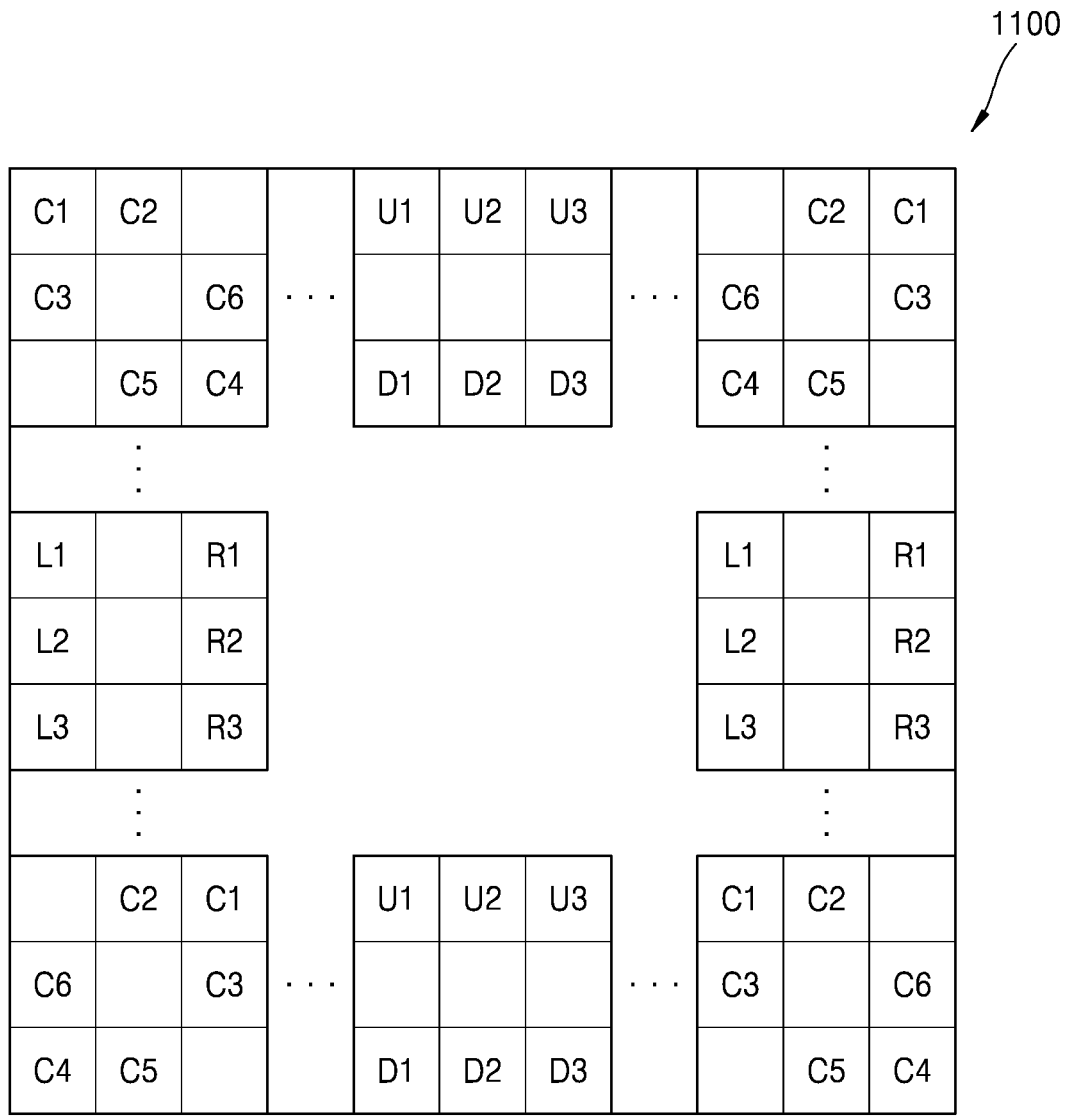

FIG. 19 is a plan view showing an exemplary structure of a pixel array of an image sensor according to another example embodiment, for providing an auto-focusing signal in a phase-detection auto-focusing method. Referring to FIG. 19, the image sensor may include all the pixels shown in FIGS. 15, 17, and 18. For example, the image sensor may include a first group including the pixels shown in FIG. 15, a second group including the pixels shown in FIG. 17, and a third group including the pixels shown in FIG. 18. The pixels included in the first group may be arranged in opposite regions in the X direction in the image sensor. The pixels included in the second group may be arranged in upper and lower regions in the Y direction in the image sensor. Also, the pixels included in the third group may be arranged in regions along the two diagonal directions. In particular, the pixels arranged in the first diagonal direction in the +Y direction and −X direction of the image sensor are configured to obtain the auto-focusing signal from the opposite apex regions in the first diagonal direction, and the pixels arranged in the second diagonal direction in the +Y direction and the +X direction of the image sensor may be configured to obtain the auto-focusing signal from the opposite apex regions in the second diagonal direction.

Figure 20:
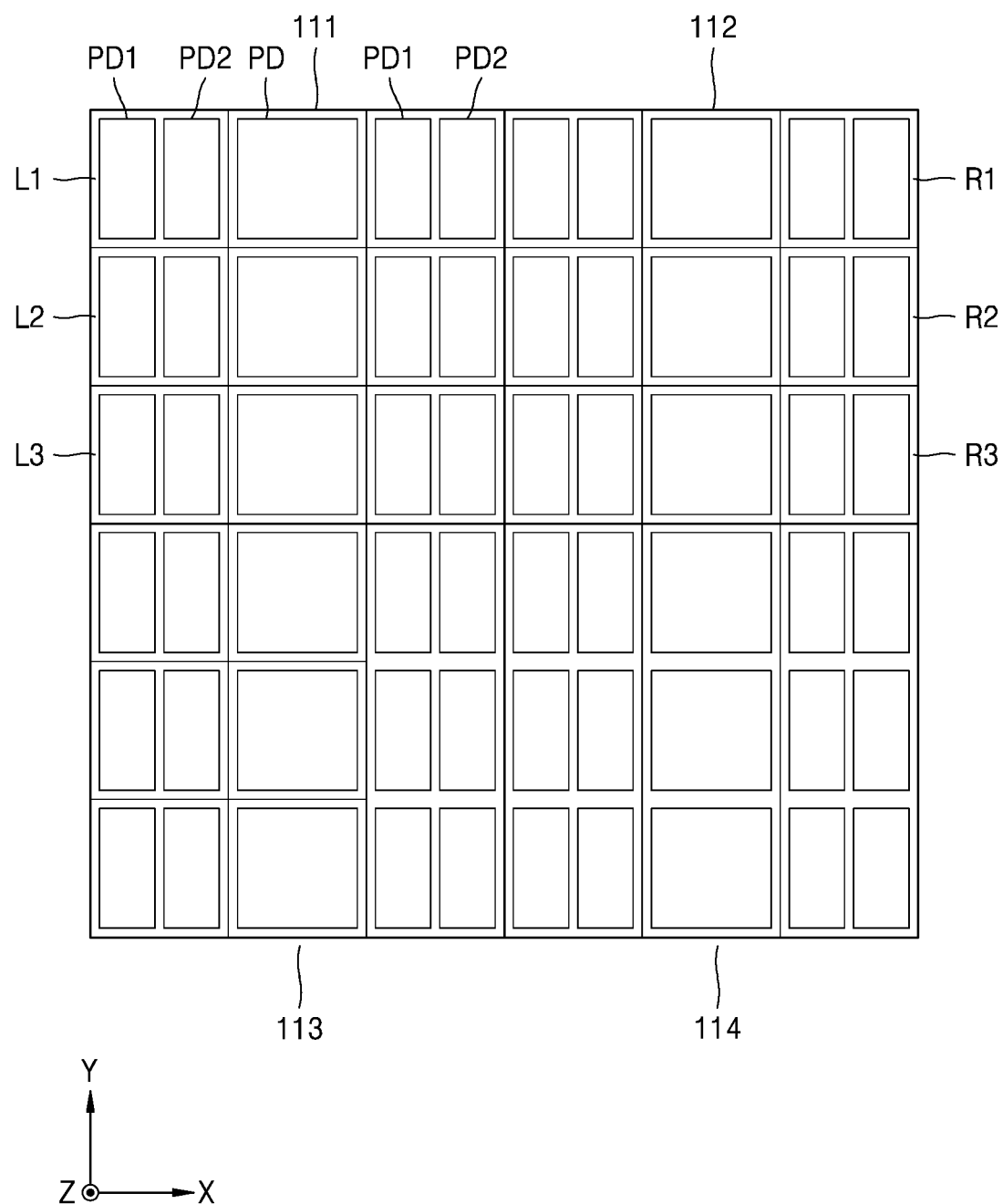
Figure 21:
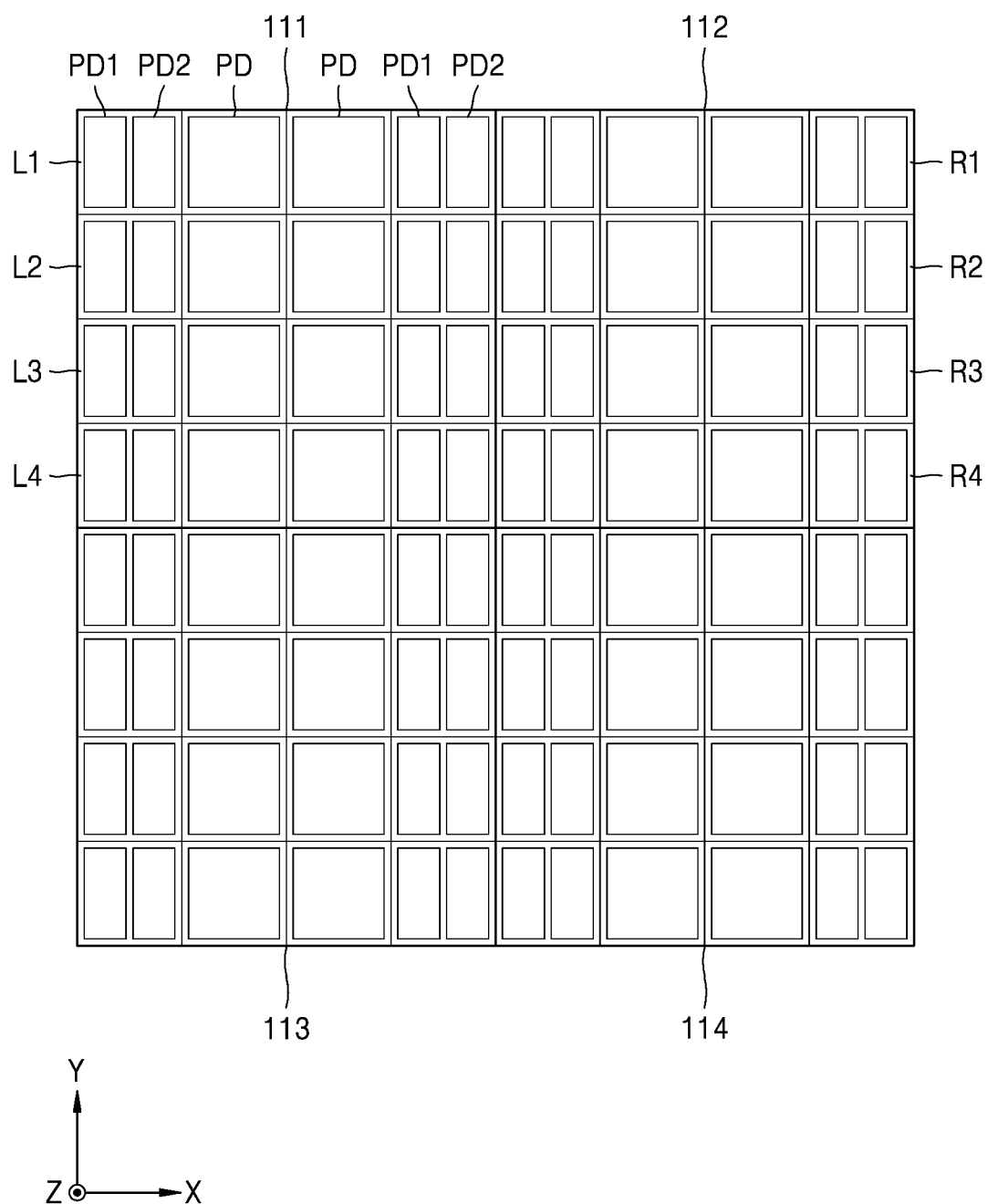

FIGS. 20 and 21 are plan views showing an exemplary structure of a pixel array of an image sensor according to another embodiments, for providing an auto-focusing signal in a phase-detection auto-focusing method. In the embodiments illustrated with reference to FIGS. 15 to 19, each of the pixels includes three or more photosensitive cells in the X direction or the Y direction, and thus, even when one photosensitive cell includes one photodiode, the auto-focusing signal having a sufficiently high contrast ratio may be obtained. However, in order to obtain higher contrast ratio, the photosensitive cells arranged at opposite edges may each have two photodiodes.

Referring to FIG. 20, one pixel may include 9 photosensitive cells in 3×3 array. Each of the plurality of photosensitive cells L1, L2, and L3 arranged at the left side and a plurality of photosensitive cells R1, R2, and R3 arranged at the right side of one pixel may include first and second photodiodes PD1 and PD2 arranged in the X direction. The photosensitive cells between the left photosensitive cells L1, L2, and L3 and the right photosensitive cells R1, R2, and R3 may each include only one photodiode PD. The image sensor may obtain the auto-focusing signal from a difference between the photosensitive signal output from the first photodiode PD1 that is at a left side in the left photosensitive cells L1, L2, and L3 and the photosensitive signal output from the second photodiode PD2 that is at a right side in the right photosensitive cells R1, R2, and R3. In this case, the region where the first photodiode PD1 is arranged in the left photosensitive cells L1, L2, and L3 becomes the left edge region, and the region where the second photodiode PD2 is arranged in the right photosensitive cells R1, R2, and R3 becomes the right edge region. The distance between the left edge region and the right edge region in the X direction, that is, a width of the intermediate region in the X direction, may be four times or more greater than a width of each of the left and right edge regions in the X direction.

Referring to FIG. 21, one pixel may include 16 photosensitive cells in 4×4 array. The embodiments shown in FIG. 21 may be the same as that of FIG. 20, except for the number of photosensitive cells. That is, the image sensor may obtain the auto-focusing signal from a difference between the photosensitive signal output from the first photodiode PD1 that is at a left side in the left photosensitive cells L1, L2, L3, and L4 and the photosensitive signal output from the second photodiode PD2 that is at a right side in the right photosensitive cells R1, R2, R3, and R4. In this case, the width of the intermediate region in the X direction may be six times or more greater than a width of each of the left and right edge regions in the X direction.

According to the image sensor 1000 including the pixel array 1100 described above, light loss due to a color filter, e.g., an organic color filter, rarely occurs, and thus, a sufficient amount of light may be provided to the pixels even when the pixels become smaller. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic apparatuses. The electronic apparatuses may include, for example, smart phones, mobile phones, cell phones, personal digital assistants (PDAs), laptop computers, personal computers (PCs), a variety of portable devices, electronic apparatuses, surveillance cameras, medical camera, automobiles, Internet of Things (IoT) devices, other mobile or non-mobile computing devices and are not limited thereto.

The electronic apparatuses may further include, in addition to the image sensor 1000, a processor for controlling the image sensor, for example, an application processor (AP), and may control a plurality of hardware or software elements and may perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor. In addition, the processor receives two photosensitive signals from opposite edges spaced apart from each other in each pixel of the image sensor, and generates the auto-focusing signal based on a difference between the two photosensitive signals.

Figure 22:
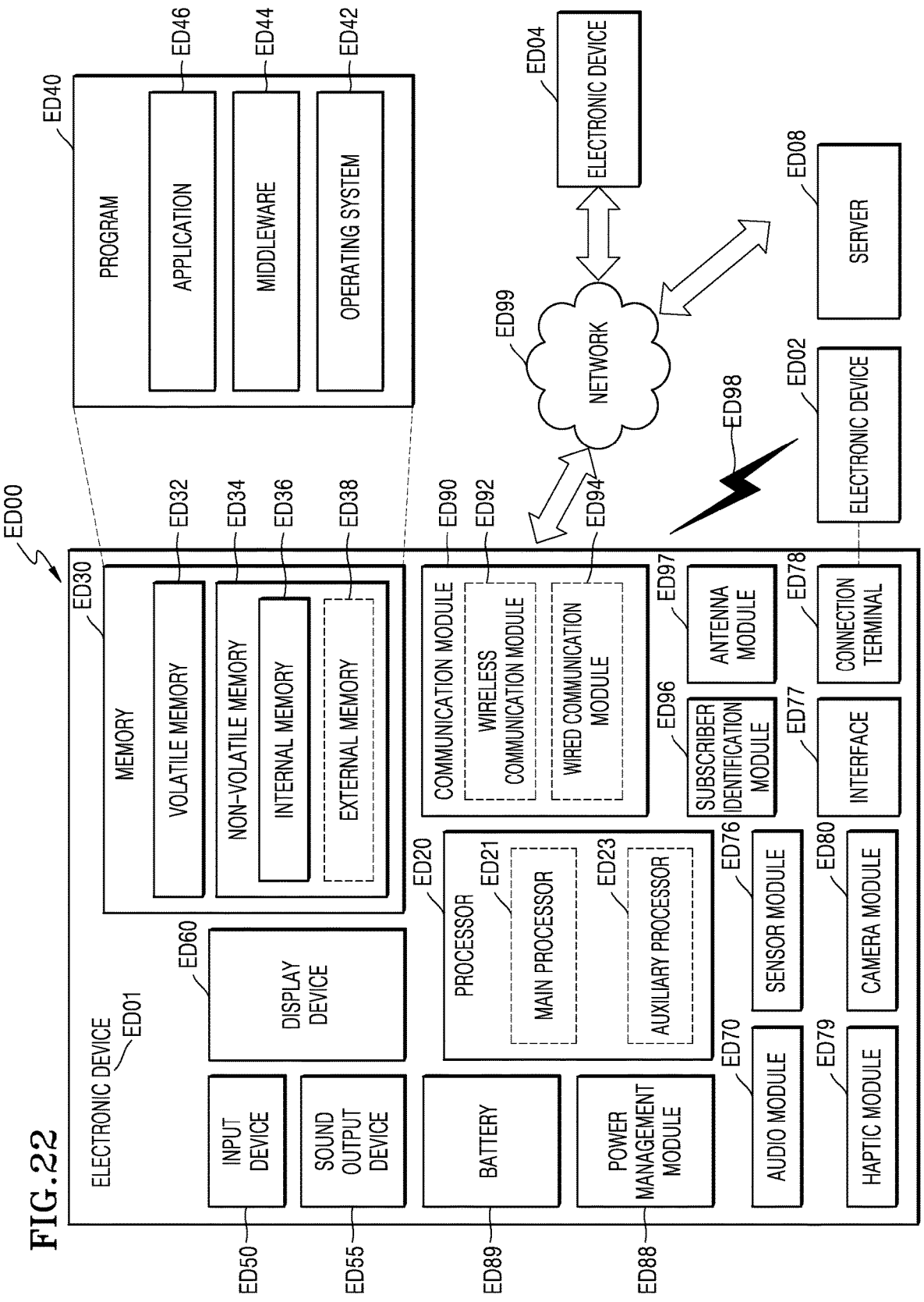
FIG. 22 is a block diagram of an electronic apparatus including an image sensor according to one or more embodiments.

FIG. 22 is a block diagram showing an example of an electronic apparatus ED01 including the image sensor 1000. Referring to FIG. 22, in a network environment ED00, the electronic apparatus ED01 may communicate with another electronic apparatus ED02 via a first network ED98 (short-range wireless communication network, etc.), or may communicate with another electronic apparatus ED04 and/or a server ED08 via a second network ED99 (long-range wireless communication network, etc.) The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60, etc.) of the elements may be omitted or another element may be added. Some of the elements may be configured as one integrated circuit. For example, the sensor module ED76 (a fingerprint sensor, an iris sensor, an illuminance sensor, etc.) may be embedded and implemented in the display device ED60 (display, etc.)

The processor ED20 may control one or more elements (hardware, software elements, etc.) of the electronic apparatus ED01 connected to the processor ED20 by executing software (program ED40, etc.), and may perform various data processes or operations. As a part of the data processing or operations, the processor ED20 may load a command and/or data received from another element (sensor module ED76, communication module ED90, etc.) to a volatile memory ED32, may process the command and/or data stored in the volatile memory ED32, and may store result data in a non-volatile memory ED34. The processor ED20 may include a main processor ED21 (central processing unit, application processor, etc.) and an auxiliary processor ED23 (graphic processing unit, image signal processor, sensor hub processor, communication processor, etc.) that may be operated independently from or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, etc.) of the elements in the electronic apparatus ED01. The auxiliary processor ED23 (image signal processor, communication processor, etc.) may be implemented as a part of another element (camera module ED80, communication module ED90, etc.) that is functionally related thereto.

The memory ED30 may store various data required by the elements (processor ED20, sensor module ED76, etc.) of the electronic apparatus ED01. The data may include, for example, input data and/or output data about software (program ED40, etc.) and commands related thereto. The memory ED30 may include the volatile memory ED32 and/or the non-volatile memory ED34. The non-volatile memory ED34 may include an internal memory ED36 fixedly installed in the electronic apparatus ED01, and an external memory ED38 that is detachable.

The program ED40 may be stored as software in the memory ED30, and may include an operation system ED42, middle ware ED44, and/or an application ED46.

The input device ED50 may receive commands and/or data to be used in the elements (processor ED20, etc.) of the electronic apparatus ED01, from outside (user, etc.) of the electronic apparatus ED01. The input device ED50 may include a microphone, a mouse, a keyboard, and/or a digital pen (stylus pen).

The sound output device ED55 may output a sound signal to outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent device.

The display device ED60 may provide visual information to outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor, etc.) that is set to measure a strength of a force generated by the touch.

The audio module ED70 may convert sound into an electrical signal or vice versa. The audio module ED 70 may acquire sound through the input device ED50, or may output sound via the sound output device ED55 and/or a speaker and/or a headphone of another electronic apparatus (electronic apparatus ED02, etc.) connected directly or wirelessly to the electronic apparatus ED01.

The sensor module ED76 may sense an operating state (power, temperature, etc.) of the electronic apparatus ED01, or an outer environmental state (user state, etc.), and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02, etc.) The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02, etc.). The connection terminal ED78 may include an HDMI connector, a USB connector, an SD card connector, and/or an audio connector (headphone connector, etc.).

The haptic module ED79 may convert the electrical signal into a mechanical stimulation (vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support establishment of a direct (wired) communication channel and/or a wireless communication channel between the electronic apparatus ED01 and another electronic apparatus (electronic apparatus ED02, electronic apparatus ED04, server ED08, etc.), and execution of communication through the established communication channel. The communication module ED90 may be operated independently from the processor ED20 (application processor, etc.), and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, etc.). From among the communication modules, a corresponding communication module may communicate with another electronic apparatus via a first network ED09 (short-range communication network such as Bluetooth, WiFi direct, or infrared data association (IrDA)) or a second network ED99 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI), etc.) stored in the subscriber identification module ED96.

The antenna module ED97 may transmit or receive the signal and/or power to/from outside (another electronic apparatus, etc.). An antenna may include a radiator formed as a conductive pattern formed on a substrate (PCB, etc.). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC, etc.) other than the antenna may be included as a part of the antenna module ED97.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus ED01 and the external electronic apparatus ED04 via the server ED08 connected to the second network ED99. Other electronic apparatuses ED02 and ED04 may be the devices that are the same as or different kinds from the electronic apparatus ED01. All or some of the operations executed in the electronic apparatus Ed01 may be executed in one or more devices among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transfer a result of the execution to the electronic apparatus ED01. To do this, for example, a cloud computing, a distributed computing, or a client-server computing technique may be used.

Figure 23:
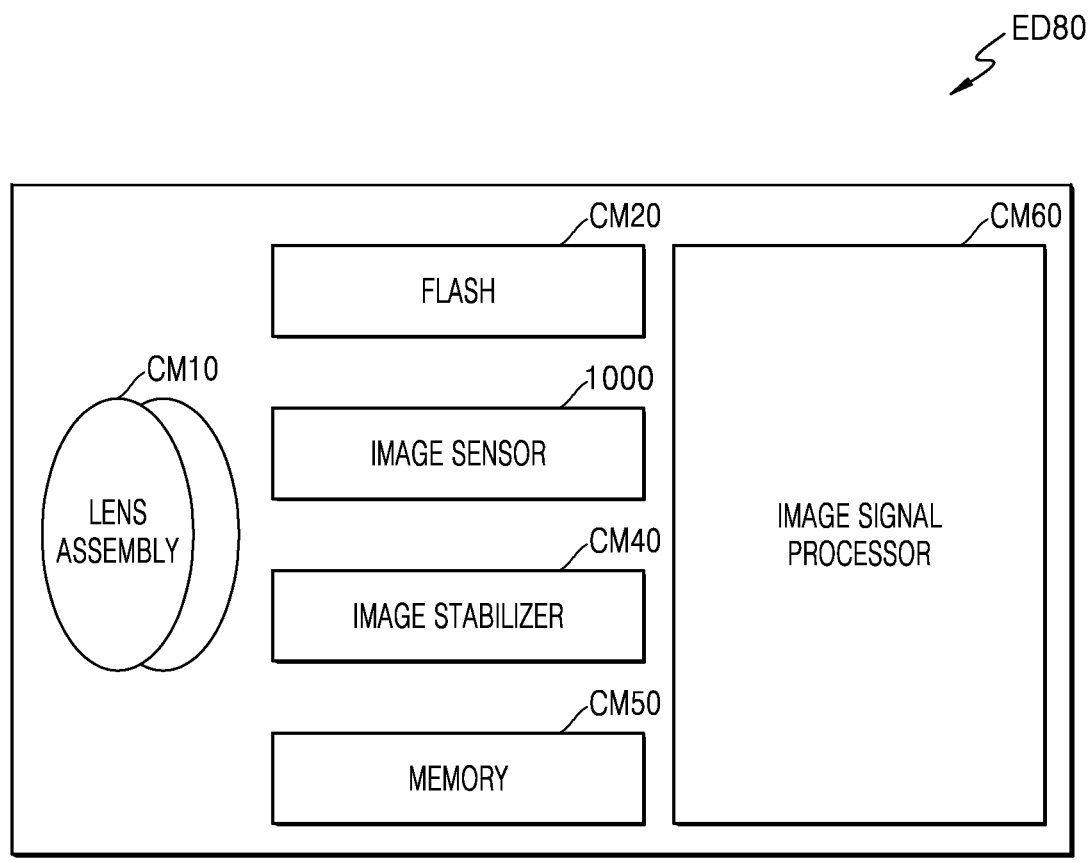
FIG. 23 is a block diagram of a camera module in FIG. 22.

FIG. 23 is a block diagram showing the camera module ED80 of FIG. 22. Referring to FIG. 23, the camera module ED80 may include a lens assembly CM10, a flash CM20, an image sensor 1000 (the image sensor 1000 of FIG. 1), an image stabilizer CM40, a memory CM50 (buffer memory, etc.), and/or an image signal processor CM60. The lens assembly CM10 may collect light emitted from an object, that is, an object to be captured. The camera module ED80 may include a plurality of lens assemblies CM10, and in this case, the camera module ED80 may include a dual camera module, a 360-degree camera, or a spherical camera. Some of the plurality of lens assemblies CM10 may have the same lens properties (viewing angle, focal distance, auto-focus, F number, optical zoom, etc.) or different lens properties. The lens assembly CM10 may include a wide-angle lens or a telephoto lens.

The flash CM20 may emit light that is used to strengthen the light emitted or reflected from the object. The flash CM20 may include one or more light-emitting diodes (red-green-blue (RGB) LED, white LED, infrared LED, ultraviolet LED, etc.), and/or a Xenon lamp. The image sensor 1000 may be the image sensor described above with reference to FIG. 1, and converts the light emitted or reflected from the object and transferred through the lens assembly CM10 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge coupled device (CCD) sensor and/or a complementary metal oxide semiconductor (CMOS) sensor.

The image stabilizer CM40, in response to a motion of the camera module ED80 or the electronic apparatus ED01 including the camera module ED80, moves one or more lenses included in the lens assembly CM10 or the image sensor 1000 in a certain direction or controls the operating characteristics of the image sensor 1000 (adjusting of a read-out timing, etc.) in order to compensate for a negative influence of the motion. The image stabilizer CM40 may sense the movement of the camera module ED80 or the electronic apparatus ED01 by using a gyro sensor (not shown) or an acceleration sensor (not shown) arranged in or out of the camera module ED80. The image stabilizer CM40 may be implemented as an optical type.

The memory CM50 may store some or entire data of the image obtained through the image sensor 1000 for next image processing operation. For example, when a plurality of images are obtained at a high speed, obtained original data (Bayer-patterned data, high resolution data, etc.) is stored in the memory CM50, and a low resolution image is only displayed. Then, original data of a selected image (user selection, etc.) may be transferred to the image signal processor CM60. The memory CM50 may be integrated with the memory ED30 of the electronic apparatus ED01, or may include an additional memory that is operated independently.

The image signal processor CM60 may perform image treatment on the image obtained through the image sensor 1000 or the image data stored in the memory CM50. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor CM60 may perform controlling (exposure time control, read-out timing control, etc.) of the elements (image sensor 1000, etc.) included in the camera module ED80. The image processed by the image signal processor CM60 may be stored again in the memory CM50 for additional process, or may be provided to an external element of the camera module ED80 (e.g., the memory ED30, the display device ED60, the electronic apparatus ED02, the electronic apparatus ED04, the server ED08, etc.). The image signal processor CM60 may be integrated with the processor ED20, or may be configured as an additional processor that is independently operated from the processor ED20. When the image signal processor CM60 is configured as an additional processor separately from the processor ED20, the image processed by the image signal processor CM60 undergoes through an additional image treatment by the processor ED20 and then may be displayed on the display device ED60.

Also, the image signal processor CM60 may receive two photosensitive signals independently from the opposite edges spaced apart from each other in each pixel of the image sensor 1000, and may generate an auto-focusing signal from a difference between the two photosensitive signals. The image signal processor CM60 may control the lens assembly CM10 so that the focus of the lens assembly CM10 may be accurately formed on the surface of the image sensor 1000 based on the auto-focusing signal.

The electronic apparatus ED01 may include a plurality of camera modules ED80 having different properties or functions. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

Figure 24:
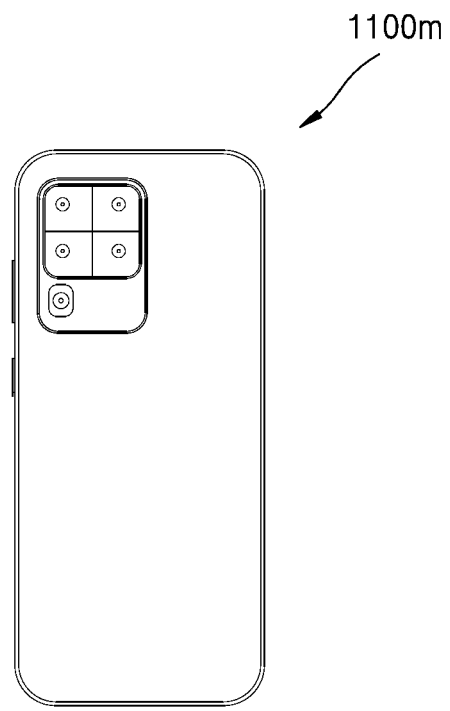
FIGS. 24 to 33 are diagrams showing various examples of an electronic apparatus to which an image sensor according to one or more embodiments is applied.
Figure 25:
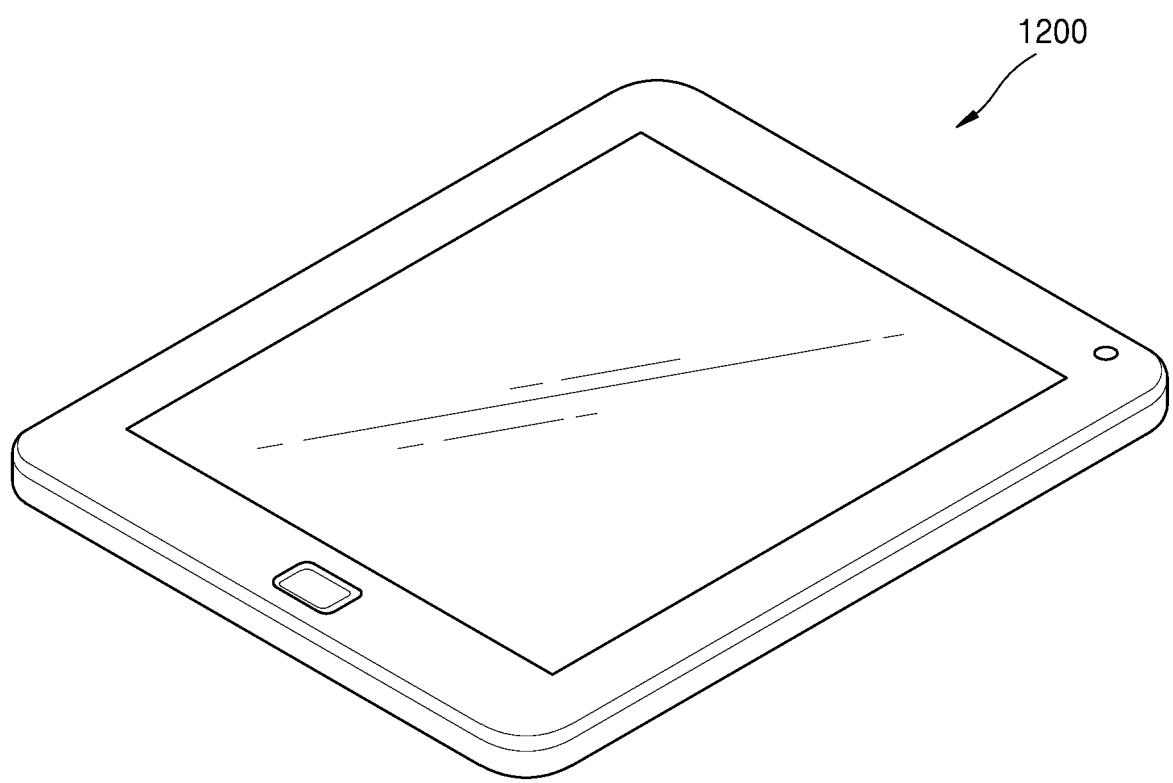
Figure 26:
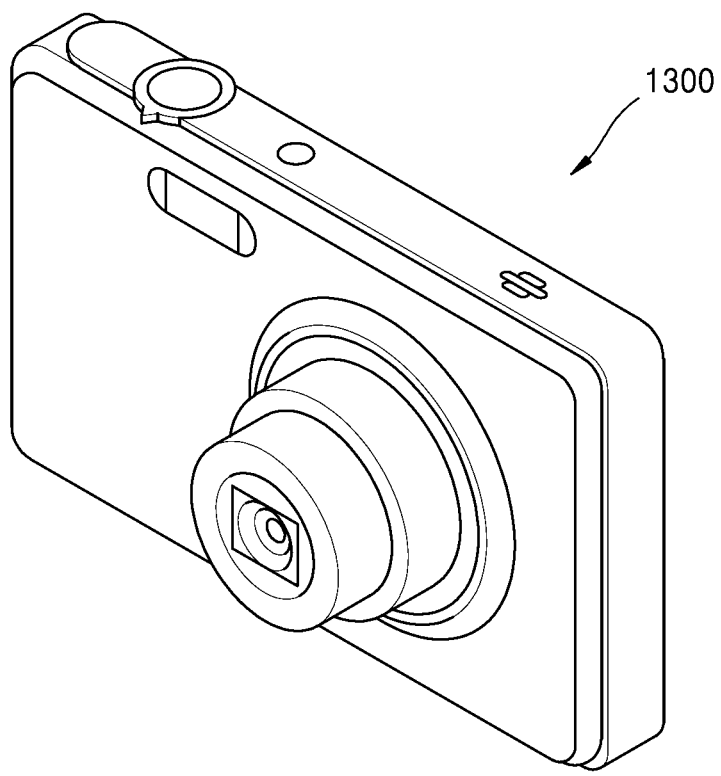
Figure 27:
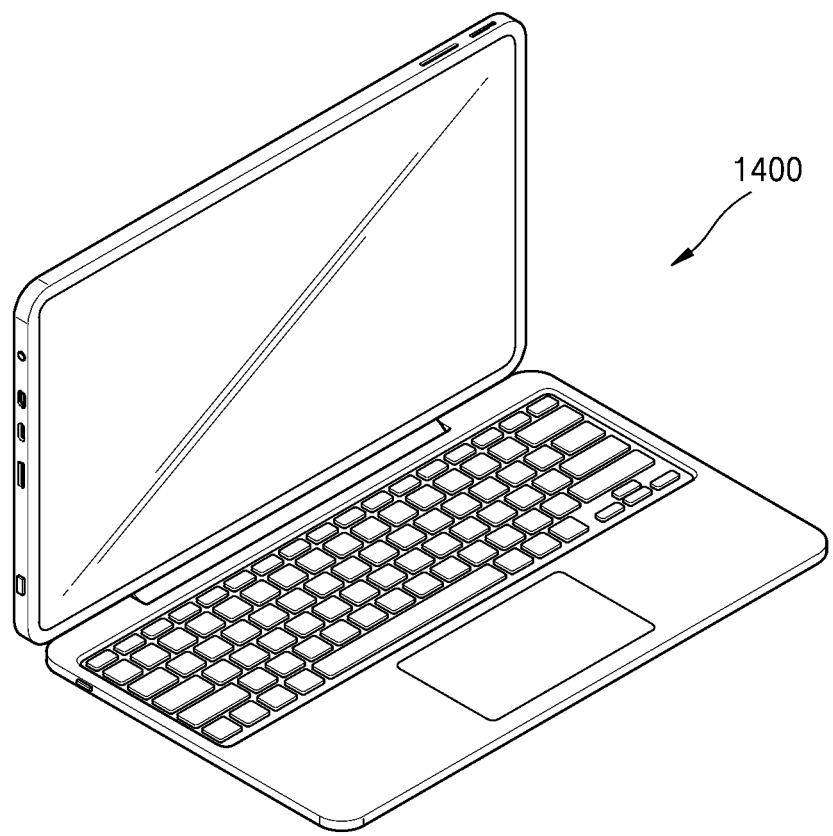
Figure 28:
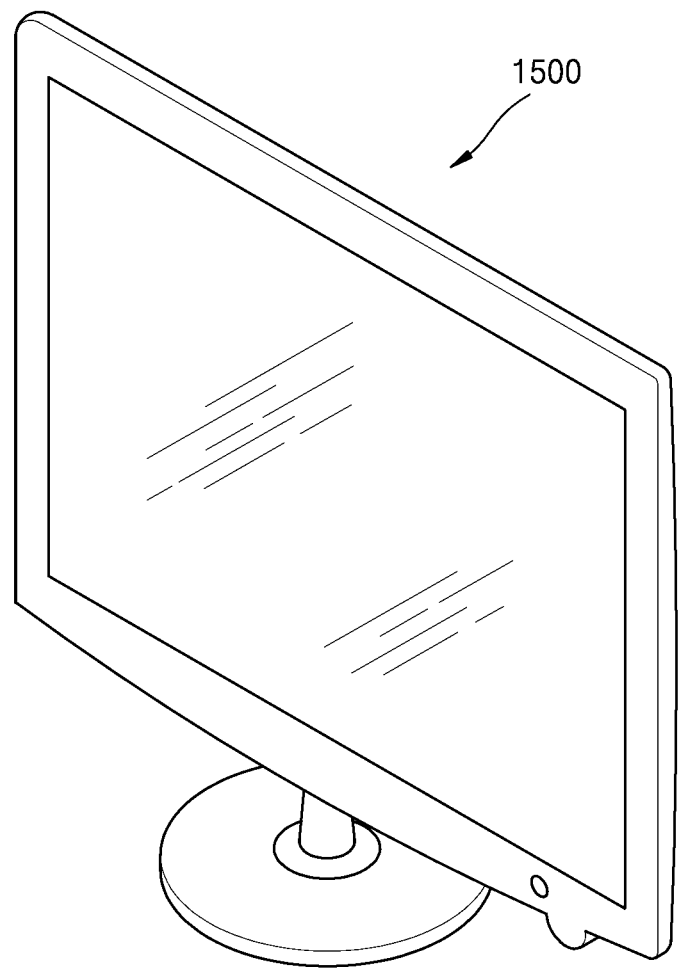

The image sensor 1000 according to the embodiments may be applied to a mobile phone or a smartphone 1100m shown in FIG. 24, a tablet or a smart tablet 1200 shown in FIG. 25, a digital camera or a camcorder 1300 shown in FIG. 26, a laptop computer 1400 shown in FIG. 27, or a television or a smart television 1500 shown in FIG. 28. For example, the smartphone 1100m or the smart tablet 1200 may include a plurality of high-resolution cameras each including a high-resolution image sensor. Depth information of objects in an image may be extracted, out focusing of the image may be adjusted, or objects in the image may be automatically identified by using the high-resolution cameras.

Figure 29:
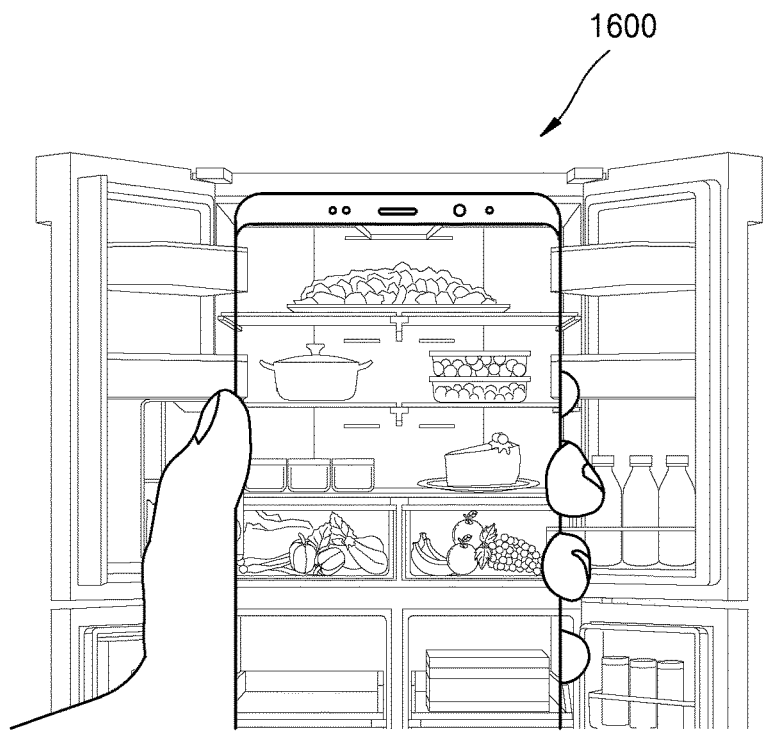
Figure 30:
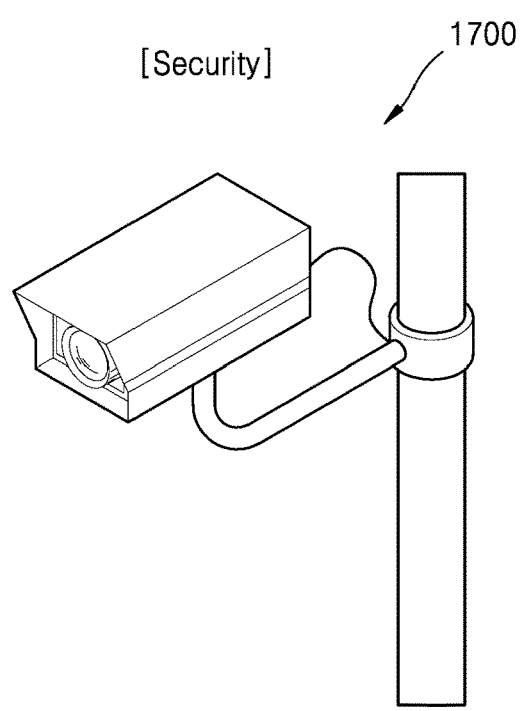
Figure 31:
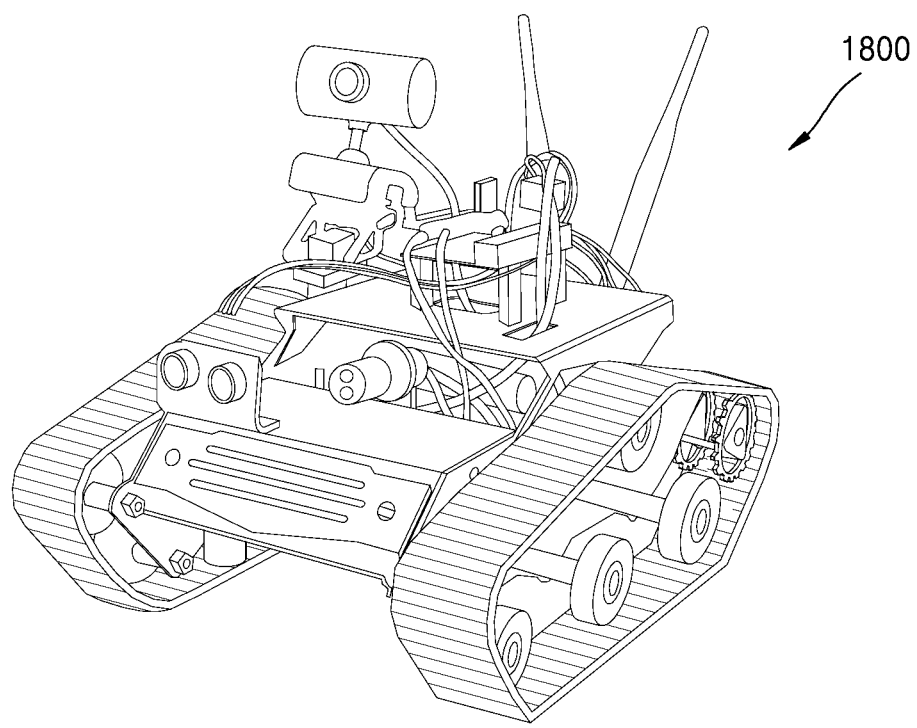
Figure 32:
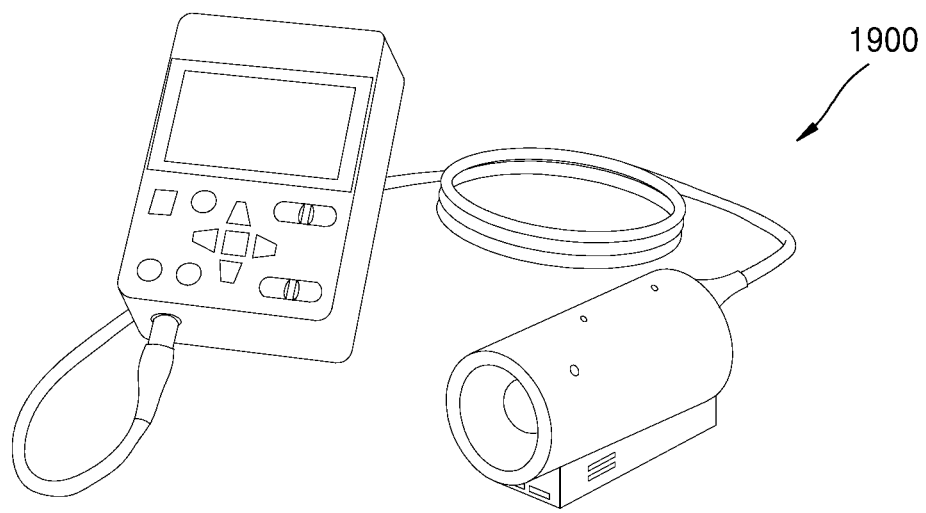

Also, the image sensor 1000 may be applied to a smart refrigerator 1600 shown in FIG. 29, a surveillance camera 1700 shown in FIG. 30, a robot 1800 shown in FIG. 31, a medical camera 1900 shown in FIG. 32, etc. For example, the smart refrigerator 1600 may automatically recognize food in the refrigerator by using the image sensor, and may notify the user of an existence of a certain kind of food, kinds of food put into or taken out, etc. through a smartphone. Also, the surveillance camera 1700 may provide an ultra-high-resolution image and may allow the user to recognize an object or a person in the image even in dark environment by using high sensitivity. The robot 1900 may be input to a disaster or industrial site that a person may not directly access, to provide the user with high-resolution images. The medical camera 1900 may provide high-resolution images for diagnosis or surgery, and may dynamically adjust a field of view.

Figure 33:
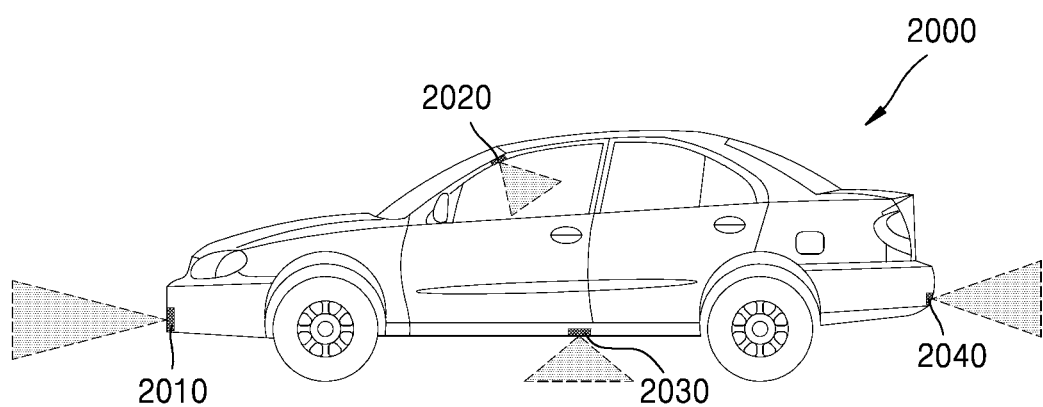

Also, the image sensor 1000 may be applied to a vehicle 2000 as shown in FIG. 33. The vehicle 2000 may include a plurality of vehicle cameras 2010, 2020, 2030, and 2040 at various locations. Each of the vehicle cameras 2010, 2020, 2030, and 2040 may include the image sensor according to the one or more embodiments. The vehicle 2000 may provide a driver with various information about the interior of the vehicle 2000 or the periphery of the vehicle 2000 by using the plurality of vehicle cameras 2010, 2020, 2030, and 2040, and may provide the driver with the information necessary for the autonomous travel by automatically recognizing an object or a person in the image.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An image sensor comprising:
   a sensor substrate including a plurality of first pixels configured to sense light of a first wavelength and a plurality of second pixels configured to sense light of a second wavelength that is different from the first wavelength; and
   a color separating lens array configured to condense the light of the first wavelength onto the plurality of first pixels and condense the light of the second wavelength onto the plurality of second pixels,
   wherein each of the first pixels includes a plurality of photosensitive cells that are two-dimensionally arranged in a first direction and a second direction perpendicular to the first direction, the plurality of photosensitive cells being configured to independently sense incident light, and
   from among the plurality of first pixels, a first pixel of a first group includes a first edge region and a second edge region that are arranged at opposite edges of the first pixel in the first direction, the first pixel of the first group being configured to output a first photosensitive signal and a second photosensitive signal with respect to the incident light on the first edge region and the second edge region.

2. The image sensor of claim 1, wherein a distance between the first edge region and the second edge region in the first direction is equal to or greater than a width of the first edge region in the first direction.

3. The image sensor of claim 2, wherein the first pixel of the first group is further configured to output a third photosensitive signal with respect to light incident on a region between the first edge region and the second edge region.

4. The image sensor of claim 2, wherein the first pixel of the first group is further configured to not output a photosensitive signal with respect to light incident on a region between the first edge region and the second edge region.

5. The image sensor of claim 1, wherein the plurality of photosensitive cells in the first pixel of the first group include a first photosensitive cell and a second photosensitive cell that are arranged in the first direction.

6. The image sensor of claim 5, wherein
   each of the first photosensitive cell and the second photosensitive cell includes a first photodiode and a second photodiode that are arranged in the first direction,
   the first photodiode of the first photosensitive cell is arranged in the first edge region and the second photodiode of the second photosensitive cell is arranged in the second edge region, and
   the first pixel of the first group is configured to output the first photosensitive signal from the first photodiode of the first photosensitive cell and the second photosensitive signal from the second photodiode of the second photosensitive cell.

7. The image sensor of claim 5, wherein
   each of the first photosensitive cell and the second photosensitive cell includes one photodiode, and
   the first pixel of the first group includes a mask pattern configured to block a first remaining region in the photodiode of the first photosensitive cell, the first remaining region being different from the first edge region in a light-receiving surface of the photodiode of the first photosensitive cell, and configured to block a second remaining region in the photodiode of the second photosensitive cell, the second remaining region being different from the second edge region in a light-receiving surface of the photodiode of the second photosensitive cell.

8. The image sensor of claim 1, wherein the plurality of photosensitive cells in the first pixel of the first group include a first photosensitive cell, a second photosensitive cell, and a third photosensitive cell that are sequentially arranged in the first direction.

9. The image sensor of claim 8, wherein
   each of the first photosensitive cell, the second photosensitive cell and the third photosensitive cell include one photodiode,
   the first photosensitive cell is arranged in the first edge region and the third photosensitive cell is arranged in the second edge region, and
   the first pixel of the first group is configured to output the first photosensitive signal from the first photosensitive cell and the second photosensitive signal from the third photosensitive cell.

10. The image sensor of claim 8, wherein
    each of the first photosensitive cell and third photosensitive cell includes a first photodiode and a second photodiode that are arranged in the first direction,
    the first photodiode of the first photosensitive cell is arranged in the first edge region and the second photodiode of the third photosensitive cell is arranged in the second edge region, and the first pixel of the first group is configured to output the first photosensitive signal from the first photodiode of the first photosensitive cell and the second photosensitive signal from the second photodiode of the third photosensitive cell.

11. The image sensor of claim 1, wherein the plurality of photosensitive cells in the first pixel of the first group include a first photosensitive cell, a second photosensitive cell, a third photosensitive cell, and a fourth photosensitive cell that are sequentially arranged in the first direction.

12. The image sensor of claim 11, wherein
each of the first photosensitive cell, the second photosensitive cell, the third photosensitive cell and fourth photosensitive cell include one photodiode,
the first photosensitive cell is arranged in the first edge region and the fourth photosensitive cell is arranged in the second edge region, and
the first pixel of the first group is configured to output the first photosensitive signal from the first photosensitive cell and the second photosensitive signal from the fourth photosensitive cell.

13. The image sensor of claim 11, wherein
each of the first photosensitive cell, the second photosensitive cell, the third photosensitive cell and fourth photosensitive cell includes a first photodiode and a second photodiode that are arranged in the first direction,
the first photodiode of the first photosensitive cell is arranged in the first edge region and the second photodiode of the fourth photosensitive cell is arranged in the second edge region, and
the first pixel of the first group is configured to output the first photosensitive signal from the first photodiode of the first photosensitive cell and the second photosensitive signal from the second photodiode of the fourth photosensitive cell.

14. The image sensor of claim 1, wherein, from among the plurality of first pixels, a first pixel of a second group includes a third edge region and a fourth edge region that are arranged at opposite edges of the first pixel of the second group in the second direction and is configured to output a third photosensitive signal with respect to light incident on the third edge region and a fourth photosensitive signal with respect to light incident on the fourth edge region.

15. The image sensor of claim 14, wherein
the plurality of photosensitive cells in the first pixel of the second group include a first photosensitive cell, a second photosensitive cell, and a third photosensitive cell that are sequentially arranged in the second direction,
each of the first photosensitive cell, the second photosensitive cell and the third photosensitive cell includes one photodiode,
the first photosensitive cell is arranged in the third edge region and the third photosensitive cell is arranged in the fourth edge region, and
the first pixel of the second group is configured to output the third photosensitive signal from the first photosensitive cell and the fourth photosensitive signal from the third photosensitive cell.

16. The image sensor of claim 14, wherein, from among the plurality of first pixels, a first pixel of a third group includes a first apex region and a second apex region at opposite sides in a diagonal direction, the first pixel of the third group being configured to output a fifth photosensitive signal with respect to light incident on the first apex region and sixth photosensitive signal with respect to light incident on the second apex region.

17. The image sensor of claim 16, wherein
the plurality of photosensitive cells in the first pixel of the third group include a first photosensitive cell at a first apex of the first pixel, a second photosensitive cell adjacent to the first photosensitive cell in the first direction, a third photosensitive cell adjacent to the first photosensitive cell in the second direction, a fourth photosensitive cell arranged at a second apex of the first pixel, a fifth photosensitive cell adjacent to the fourth photosensitive cell in the first direction, and a sixth photosensitive cell adjacent to the fourth photosensitive cell in the second direction,
each of the first photosensitive cell, the second photosensitive cell, the third, photosensitive cell, the fourth photosensitive cell, the fifth photosensitive cell and the sixth photosensitive cell include one photodiode,
the first photosensitive cell, the second photosensitive cell, and the third photosensitive cell are arranged in the first apex region and the fourth photosensitive cell, the fifth photosensitive cell, and the sixth photosensitive cell are arranged in the second apex region, and
the first pixel of the third group is configured to output the fifth photosensitive signal from the first photosensitive cell, the second photosensitive cell, the third, photosensitive cell and the sixth photosensitive signal from the fourth photosensitive cell, the fifth photosensitive cell, and the sixth photosensitive cell.

18. The image sensor of claim 16, wherein, in an entire area of the image sensor, the first pixel of the first group is arranged in a first region in the first direction, the first pixel of the second group is arranged in a second region in the second direction, and the first pixel of the third group is arranged in a third region in the diagonal direction.

19. The image sensor of claim 1, wherein a distance between the sensor substrate and the color separating lens array is about 30% to about 70% of a focal distance of the color separating lens array with respect to the light of the first wavelength.

20. The image sensor of claim 1, further comprising a spacer layer arranged between the sensor substrate and the color separating lens array to form a distance between the sensor substrate and the color separating lens array.

21. The image sensor of claim 1, wherein
the color separating lens array includes a first wavelength light condensing region configured to condense the light of the first wavelength onto the first pixels and a second wavelength light condensing region configured to condense the light of the second wavelength onto the second pixels, and
an area of the first wavelength light condensing region is greater than an area of the first pixel among the plurality of first pixels and an area of the second wavelength light condensing region is greater than an area of a second pixel among the plurality of second pixels, and
the first wavelength light condensing region partially overlaps the second wavelength light condensing region.

22. The image sensor of claim 1, wherein the color separating lens array includes:
a first pixel region arranged at a position corresponding to each of the first pixels; and
a second pixel region arranged at a position corresponding to each of the second pixels, wherein a difference between phases of the light of the first wavelength that has passed through a center of the first pixel region and the light of the first wavelength that has passed through the second pixel region is about 0.9π to about 1.1π.

23. An electronic apparatus comprising:
an image sensor configured to convert an optical image into an electrical signal;
a processor configured to control operations of the image sensor and to store and output a signal generated by the image sensor; and
a lens assembly for providing light from an object to the image sensor,
wherein the image sensor comprises:
  a sensor substrate including a plurality of first pixels configured to sense light of a first wavelength and a plurality of second pixels configured to sense light of a second wavelength that is different from the first wavelength; and
  a color separating lens array configured to condense the light of the first wavelength onto the plurality of first pixels and condense the light of the second wavelength onto the plurality of second pixels,
wherein each of the first pixels includes a plurality of photosensitive cells that are two-dimensionally arranged in a first direction and a second direction perpendicular to the first direction, the plurality of photosensitive cells being configured to independently sense incident light, and
from among the plurality of first pixels, a first pixel of a first group includes a first edge region and a second edge region that are arranged at opposite edges of the first pixel in the first direction, the first pixel of the first group being configured to output a first photosensitive signal and a second photosensitive signal with respect to the incident light on the first edge region and the second edge region, and
the processor is further configured to generate an auto-focusing signal based on a difference between the first and second photosensitive signals.

* * * * *